US012148817B2

(12) United States Patent
Kubouchi

(10) Patent No.: US 12,148,817 B2
(45) Date of Patent: Nov. 19, 2024

(54) SEMICONDUCTOR DEVICE AND MANUFACTURING METHOD

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/395,662

(22) Filed: Dec. 25, 2023

(65) Prior Publication Data

US 2024/0128359 A1 Apr. 18, 2024

Related U.S. Application Data

(60) Division of application No. 16/940,408, filed on Jul. 28, 2020, now Pat. No. 11,901,443, which is a (Continued)

(30) Foreign Application Priority Data

Aug. 14, 2018 (JP) ................................ 2018-152785
Dec. 18, 2018 (JP) ................................ 2018-235993

(51) Int. Cl.
*H01L 29/739* (2006.01)
*H01L 21/22* (2006.01)
(Continued)

(52) U.S. Cl.
CPC ........ *H01L 29/7395* (2013.01); *H01L 21/221* (2013.01); *H01L 29/1095* (2013.01); *H01L 29/4236* (2013.01); *H01L 29/66348* (2013.01)

(58) Field of Classification Search
CPC ............. H01L 29/1095; H01L 29/4236; H01L 29/66348; H01L 29/7395; H01L 21/221
(Continued)

(56) References Cited

U.S. PATENT DOCUMENTS 9,460,927 B2 * 10/2016 Lu .................... H01L 21/26513
10,056,450 B2 8/2018 Kouno
(Continued)

FOREIGN PATENT DOCUMENTS

CN 102468167 A 5/2012
CN 105830217 A 8/2016
(Continued)

OTHER PUBLICATIONS

International Search Report and (ISA/237) Written Opinion of the International Search Authority for International Patent Application No. PCT/JP2019/026974, mailed by the Japan Patent Office on Oct. 8, 2019.

(Continued)

*Primary Examiner* — Monica D Harrison

(57) ABSTRACT

A method of manufacturing a semiconductor device comprising a transistor section and a diode section each having a drift region of a first conductivity-type inside a semiconductor substrate, and a base region of a second conductivity-type above the drift region. A particle beam is irradiated from an upper surface of the semiconductor substrate forming a lifetime control region including lifetime killers below the base region from at least a part of the transistor section to the diode section. A threshold value adjusting section is formed for adjusting a threshold value of the transistor section, including a thickened portion Wgi of a gate insulating film in a gate trench section adjacent to the base
(Continued)

region, the thickened portion having a dielectric constant less than or equal to 0.9 times a remaining portion of the gate insulating film in the gate trench section.

3 Claims, 49 Drawing Sheets

Related U.S. Application Data continuation of application No. PCT/JP2019/026974, filed on Jul. 8, 2019.

(51) Int. Cl.
*H01L 29/10* (2006.01)
*H01L 29/423* (2006.01)
*H01L 29/66* (2006.01)

(58) Field of Classification Search
USPC .......................................................... 257/140
See application file for complete search history.

(56) References Cited

U.S. PATENT DOCUMENTS

| | | | |
|---|---|---|---|
| 10,553,436 | B2 | 2/2020 | Kodama |
| 2008/0001158 | A1 | 1/2008 | Das |
| 2012/0043582 | A1 | 2/2012 | Koyama |
| 2016/0329323 | A1 | 11/2016 | Iwasaki |
| 2016/0351665 | A1 | 12/2016 | Sugimoto |
| 2018/0012762 | A1 | 1/2018 | Mukai |
| 2018/0108737 | A1 | 4/2018 | Naito |
| 2018/0151557 | A1 | 5/2018 | Tanabe |
| 2018/0350962 | A1 | 12/2018 | Naito |
| 2019/0096989 | A1 | 3/2019 | Yoshida |

FOREIGN PATENT DOCUMENTS

| | | | |
|---|---|---|---|
| CN | 107958906 | A | 4/2018 |
| JP | 2011238872 | A | 11/2011 |
| JP | 2012043891 | A | 3/2012 |
| JP | 2015185742 | A | 10/2015 |
| JP | 2016225343 | A | 12/2016 |
| JP | 2017041601 | A | 2/2017 |
| JP | 2017079292 | A | 4/2017 |
| JP | 2018157017 | A | 10/2018 |
| WO | 2015093086 | A1 | 6/2015 |
| WO | 2017047285 | A1 | 3/2017 |
| WO | 2018030444 | A1 | 2/2018 |
| WO | 2018110703 | A1 | 6/2018 |

OTHER PUBLICATIONS

Office Action issued for counterpart Chinese Application 201980010232.6, issued by The State Intellectual Property Office of People's Republic of China on Jan. 5, 2023.
Those references were submitted as IDS or found by the examiner over the earlier U.S. Appl. No. 16/940,408, filed Jul. 28, 2020.

* cited by examiner b−b'

100

SEMICONDUCTOR DEVICE AND MANUFACTURING METHOD

CROSS-REFERENCE TO RELATED APPLICATIONS

This application is a divisional application of U.S. patent application Ser. No. 16/940,408, filed on Jul. 28, 2020, which is a continuation of International Patent Application No. PCT/JP2019/026974, filed on Jul. 8, 2019, which claims priority to Japanese Patent Application No 2018-152785, filed in JP on Aug. 14, 2018 and Japanese Patent Application No 2018-235993 filed in JP on Dec. 18, 2018, the entirety of the contents of each of which are hereby incorporated herein by reference.

BACKGROUND

1. Technical Field

The present invention relates to a semiconductor device and a manufacturing method.

2. Related Art

In the related art, known is a semiconductor device such as an insulated gate bipolar transistor (IGBT). (for example, refer to Patent Documents 1 and 2).

Patent Document 1: Japanese Patent Application Publication No. 2017-41601

Patent Document 2: Japanese Patent Application Publication No. 2015-185742

TECHNICAL PROBLEM

In the semiconductor device, it is preferable to suppress a difference in threshold value due to positions of transistor cells.

GENERAL DISCLOSURE

A first aspect of the present invention provides a semiconductor device. The semiconductor device includes a semiconductor substrate having a transistor section and a diode section. Both the transistor section and the diode section each have a drift region of a first conductivity-type provided inside the semiconductor substrate, and a base region of a second conductivity-type provided above the drift region inside the semiconductor substrate. Inside the semiconductor substrate, a lifetime control region including lifetime killers is provided below the base region from at least a part of the transistor section to the diode section. In the transistor section, a threshold value adjusting section for adjusting a threshold value of the transistor section is provided overlapping the lifetime control region as seen from an upper surface of the semiconductor substrate.

In the transistor section, the base region has a first region that overlaps the lifetime control region and a second region that does not overlap the lifetime control region, as seen from the upper surface of the semiconductor substrate. The first region may include the threshold value adjusting section. A doping concentration in the threshold value adjusting section may be higher than a doping concentration in the second region.

In the diode section, the base region has a third region that overlaps the lifetime control region, as seen from the upper surface of the semiconductor substrate. A doping concentration in the third region may be lower than the doping concentration in the threshold value adjusting section.

The doping concentration in the third region may be equal to the doping concentration in the second region.

The transistor section may further have a gate trench section and a dummy trench section that penetrate the base region from the upper surface of the semiconductor substrate to the drift region. The first region may be provided being sandwiched between the gate trench section and the dummy trench section. The threshold value adjusting section is provided in contact with the gate trench section.

The transistor section may further have a plurality of dummy trench sections that penetrate the base region from the upper surface of the semiconductor substrate to the drift region. The first region may be provided being sandwiched between two dummy trench sections adjacent to each other of the dummy trench sections on the upper surface of the semiconductor substrate.

The semiconductor device may further include a well region of a second conductivity-type exposed on the upper surface of the semiconductor substrate. The transistor section may further have an emitter region of a first conductivity-type provided in contact with the upper surface of the semiconductor substrate and provided above the base region. The base region may be provided being exposed on the upper surface of the semiconductor substrate, between the emitter region and the well region. A doping concentration in the base region provided being exposed on the upper surface of the semiconductor substrate may be equal to the doping concentration in the threshold value adjusting section.

The transistor section may further have a gate trench section that penetrates the base region from the upper surface of the semiconductor substrate to the drift region. In the transistor section, the base region has a first region that overlaps the lifetime control region and a second region that does not overlap the lifetime control region, as seen from the upper surface of the semiconductor substrate. The gate trench section may include a gate insulating film provided on an inner wall of the gate trench section. The gate insulating film may include the threshold value adjusting section provided in contact with the first region. A width of the threshold value adjusting section may be greater than a width of the gate insulating film in contact with the second region.

In one gate trench section, the threshold value adjusting section may be provided in contact with the first region on one side of the gate trench section, and the gate insulating film may be provided in contact with the second region on the other side of the gate trench section.

The transistor section may further have a dummy trench section that penetrates the base region from the upper surface of the semiconductor substrate to the drift region. The dummy trench section may include a dummy insulating film provided on an inner wall of the dummy trench section. The first region may be provided in contact with both the gate trench section and the dummy trench section while being sandwiched between the gate trench section and the dummy trench section. The threshold value adjusting section may be provided in contact with the first region on one side of the first region. The dummy insulating film may be provided in contact with the first region on the other side of the first region. The width of the threshold value adjusting section may be greater than a width of the dummy insulating film.

The transistor section may further have a gate trench section that penetrates the base region from the upper surface of the semiconductor substrate to the drift region. In the transistor section, the base region has a first region that overlaps the lifetime control region and a second region that does not overlap the lifetime control region, as seen from the upper surface of the semiconductor substrate. The gate trench section may include a gate insulating film provided on an inner wall of the gate trench section. The gate insulating film may include the threshold value adjusting section provided in contact with the first region. A dielectric constant of the threshold value adjusting section may be lower than a dielectric constant of the gate insulating film in contact with the second region.

The base region overlapping the lifetime control region may function as the threshold value adjusting section. A carrier lifetime at an upper end of the threshold value adjusting section may be equal to or greater than 80% of a carrier lifetime at a center of the semiconductor substrate in a depth direction.

When comparing carrier lifetimes at the same depth position, the threshold value adjusting section may have a portion where the carrier lifetime is greater than the carrier lifetime of the base region of the diode section. The threshold value adjusting section may be a part of the base region of the transistor section. A crystal defect density in the threshold value adjusting section may be lower than a crystal defect density in the base region of the diode section. A crystal defect density in the lifetime control region of a lower surface of the threshold value adjusting section may be lower than a crystal defect density in the lifetime control region of the diode section. A distance between the threshold value adjusting section and the lifetime control region may be greater than a distance between the base region of the diode section and the lifetime control region. The threshold value adjusting section may include hydrogen donors. In the transistor section, the base region may have a first region that overlaps the lifetime control region and a second region that does not overlap the lifetime control region, as seen from the upper surface of the semiconductor substrate. The first region may include the threshold value adjusting section. In a depth direction of the semiconductor substrate, the threshold value adjusting section may be longer than the second region.

A second aspect of the present invention provides a manufacturing method of a semiconductor device having a transistor section and a diode section, wherein both the transistor section and the diode section each have a drift region of a first conductivity-type provided inside a semiconductor substrate, and a base region of a second conductivity-type provided above the drift region. By irradiating a particle beam from an upper surface of the semiconductor substrate, a lifetime control region including lifetime killers may be formed below the base region from at least a part of the transistor section to the diode section. By irradiating, from the upper surface of the semiconductor substrate, light reaching the base region that overlaps the lifetime control region in the transistor section, a carrier lifetime of the base region may be recovered to form a threshold value adjusting section for adjusting a threshold value of the transistor section by recovering.

The semiconductor device may comprise, between the base region and the lifetime control region, an accumulation region of a first conductivity-type having a doping concentration higher than a doping concentration of the drift region. When forming the threshold value adjusting section, light reaching the accumulation region may be irradiated.

When forming the threshold value adjusting section, light reaching between the accumulation region and the lifetime control region may be irradiated.

The summary of the present invention does not necessarily describe all necessary features of the present invention. The present invention may also be a sub-combination of the features described above.

DESCRIPTION OF EXEMPLARY EMBODIMENTS

Figure 1:
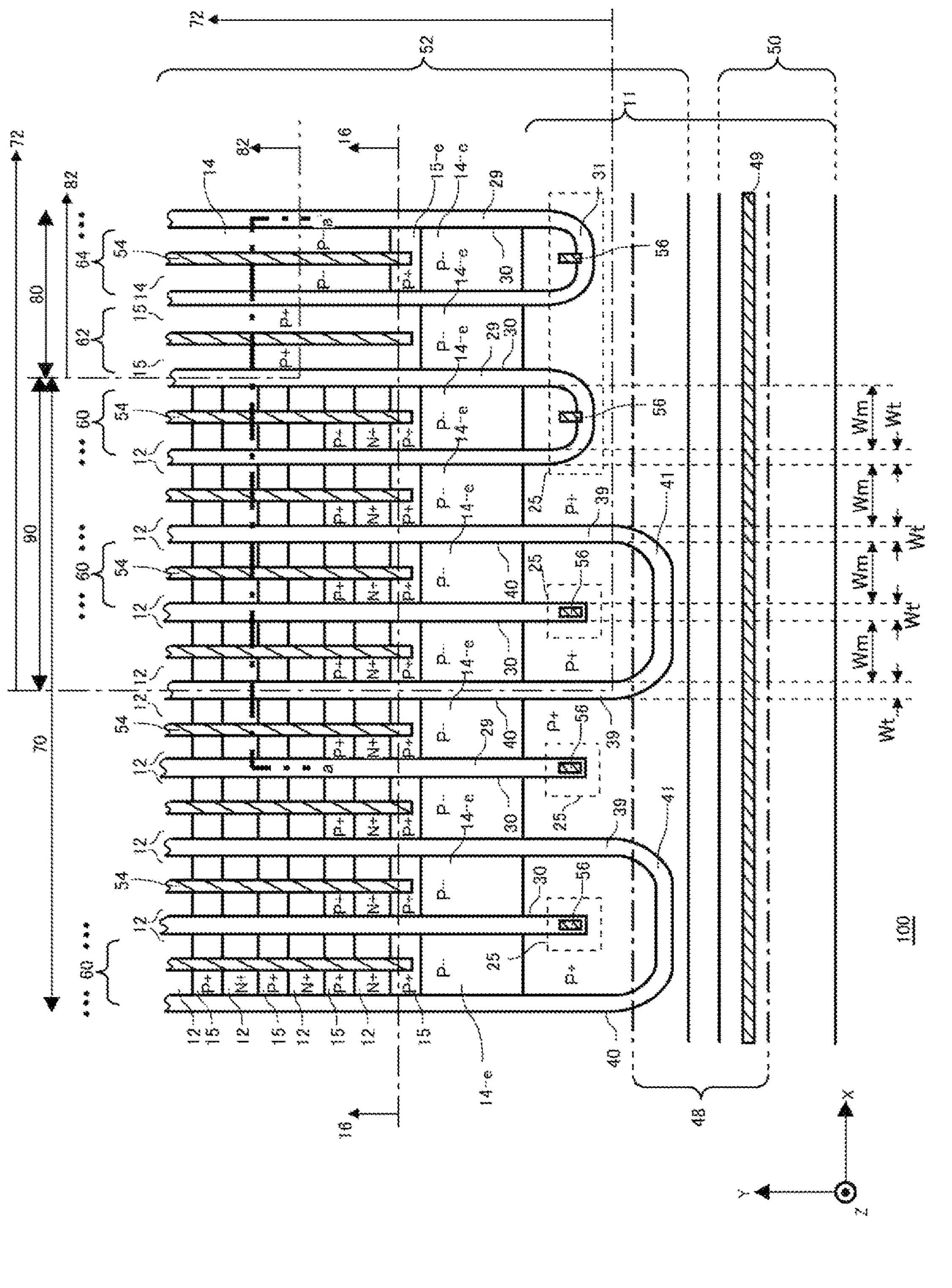
FIG. 1 partially shows an example of an upper surface of a semiconductor device 100 in accordance with one embodiment of the present invention.

Hereinafter, the present invention will be described through embodiments of the invention. However, the following embodiments do not limit the invention defined in the claims. Also, all combinations of features described in the embodiments are not necessarily essential to solutions of the invention.

As used herein, one side in a direction parallel to a depth direction of a semiconductor substrate is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a mounting direction of a semiconductor device to a substrate and the like when mounting the same.

As used herein, the technical matters may be described using orthogonal coordinates axes of X-axis, Y-axis and Z-axis, in some cases. As used herein, a plane parallel to the upper surface of the semiconductor substrate is defined as 'XY plane', and a depth direction perpendicular to the upper surface of the semiconductor substrate is defined as 'Z-axis'.

In each embodiment, an example in which a first conductivity-type is N type and a second conductivity-type is P type is described. However, the first conductivity-type may be P type and the second conductivity-type may be N type. In this case, the conductivity types of the substrate, layers, regions, and the like in each embodiment are reversed. Also, as used herein, P+ type (or N+ type) means that a doping concentration is higher than P type (or N type), and P− type (or N− type) means that a doping concentration is lower than P type (or N type).

As used herein, a doping concentration refers to a concentration in dopants transformed to donors or acceptors. A unit of the doping concentration is $/cm^3$. As used herein, there is a case in which a difference of concentration in the donors and acceptors (i.e., a net doping concentration) is defined as the doping concentration. In this case, the doping concentration may be measured by an SR method. Also, chemical concentrations of donors and acceptors may be defined as the doping concentration. In this case, the doping concentration may be measured by an SIMS method. Unless otherwise limited, any of the above may be used as the doping concentration. Unless otherwise limited, a peak value of a doping concentration distribution in a doped region may be defined as the doping concentration in the doped region.

Also, as used herein, a dose amount refers to the number of ions per unit area implanted into a wafer when performing ion implantation. Therefore, a unit thereof is $/cm^2$. Note that, a dose amount in a semiconductor region can be set as an integrated concentration obtained by integrating the doping concentration in the depth direction of the semiconductor region. A unit of the integrated concentration is $/cm^2$. Therefore, the dose amount and the integrated concentration may be treated as the same.

As used herein, when it is described that some physical quantities are the same or equivalent, an error within ±5% may be included. Also, when it is described that positions, in the depth direction, of the semiconductor substrate are the same or equivalent, an error within ±1% of a thickness of the semiconductor substrate may be included.

FIG. 1 partially shows an example of an upper surface of a semiconductor device 100 in accordance with one embodiment of the present invention. The semiconductor device 100 of the present example is a semiconductor chip having a transistor section 70 and a diode section 80. The transistor section 70 includes a transistor such as an IGBT. The diode section 80 includes a diode functioning as an FWD (Free Wheel Diode). The diode section 80 is provided alongside of the transistor section 70 in an arrangement direction (in the present example, an X-axis direction) on an upper surface of a semiconductor substrate.

Also, although FIG. 1 shows an active region of the semiconductor substrate of the semiconductor device 100, the semiconductor device 100 may have an edge termination structure part surrounding the active section. The active region refers to a region in which current flows when the semiconductor device 100 is controlled to be in an on state. The edge termination structure part relaxes electric field concentration on the upper surface-side of the semiconductor substrate. The edge termination structure part has, for example, a guard ring, a field plate, RESURF and a combined structure thereof.

The semiconductor device 100 of the present example includes gate trench sections 40, dummy trench sections 30, a well region 11, emitter regions 12, base regions 14 and contact regions 15, provided inside the semiconductor substrate and exposed on the upper surface of the semiconductor substrate. Also, the semiconductor device 100 of the present example includes an emitter electrode 52 and a gate metal layer 50 provided above the upper surface of the semiconductor substrate. The emitter electrode 52 and the gate metal layer 50 are provided separated from each other.

An interlayer dielectric film is provided between the emitter electrode 52 and gate metal layer 50 and the upper surface of the semiconductor substrate but is not shown in FIG. 1. In the interlayer dielectric film of the present example, contact holes 56, a contact hole 49 and contact holes 54 are provided penetrating the interlayer dielectric film.

The emitter electrode 52 is provided above the gate trench sections 40, the dummy trench sections 30, the well region 11, the emitter regions 12, the base regions 14 and the contact regions 15. The emitter electrode 52 is connected to a dummy conductive section in the dummy trench section 30 via the contact hole 56. A connection section 25 formed of a conductive material such as polysilicon doped with impurities may be provided between the emitter electrode 52 and the dummy conductive section. An insulating film such as an oxide film is provided between the connection section 25 and the upper surface of the semiconductor substrate.

The gate metal layer 50 is in contact with a gate runner 48 via the contact hole 49. The gate runner 48 is formed of polysilicon doped with impurities, for example. The gate runner 48 is connected to a gate conductive section in the gate trench section 40 on the upper surface of the semiconductor substrate. The gate runner 48 is not connected to the dummy conductive section in the dummy trench section 30. The gate runner 48 of the present example is provided from below the contact hole 49 to an edge portion of the gate trench section 40. An insulating film such as an oxide film is provided between the gate runner 48 and the upper surface of the semiconductor substrate. At the edge portion of the gate trench section 40, the gate conductive section is exposed on the upper surface of the semiconductor substrate. The gate trench section 40 is in contact with the gate runner 48 at the exposed portion of the gate conductive section.

The emitter electrode 52 and the gate metal layer 50 are formed of a material including metal. For example, at least a part of a region of each electrode is formed of aluminum or an aluminum-silicon alloy. Each electrode may have a barrier metal formed of titanium, titanium compound, or the like in a lower layer of the region formed of aluminum or the like. Also, each electrode may have a plug formed of tungsten or the like in the contact hole.

One or more gate trench sections 40 and one or more dummy trench sections 30 are arranged at predetermined intervals in a predetermined arrangement direction (the X-axis direction, in the present example). The gate trench sections 40 of the present example may have two extension portions 39 extending in an extension direction (the Y-axis direction, in the present example) which is parallel to the upper surface of the semiconductor substrate and perpendicular to the arrangement direction, and a connection section 41 connecting the two extension portions 39. At least a part of the connection section 41 is preferably formed in a curved shape. By connecting the end portions of the two extension portions 39 of the gate trench section 40, electric field concentration at the end portions of the extensions portions 39 can be relaxed. The gate runner 48 may be connected to the gate conductive section at the connection section 41 of the gate trench section 40.

The dummy trench section 30 of the present example may have a U-shape, as seen from the upper surface of the semiconductor substrate, similarly to the gate trench section 40. That is, the dummy trench section 30 of the present example may have two extension portions 29 extending in the extension direction, and a connection section 31 connecting the two extension portions 29.

In the present example, a width Wt is a width of the trench section in the arrangement direction (X-axis direction). In the present example, a width of the gate trench section 40 and a width of the dummy trench section 30 in the X-axis direction may together be the width Wt.

The well region 11 is provided within a preset range from an end portion of the active region on a side on which the gate metal layer 50 is provided. The well region 11 of the present example is of P+ type. A diffusion depth of the well region 11 may be greater than depths of the gate trench section 40 and the dummy trench section 30. Some regions of the gate trench section 40 and the dummy trench section 30 on the gate metal layer 50-side are provided in the well region 11. A bottom of an end of each of the gate trench section 40 and the dummy trench section 30 in the extension direction may be covered by the well region 11.

In the transistor section 70, the contact hole 54 is provided above each of the contact region 15 and the emitter region 12. In the diode section 80, the contact hole 54 is provided above the base region 14. No contact hole 54 is arranged above the base region 14 and the well region 11 that are arranged at both ends in the X-axis direction.

In a direction parallel to the upper surface of the semiconductor substrate, a mesa section is provided in contact with each trench section in the Y-axis direction. The mesa section may be a portion of the semiconductor substrate that is sandwiched between two adjacent trench sections, and may be a portion from the upper surface of the semiconductor substrate to the depth of the deepest bottom portion of each trench section. An extension portion of each trench section may be configured as one trench section. That is, a region sandwiched between two extension portions may be referred to as a mesa section.

In the transistor section 70, a first mesa section 60 is provided in contact with each trench section. In the diode section 80, a second mesa section 62 is provided in a region adjacent to the transistor section 70 in the X-axis direction. Also, a third mesa section 64 is provided in a region that is sandwiched between adjacent dummy trench sections 30 in the diode section 80, excluding the second mesa section 62.

An upper surface of the first mesa section 60 is provided with the emitter region 12 of a first conductivity-type in contact with the gate trench section 40. The emitter region 12 of the present example is of N+ type. Also, the upper surface of the first mesa section 60 is provided with the contact region 15 of a second conductivity-type having a higher doping concentration than that of the base region 14. The contact region 15 of the present example is of P+ type. In the first mesa section 60, the emitter region 12 and the contact region 15 may be alternately provided in the extension direction of the gate trench section 40.

A width Wm is a width in the X-axis direction between two adjacent trench sections in the first mesa section 60. Note that, a sum of the width Wm and the width Wt is a trench pitch.

In the first mesa section 60, the emitter region 12 and the contact region 15 are also provided below the contact holes 54. That is, in the first mesa section 60, the emitter region 12 and the contact region 15 are continuously provided from one trench section to the other trench section adjacent to said trench section in the arrangement direction, through below the contact hole 54. In the first mesa section 60, the width of each of the emitter region 12 and the contact region 15 in the X-axis direction may be equal to the width Wm.

On the upper surface of the first mesa section 60, the emitter region 12 and the contact region 15 may be provided in contact with or separately from the dummy trench section 30. The emitter region 12 and the contact region 15 of the present example are provided in contact with the dummy trench section 30.

An upper surface of the second mesa section 62 is provided with the contact region 15. In the second mesa section 62, the contact region 15 is also provided below the contact hole 54. That is, in the second mesa section 62, the contact region 15 is continuously provided from one trench section to the other trench section adjacent to said trench section in the arrangement direction, through below the contact hole 54.

In the second mesa section 62, a width in the X-axis direction between two adjacent trench sections may be equal to the width Wm. In the second mesa section 62, a width of the contact region 15 in the X-axis direction may be equal to the width Wm.

An upper surface of the third mesa section 64 is provided with contact regions 15-*e* at both end portions in the Y-axis direction. A region that is the upper surface of the third mesa section 64 and is sandwiched between the contact regions 15-*e* is provided with the base region 14 of a second conductivity-type. The base region 14 of the present example is of P− type. The base region 14 may be provided in the entire region sandwiched between the contact regions 15-*e*.

In the third mesa section 64, a width in the X-axis direction between two adjacent trench sections may be equal to the width Wm. In the third mesa section 64, a width of each of the base region 14 and the contact region 15-*e* in the X-axis direction may be equal to the width Wm.

In the first mesa section 60, the base region 14 is provided below the emitter region 12 and the contact region 15. In the second mesa section 62, the base region 14 is provided below the contact region 15.

In the third mesa section 64, the base region 14 is also provided below the contact hole 54. That is, in the third mesa section 64, the base region 14 is continuously provided from one trench section to the other trench section adjacent to said trench section in the arrangement direction, through below the contact hole 54. The third mesa section 64 may not be provided with the emitter region 12.

The diode section 80 has a cathode region 82 of a first conductivity-type on a lower surface-side of the semiconductor substrate. The cathode region 82 of the present example is of N+ type. In FIG. 1, as seen from the upper surface of the semiconductor substrate, a region in which the cathode region 82 is provided is shown with a dashed-dotted line. The diode section 80 may be a projection region of the cathode region 82 to the upper surface of the semiconductor substrate. The projection region of the cathode region 82 to the upper surface of the semiconductor substrate may be distant from the contact region 15-*e* in the +Y-axis direction.

A region of the lower surface of the semiconductor substrate in which the cathode region 82 is not provided may be provided with a collector region of a second conductivity-type. The collector region of the present example is of P+ type. The transistor section 70 may also be a region, in which the trench section or the mesa section is provided, of a projection region of the collector region to the upper surface of the semiconductor substrate.

In the semiconductor device 100 of the present example, a lifetime control region 72 including lifetime killers is locally provided inside the semiconductor substrate. In FIG. 1, as seen from the upper surface of the semiconductor substrate, a region in which the lifetime control region 72 is provided is shown with a dashed-dotted line.

As shown in FIG. 1, the lifetime control region 72 of the present example is continuously provided in the +X-axis direction from below the gate trench section 40 closest to the diode section 80 in the X-axis direction. The lifetime control region 72 of the present example is continuously provided from the transistor section 70 to the diode section 80 in the X-axis direction. In the present example, a boundary section 90 is a region of the transistor section 70 in which the lifetime control region 72 is provided. Also, the lifetime control region 72 of the present example has a peak in a range which is below the trench section in the Z-axis direction and above half of the thickness of the semiconductor substrate, and is continuously provided in the +Y-axis direction. A peak position of the lifetime control region 72 in the Z-axis direction may be equal to a position of the lower surface of the well region 11 in the Z-axis direction, or it may be provided below the position of the lower surface of the well region 11 in the Z-axis direction.

In the transistor section 70, a base region 14-*e* may be provided being exposed on the upper surface of the semiconductor substrate, between the emitter region 12 and the well region 11 in the extension direction (Y-axis direction). In the diode section 80, a base region 14-*e* may be provided being exposed on the upper surface of the semiconductor substrate between the contact region 15 and the well region 11 in the extension direction. The base regions 14-*e* are provided at both end portions of the first mesa section 60, the second mesa section 2 and the third mesa section 64 in the Y-axis direction, for example. In FIG. 1, only the base region 14-*e* provided at the end portion on the negative side of the Y-axis is shown.

Figure 2A:
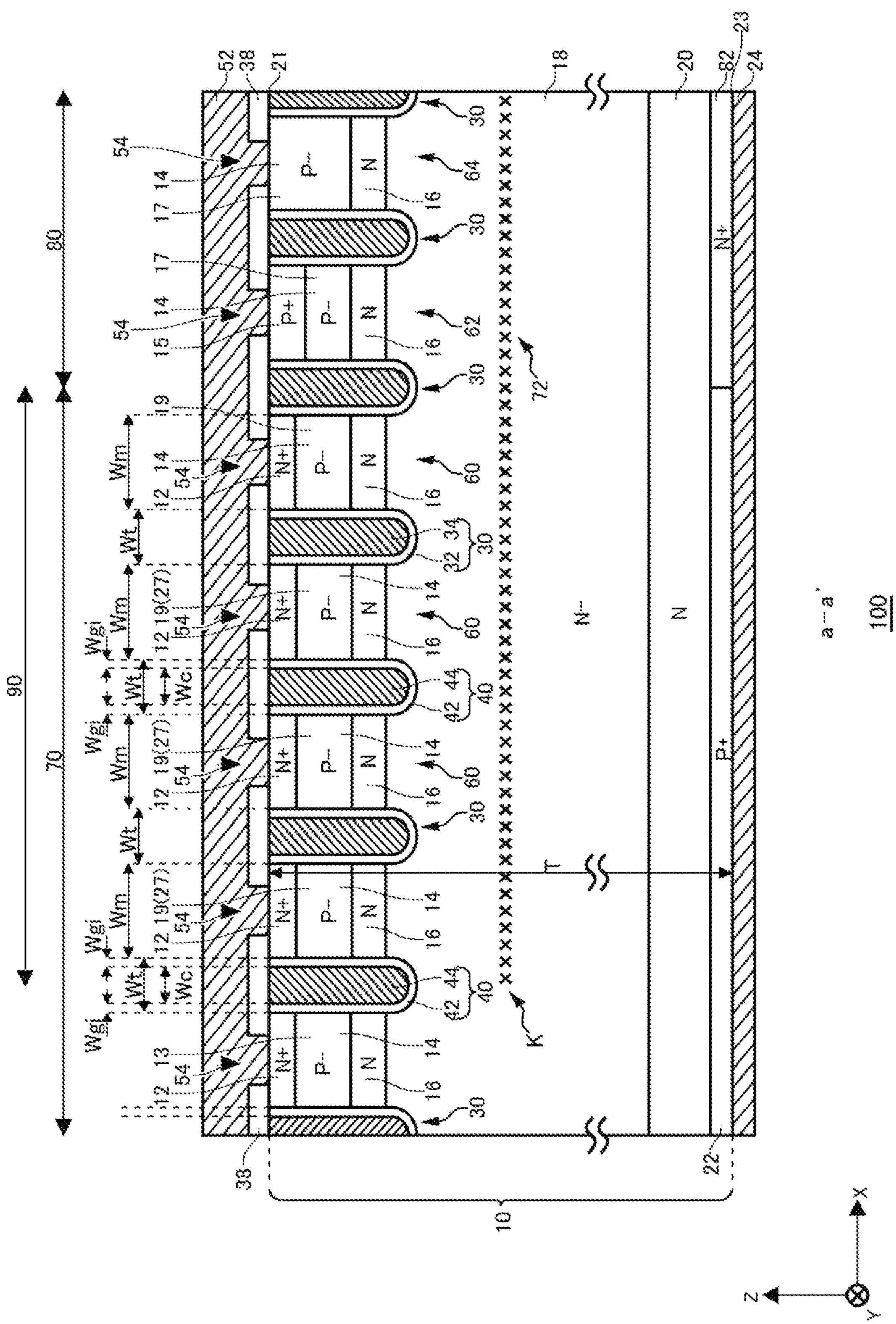
FIG. 2A shows an example of a cross-section a-a' in FIG. 1.
Figure 2B:
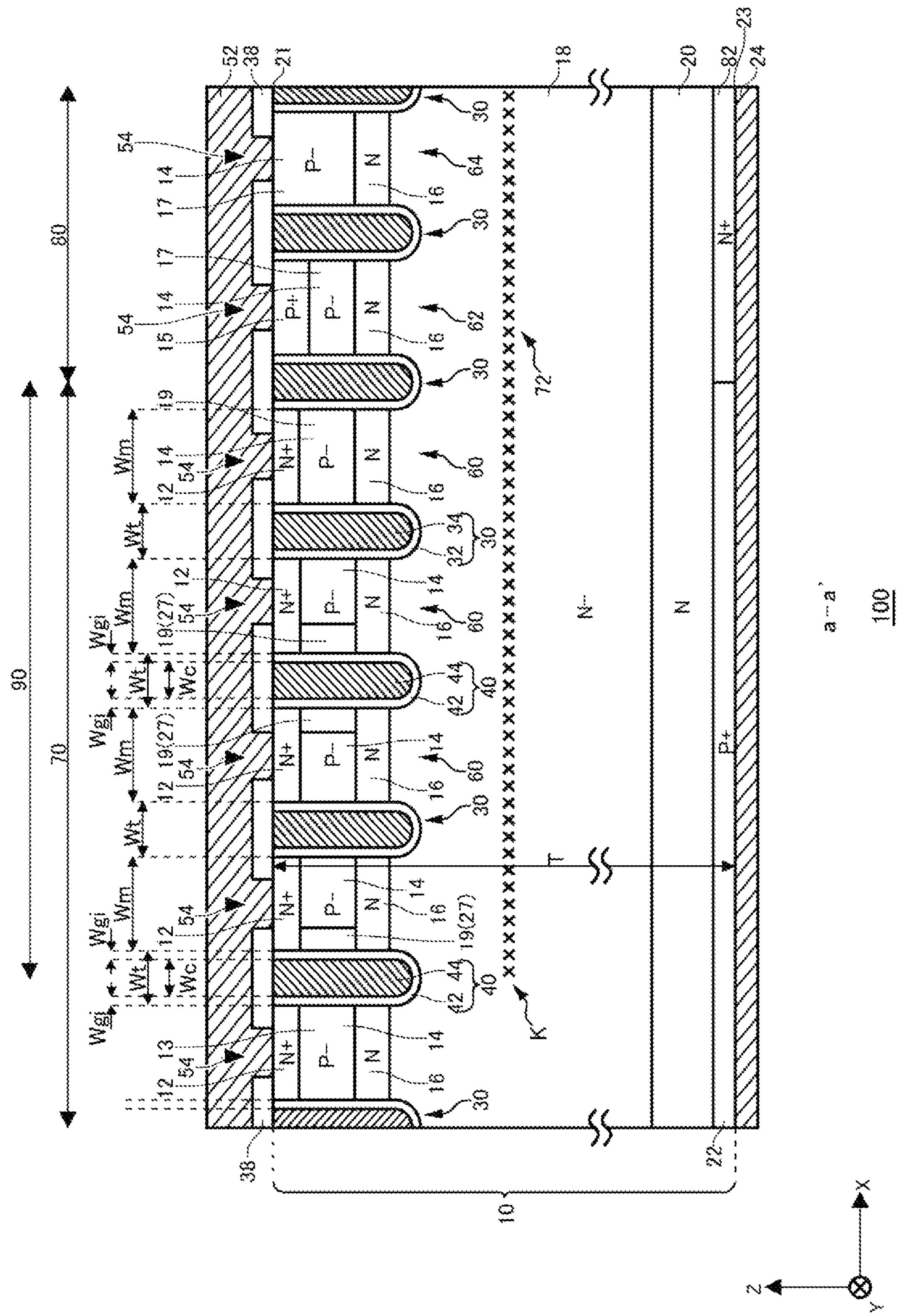
FIG. 2B shows another example of the cross-section a-a' in FIG. 1.

In the first mesa section 60 of the boundary section 90, a doping concentration in the base region 14-*e* provided being exposed on the upper surface of the semiconductor substrate may be equal to a doping concentration in the threshold value adjusting section 27 (see FIG. 2A or 2B). In the first mesa section 60 excluding the boundary section 90, the doping concentration in the base region 14-*e* may be equal to a doping concentration in the second region 13. In the second mesa section 62 and the third mesa section 64, the doping concentration in the base region 14-*e* may be equal to a doping concentration in the third region 17.

In the present example, an accumulation region 16 of a first conductivity-type is provided below the base region 14. The accumulation region 16 of the present example is of N type. The accumulation region 16 may be arranged above a lower end of each trench section. In FIG. 1, a range in which the accumulation region 16 is provided is shown with a dashed-dotted line. An end portion of the accumulation region 16 in the Y-axis direction may be arranged below the contact region 15 provided being sandwiched between the emitter region 12 and the base region 14-*e* on the upper surface of the semiconductor substrate. The accumulation region 16 is provided, so that it is possible to increase a carrier injection enhancement effect (IE effect), thereby reducing an on-voltage.

In the present example, in the transistor section 70 excluding the boundary section 90, the dummy trench section 30 is provided adjacent to the gate trench section 40 in the X-axis direction. That is, in the present example, in the transistor section 70 excluding the boundary section 90, the first mesa section 60 is sandwiched between the gate trench section 40 and the dummy trench section 30. In the transistor section 70 excluding the boundary section 90, another gate trench section 40 may be provided adjacent to the gate trench section 40 in the X-axis direction. That is, in the transistor section 70 excluding the boundary section 90, the first mesa section 60 may be sandwiched between the two gate trench sections 40. The two gate trench sections 40 sandwiching the first mesa section 60 may or may not have a U-shape, as seen from the upper surface of the semiconductor substrate.

Note that, the configurations of the gate trench section 40 and the dummy trench section 30 in the transistor section 70 are not limited to the above. For example, in the X-axis direction, a plurality of the gate trench sections 40 may be arranged, and a plurality of the dummy trench sections 30 may be arranged therebetween. Specifically, two or three gate trench sections 40 and two or three dummy trench sections 30 may be alternately arranged. In addition, a 1G2E configuration where one gate trench section 40 and two dummy trench sections 30 are arranged and a 2G1E configuration, which is an opposite configuration, are also possible.

In the transistor section 70 excluding the boundary section 90, the first mesa section 60 sandwiched between two gate trench sections 40 and the first mesa section sandwiched between the gate trench section 40 and the dummy trench section 30 may be provided together. In the transistor section 70 excluding the boundary section 90, the first mesa section 60 sandwiched between two dummy trench sections 30 may be further provided, in addition to the first mesa section 60 sandwiched between two gate trench sections 40 and the first mesa section sandwiched between the gate trench section 40 and the dummy trench section 30.

FIG. 2A shows an example of a cross-section a-a' in FIG. 1. The cross-section a-a' is an XZ plane passing through the emitter region 12, the contact region 15 and base region 14, and the gate trench section 40 and dummy trench section 30. In the cross-section a-a', the semiconductor device 100 of the present example includes a semiconductor substrate 10, an interlayer dielectric film 38, an emitter electrode 52, and a collector electrode 24.

The interlayer dielectric film 38 is provided on an upper surface 21 of the semiconductor substrate 10. The interlayer dielectric film 38 is a dielectric film such as silicate glass to which impurities such as boron or phosphorous have been added. The interlayer dielectric film 38 may be in contact with the upper surface 21, and another film such as an oxide film may be provided between the interlayer dielectric film 38 and the upper surface 21. The interlayer dielectric film 38 is provided with the contact holes 54, 49 and 56 described in FIG. 1. In FIG. 2A, the contact holes 54 are shown.

The emitter electrode 52 is provided on the upper surface 21 of the semiconductor substrate 10 and an upper surface of the interlayer dielectric film 38. The emitter electrode 52 is in electrical contact with the upper surface 21 via the contact holes 54 in the interlayer dielectric film 38. A contact plug such as tungsten (W) or the like may be provided inside the contact hole 54. The collector electrode 24 is provided on a lower surface 23 of the semiconductor substrate 10. The emitter electrode 52 and the collector electrode 24 are formed of a conductive material such as metal.

The semiconductor substrate 10 may be a silicon substrate, a silicon carbide substrate, a nitride semiconductor substrate such as a gallium nitride semiconductor substrate, or the like. In the present example, the semiconductor substrate 10 is a silicon substrate.

The semiconductor substrate 10 has a drift region 18 of a first conductivity-type. The drift region 18 of the present example is of N− type. The drift region 18 may be a residual region of the semiconductor substrate 10 in which another doped region is not provided.

Above the drift region 18, one or more accumulation regions 16 may be provided in the Z-axis direction. The accumulation region 16 is a region in which the same dopants as the drift region 18 are accumulated at a higher concentration than the drift region 18. A doping concentration in the accumulation region 16 is higher than a doping concentration in the drift region 18. The accumulation region 16 is provided, so that it is possible to increase a carrier injection enhancement effect (IE effect), thereby reducing an on-voltage.

In the drift region 18, a lifetime control region 72 including lifetime killers is locally provided inside the semiconductor substrate 10. The lifetime control region 72 may be formed by irradiating a particle beam from the upper surface 21 with the dashed-dotted line of FIG. 1 as a boundary. In FIG. 2A, peak positions, in the Z-axis direction, of concentration distribution of lifetime killers are indicated by a symbol "x". The lifetime killers are, for example, helium implanted to a predetermined depth position. By implanting helium, crystal defects can be formed inside the semiconductor substrate 10. The lifetime killers may also be hydrogen or electron beam implanted to a predetermined depth position. By implanting the electron beam or hydrogen, crystal defects can be formed inside the semiconductor substrate 10. As used herein, the crystal defects formed by irradiating the electron beam, helium, hydrogen or the like may also be referred to as vacancy defects, vacancy-type defects or vacancies.

A thickness of the semiconductor substrate 10 is denoted as T. The lifetime control region 72 of the present example is provided at a position shallower than half of the thickness T, with respect to the upper surface 21. The lifetime control region 72 may also be provided at a position deeper than half of the thickness T. Also, the lifetime control region 72 may be formed so as to have a plurality of peaks, in the Z-axis direction, of concentration distribution of the lifetime killers. As shown in FIG. 1, the lifetime control region 72 is continuously provided from below the gate trench section 40 closest to the diode section 80 to the diode section 80 in the X-axis direction. The lifetime control region 72 is continuously provided from the boundary section 90 to the diode section 80 in the X-axis direction. An end portion K of the lifetime control region 72 on the negative side of the X-axis may also be arranged below the gate trench section 40 closest to the diode section 80.

In the boundary section 90 of the semiconductor device 100 of the present example, the lifetime control region 72 is locally provided on the upper surface 21-side inside the semiconductor substrate 10. For this reason, during operation of the diode section 80, a drift amount of holes from the base region 14 of the boundary section 90 to the cathode region 82 can be reduced. Therefore, reverse recovery loss of the diode section 80 can be reduced.

In the present example, the base region 14 in the transistor section 70 has a first region 19 that overlaps the lifetime control region 72 and a second region 13 that does not overlap the lifetime control region 72, as seen from above. In the present example, the entire first region 19 in the X-axis direction overlaps the lifetime control region 72, as seen from above.

In the present example, the base region 14 in the diode section 80 has a third region 17 overlapping the lifetime control region 72, as seen from above. In the present example, the entire third region 17 in the X-axis direction overlaps the lifetime control region 72, as seen from above.

In the semiconductor device 100 of the present example, the threshold value adjusting section 27 for controlling a threshold value of the transistor section 70 is provided overlapping the lifetime control region 72, as seen from above. In the present example, the threshold value adjusting section 27 is the base region 14 doped with impurities at a high concentration.

In the present example, the first region 19 includes the threshold value adjusting section 27. A doping concentration in the threshold value adjusting section 27 is higher than the doping concentration in the second region 13. The doping concentration in the threshold value adjusting section 27 may be greater than or equal to 1.1 times the doping concentration in the second region 13.

A doping concentration in the third region 17 may be lower than the doping concentration in the threshold value adjusting section 27. Also, the doping concentration in the third region 17 may be equal to the doping concentration in the second region 13. By the above configuration, the third region 17 of the base region 14 of the diode section 80 and the second region 13 of the transistor section 70 can be manufactured by performing the same process, which reduces the number of patterning times. In this case, the doping concentration in the third region 17 may be less than or equal to 0.9 times the doping concentration in the threshold value adjusting section 27. Note that, the doping concentration in the third region 17 may be equal to the doping concentration in the threshold value adjusting section 27, and the doping concentration in the third region 17 may be higher than the doping concentration in the second region 13. In this case, the third region 17 of the base region 14 of the diode section 80 and threshold value adjusting section 27 of the first region 19 of the transistor section 70 can be manufactured by performing the same process. Note that, the present invention is not limited to the above example, and the doping concentration in the third region 17 of the base region 14 of the diode section 80 may be freely designed.

In the transistor section 70, the emitter region 12 is provided in contact with the upper surface 21 above the base region 14. The emitter region 12 is provided in contact with the gate trench section 40. A doping concentration in the emitter region 12 is higher than a doping concentration in the drift region 18. A dopant of the emitter region 12 is, as an example, arsenic (As), phosphorous (P), antimony (Sb) or the like.

In the second mesa section 62 of the diode section 80, the contact region 15 is provided in contact with the upper surface 21 above the base region 14. The contact region 15 may be provided in contact with the dummy trench section 30.

A buffer region 20 of a first conductivity-type may be provided below the drift region 18. The buffer region 20 of the present example is of N type. A doping concentration in the buffer region 20 is higher than a doping concentration in the drift region 18. The buffer region 20 may function as a field stop layer configured to prevent a depletion layer, which expands from a lower surface-side of the base region 14, from reaching the collector region 22 and the cathode region 82.

In the diode section 80, the cathode region 82 is provided below the buffer region 20. The cathode region 82 may be provided at the same depth as the collector region 22 of the transistor section 70. The diode section 80 may function as a free wheel diode (FWD) that causes a free wheeling current conducting in an opposite direction to flow when the transistor section 70 is turned off.

In the transistor section 70, the collector region 22 is provided below the buffer region 20. The collector region 22 may be provided in contact with the cathode region 82 on the lower surface 23.

The semiconductor substrate 10 is provided with the gate trench section 40 and the dummy trench section 30. The gate trench section 40 and the dummy trench section 30 are each provided so as to penetrate the base region 14 and the accumulation region 16 from the upper surface 21 and to reach the drift region 18. The configuration of the trench section penetrating a doped region is not limited to a manufacturing sequence of forming the doped region and then forming the trench sections. A manufacturing sequence of forming the trench sections and then forming the doped region between the trench sections is also included in the configuration of the trench section penetrating the doped region.

The gate trench section 40 has a gate trench provided in the upper surface 21, a gate insulating film 42 and a gate conductive section 44. The gate insulating film 42 is provided covering an inner wall of the gate trench. The gate insulating film 42 may be formed by oxidizing or nitriding a semiconductor of the inner wall of the gate trench. The gate conductive section 44 is provided on a more inner side than the gate insulating film 42 inside the gate trench. An upper surface of the gate conductive section 44 may be located in the same XY plane as the upper surface 21. The gate insulating film 42 provides insulation between the gate conductive section 44 and the semiconductor substrate 10. The gate conductive section 44 is formed of a conductive material such as polysilicon.

In the present example, a width Wgi is a width in the X-axis direction of the gate insulating film 42 on a sidewall of the gate trench. The width Wgi may also be a width between a sidewall of the gate conductive section 44 and the base region 14 facing the sidewall across the gate insulating film 42, in the X-axis direction. In the present example, the widths in the X-axis direction of the gate insulating films 42 provided on both sides of one gate conductive section 44 in the X-axis direction may be equal.

The gate conductive section 44 may be provided to be longer than the base region 14 in the depth direction. The gate trench section 40 is covered by the interlayer dielectric film 38 on the upper surface 21. When a predetermined voltage is applied to the gate conductive section 44, a channel is formed by an inversion layer of electrons on a surface layer of an interface in contact with the gate trench, among the base region 14.

The dummy trench section 30 may have the same structure as the gate trench section 40 in an XZ cross-section. The dummy trench section 30 has a dummy trench provided in the upper surface 21, and a dummy insulating film 32 and a dummy conductive section 34. The dummy insulating film 32 is provided covering an inner wall of the dummy trench. The dummy insulating film 32 may be formed by oxidizing or nitriding a semiconductor of the inner wall of the dummy trench. The dummy conductive section 34 is provided on a more inner side than the dummy insulating film 32 inside the dummy trench. An upper surface of the dummy conductive section 34 may be located in the same XY plane as the upper surface 21. The dummy insulating film 32 provides insulation between the dummy conductive section 34 and the semiconductor substrate 10. The dummy conductive section 34 may be formed of the same material as the gate conductive section 44. A width in the X-axis direction of the dummy insulating film 32 on a sidewall of the dummy trench may be equal to the width Wgi.

In the present example, a width Wc is a width of the gate conductive section 44 in the X-axis direction. The width Wc may be a width between an end portion of the gate conductive section 44 on a positive side of the X-axis and an end portion thereof on a negative side of the X-axis on the upper surface of the gate conductive section 44, i.e., at a position at which the gate conductive section 44 and the interlayer dielectric film 38 are in contact with each other in the Z-axis direction. In the present example, a sum of twice the width Wgi and the width Wc is equal to the width Wt of the trench section in the X-axis direction. Note that, the width of the dummy conductive section 34 in the X-axis direction may be equal to the width Wc.

In the present example, the gate trench section 40 and the dummy trench section 30 are covered by the interlayer dielectric film 38 on the upper surface 21. Note that, the bottom portions of the dummy trench section 30 and the gate trench section 40 may have a convex curved shape (a curve shape in a cross-section) on the lower side, respectively.

FIG. 2B shows another example of the cross-section a-a' in FIG. 1. The present example is different from the example of FIG. 2A, in that in one first mesa section 60, the base region 14 in the boundary section 90 is divided into a threshold value adjusting section 27 and a P type region having a lower concentration than the threshold value adjusting section 27. The other structures may be the same as those in FIG. 2A.

In the present example, the base region 14 in the boundary section 90 has the threshold value adjusting section 27 in contact with the gate trench section 40. A region of the base region 14 excluding the threshold value adjusting section 27 may be a P type region having the same concentration as the second region 13. The P type region is in contact with the dummy trench section 30. That is, in the base region 14 of the present example, a region on the gate trench section 40-side is the threshold value adjusting section 27, and a region on the dummy trench section 30-side is the P type region having a lower concentration than the threshold value adjusting section 27.

When forming the base region 14, implantation of an impurity element such as boron is selectively performed by fine photolithography, so that the base region 14 of the present example can be formed. Also, when boron is implanted from the sidewall with the gate conductive section 44 unfilled inside the gate trench section 40, one base region 14 can be formed to have different concentrations in the vicinity of each of the trenches on both sides. An impurity concentration on the dummy trench section 30-side of the first region 19 sandwiched between the gate trench section 40 and the dummy trench section 30 may be the same as or different from that of either of the second region 13 and the third region 17.

Figure 3:
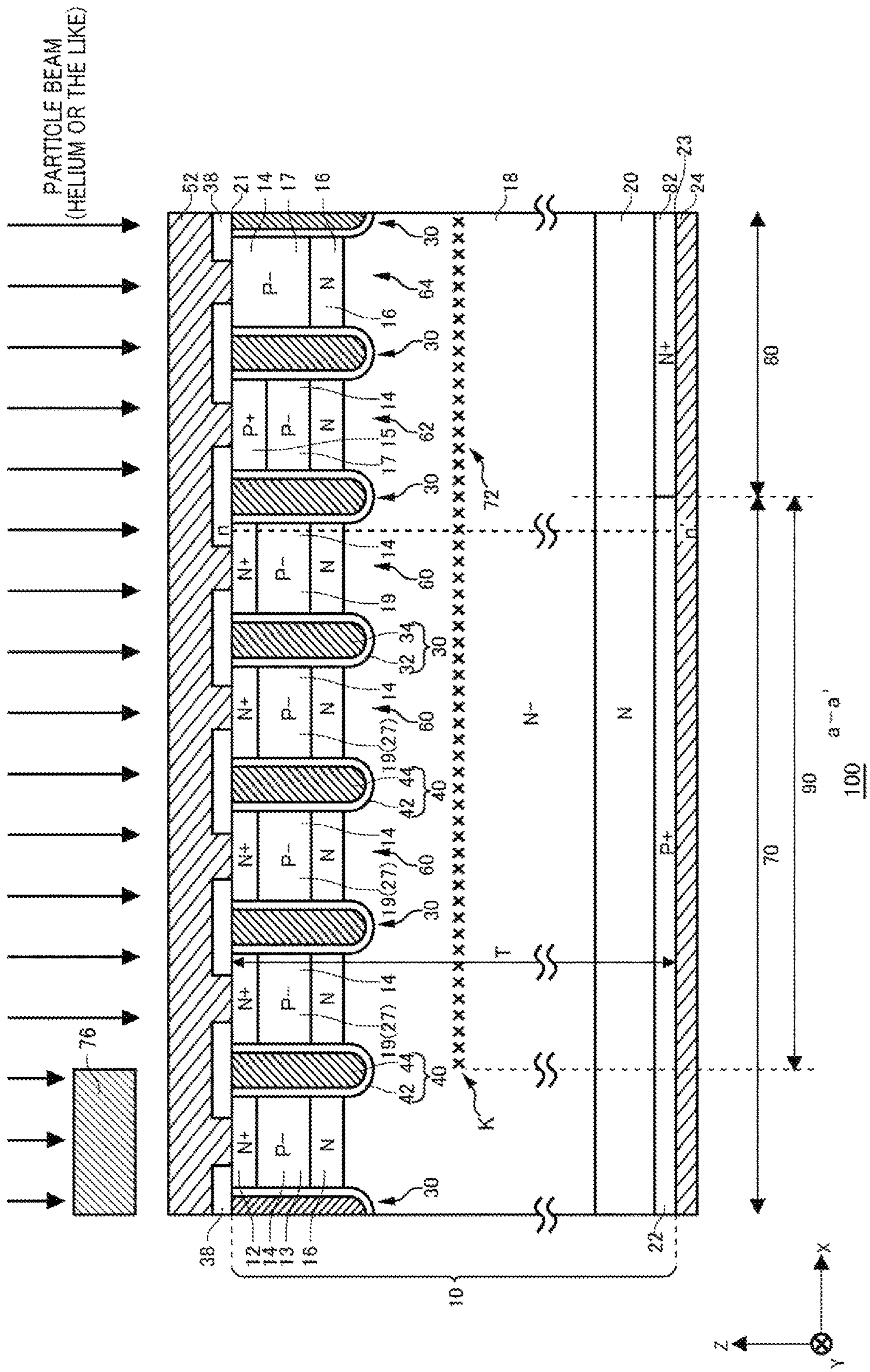
FIG. 3 is a pictorial view of a step for forming a lifetime control region 72.

FIG. 3 is a pictorial view of a step for forming the lifetime control region 72. As shown in FIG. 3, the lifetime control region 72 is formed by irradiating a particle beam from the upper surface 21, for example. Helium or the like may be used as the particle beam.

In the present example, a mask 76 is arranged above the transistor section 70 excluding the boundary section 90, and the the transistor section 70 and the diode section 80 are irradiated with the particle beam. Portions below the mask 76 are not irradiated with the particle beam. The boundary section 90 and the diode section 80 are irradiated with the particle beam.

The particle beam passes through the base region 14 and the gate trench section 40 in the boundary section 90. For this reason, an interface state of a region in which a channel is formed in the base region 14 may change. For this reason, the threshold value of the transistor section 70 may be lowered.

In the transistor section 70 of the semiconductor device 100 of the present example, the threshold value adjusting section 27 for adjusting the threshold value of the transistor section 70 is provided overlapping the lifetime control region 72, as seen from above. In the present example, the threshold value adjusting section 27 is the base region 14 doped with impurities at a high concentration.

The threshold value adjusting section 27 may be formed by patterning and ion implantation processes that are different from those for any of the second region 13, the third region 17, and the first region 19 excluding the threshold value adjusting section 27. The threshold value adjusting section 27 may be formed before or after a process of forming the second region 13, the third region 17 and the first region 19 excluding the threshold value adjusting section 27.

In the present example, the doping concentration in the threshold value adjusting section 27 is preset to be higher than the doping concentration in the second region 13. For this reason, a threshold value of a transistor at which a channel is formed in the threshold value adjusting section 27 is preset to be higher than a threshold value of a transistor at which a channel is formed in the second region 13. For this reason, even when the threshold value of the transistor in the boundary section 90 is lowered after the particle beam passes through the base region 14 and the gate trench section 40 in the boundary section 90, it is possible to reduce the difference between the threshold value of the transistor in the boundary section 90 and the threshold value of the transistor in the transistor section 70 excluding the boundary section 90. Specifically, the doping concentration in the threshold value adjusting section 27 is preferably set high so that after the particle beam passes through the base region 14 and the gate trench section 40 in the boundary section 90, the threshold value of the transistor in the boundary section 90 coincides with the threshold value of the transistor in the transistor section 70 excluding the boundary section 90. For this reason, it is possible to suppress instability of an operation of the transistor section 70 due to the difference in threshold values of the transistor sections 70.

In the first mesa section 60 on the negative side of the X-axis in the boundary section 90, the first region 19 may be provided being sandwiched between the gate trench section 40 and the dummy trench section 30. The first region 19 may be provided in contact with both the gate trench section 40 and the dummy trench section 30. In the present example, the first region 19 in the first mesa section 60 is the threshold value adjusting section 27. The threshold value adjusting section 27 is provided in contact with the gate trench section 40. The threshold value adjusting section 27 may be provided in contact with or separately from the dummy trench section 30.

In the first mesa section 60 closest to the diode section 80 in the boundary section 90, the first region 19 may be provided being sandwiched between two dummy trench sections 30 adjacent to each other in the arrangement direction (X-axis direction). The first region 19 may be provided in contact with both of the two dummy trench sections 30. The doping concentration in the first region 19 may be equal to the doping concentration in the second region 13. Since the first region 19 is not in contact with the gate trench section 40, the doping concentration in the first region 19 may be lower than the doping concentration in the threshold value adjusting section 27.

In the second mesa section 62 and the third mesa section 64 of the diode section 80, the third region 17 may be provided being sandwiched between two dummy trench sections 30 adjacent to each other in the arrangement direction. The doping concentration in the third region 17 may be equal to the doping concentration in the second region 13. Since the third region 17 is not in contact with the gate trench section 40, the doping concentration in the third region 17 may be lower than the doping concentration in the threshold value adjusting section 27.

The first regions 19 of all the first mesa sections 60 in the boundary section 90 may be the threshold value adjusting sections 27. The doping concentration in the third region 17 may be equal to the doping concentration in the threshold value adjusting section 27. From a standpoint of the particle beam irradiation for forming the lifetime control region 72, by arranging the mask above the transistor section 70 excluding the boundary section 90, the lifetime control region 72 can be formed in the boundary section 90 and the diode section 80. For this reason, it is preferable that the first regions of all the first mesa sections 60 in the boundary section 90 are the threshold value adjusting sections 27 and that the doping concentration in the third region 17 is equal to the doping concentration in the threshold value adjusting section 27.

Also, a doping concentration in the base region 14-*e* (see FIG. 1) in each of the boundary section 90 and the diode section 80 may be equal to the doping concentration in the threshold value adjusting section 27. When the lifetime control region 72 is provided in the +Y-axis direction from below the well region 11 in the Y-axis direction (see FIG. 1), the particle beam for forming the lifetime control region 72 is also irradiated from above the base region 14-*e*. For this reason, the doping concentration in the base region 14-*e* (see FIG. 1) may be equal to the doping concentration in the threshold value adjusting section 27.

In the boundary section 90 of the semiconductor device 100 of the present example, the lifetime control region 72 is locally provided on the upper surface 21-side inside the semiconductor substrate 10. For this reason, while the diode section 80 operates, a drift amount of holes from the base region 14 of the boundary section 90 to the cathode region 82 can be reduced. For this reason, the reverse recovery loss of the diode section 80 can be reduced.

In the boundary section 90 of the semiconductor device 100 of the present example, since the base region 14 includes the threshold value adjusting section 27, it is possible to suppress the difference in threshold values of the transistor sections 70 while providing the lifetime control region 72. That is, the semiconductor device 100 of the present example can suppress the instability of the operation of the transistor section 70 while reducing the reverse recovery loss of the diode section 80.

Figure 4A:
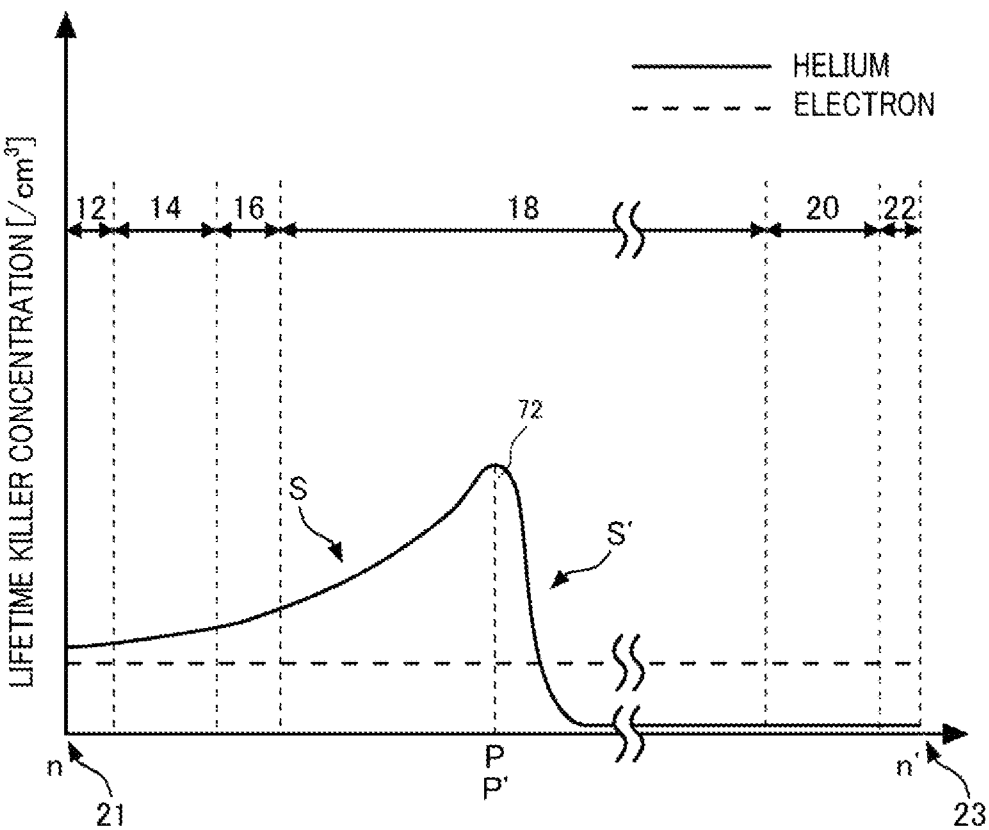
FIG. 4A shows a concentration distribution of lifetime killers along a line n-n' in FIG. 3.

FIG. 4A shows a concentration distribution of lifetime killers along a line n-n' in FIG. 3. In FIG. 4A, a horizontal axis indicates a depth from the upper surface 21. A position P is a peak position, in the depth direction of the lifetime killer concentration in the lifetime control region 72. The position P is the same as the position in the Z-axis direction of the symbol "x" in FIG. 3.

When the lifetime control region 72 is formed by irradiating, as the particle beam, helium from the upper surface 21, a concentration distribution of lifetime killers is as shown with a solid line. In this case, the concentration distribution of lifetime killers has a skirt S drawn from the position P toward the upper surface 21. Also, the concentration distribution of lifetime killers has a skirt S' drawn from the position P toward the lower surface 23. As described above, the lifetime control region 72 is formed by irradiating the particle beam from the upper surface 21. For this reason, the skirt S is gentler than the skirt S'. The skirt S may reach the upper surface 21 or may not reach the upper surface 21. Note that, when the lifetime control region 72 is formed by irradiating, as the particle beam, an electron beam, a concentration distribution of lifetime killers is as shown with a broken line. Since the electron beam has a high penetrating power, the concentration distribution of lifetime killers is substantially uniform from the upper surface 21 to the lower surface 23, regardless of whether the electron beam is irradiated from the upper surface 21 or the lower surface 23. In this case, an arbitrary position P' is represented as the lifetime control region 72 by the position of the symbol "x" in the Z-axis direction in FIG. 3. Even in the case where the lifetime control region 72 is formed by irradiating the electron beam, like the case where the lifetime control region 72 is formed by helium, when the threshold value of the transistor at which a channel is formed in the threshold value adjusting section 27 is preset to be higher than the threshold value of the transistor at which a channel is formed in the second region 13, it is possible to reduce a difference between the threshold value of the transistor in the boundary section 90 and the threshold value of the transistor in the transistor section 70 excluding the boundary section 90 after the particle beam passes through the base region 14 and the gate trench section 40 in the boundary section 90.

Figure 4B:
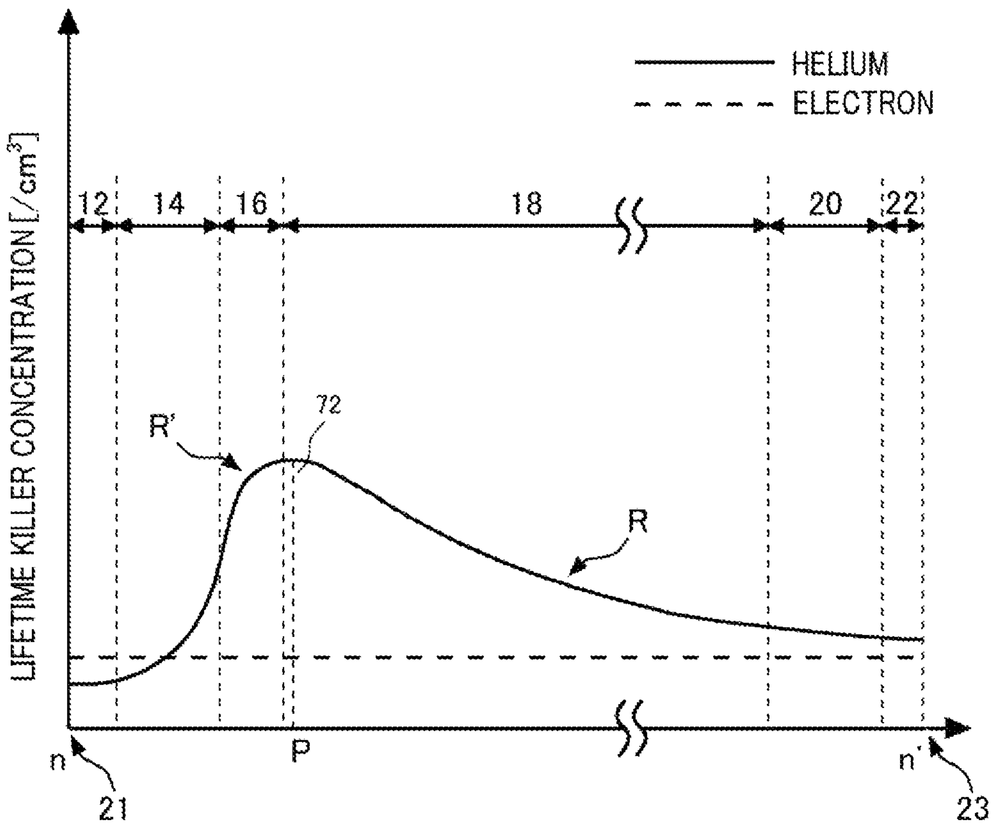
FIG. 4B shows another example of the concentration distribution of lifetime killers along the line n-n' in FIG. 3.

FIG. 4B shows another example of the concentration distribution of lifetime killers along the line n-n' in FIG. 3. The present example is different from FIG. 4A, in that the lifetime control region 72 is formed by irradiating, as the particle beam, helium from the lower surface 23. In this case, the concentration distribution of lifetime killers is as shown with a solid line. In this case, the concentration distribution of lifetime killers has a skirt R drawn from the position P toward the lower surface 23. Also, the concentration distribution of lifetime killers has a skirt R' drawn from the position P toward the upper surface 21. When the skirt R' extends over the base region 14 where a channel is formed and the gate trench section 40, the threshold value is lowered.

Like this, even in the case where the particle beam is irradiated from the lower surface 23-side, like the case where the lifetime control region 72 is formed by irradiating the particle beam from the upper surface 21, the threshold value of the transistor at which a channel is formed in the threshold value adjusting section 27 is preferably preset to be higher than the threshold value of the transistor at which a channel is formed in the second region 13. Thereby, it is possible to reduce a difference between the threshold value of the transistor in the boundary section 90 and the threshold value of the transistor in the transistor section 70 excluding the boundary section 90 after the particle beam passes through the base region 14 and the gate trench section 40 in the boundary section 90. Also in other forms to be described later, unless particularly mentioned, the example where the particle beam is irradiated from the upper surface 21 will be described. However, the irradiation of the particle beam from the lower surface 23-side can also be applied.

Figure 5A:
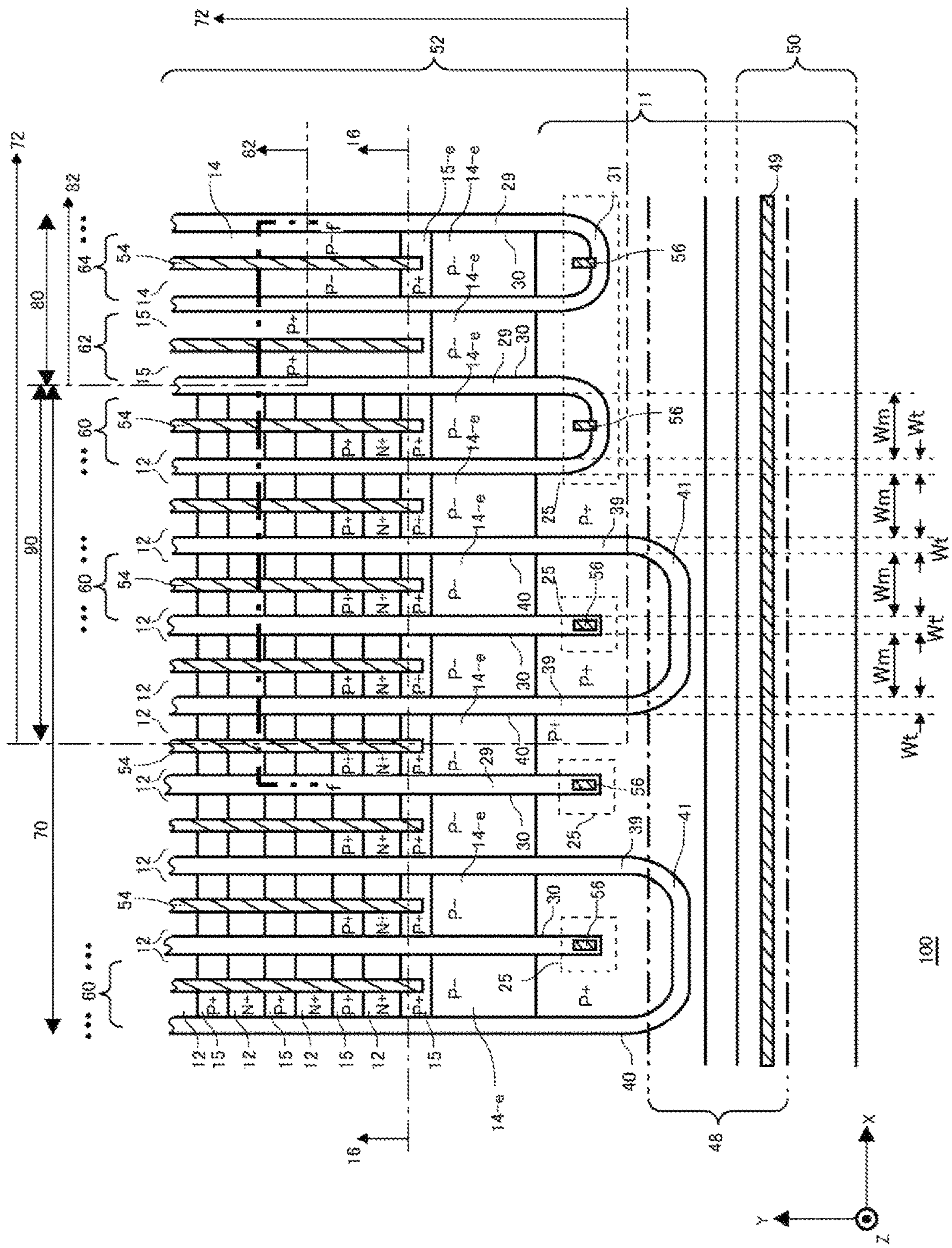
FIG. 5A partially shows another example of the upper surface of the semiconductor device 100.

FIG. 5A partially shows another example of the upper surface of the semiconductor device 100. The present example is different from the semiconductor device 100 shown in FIG. 1, in that the boundary of the lifetime control region 72 in the X-axis direction is located below the first mesa section 60. The other structures are the same as the example of FIG. 1.

Figure 5B:
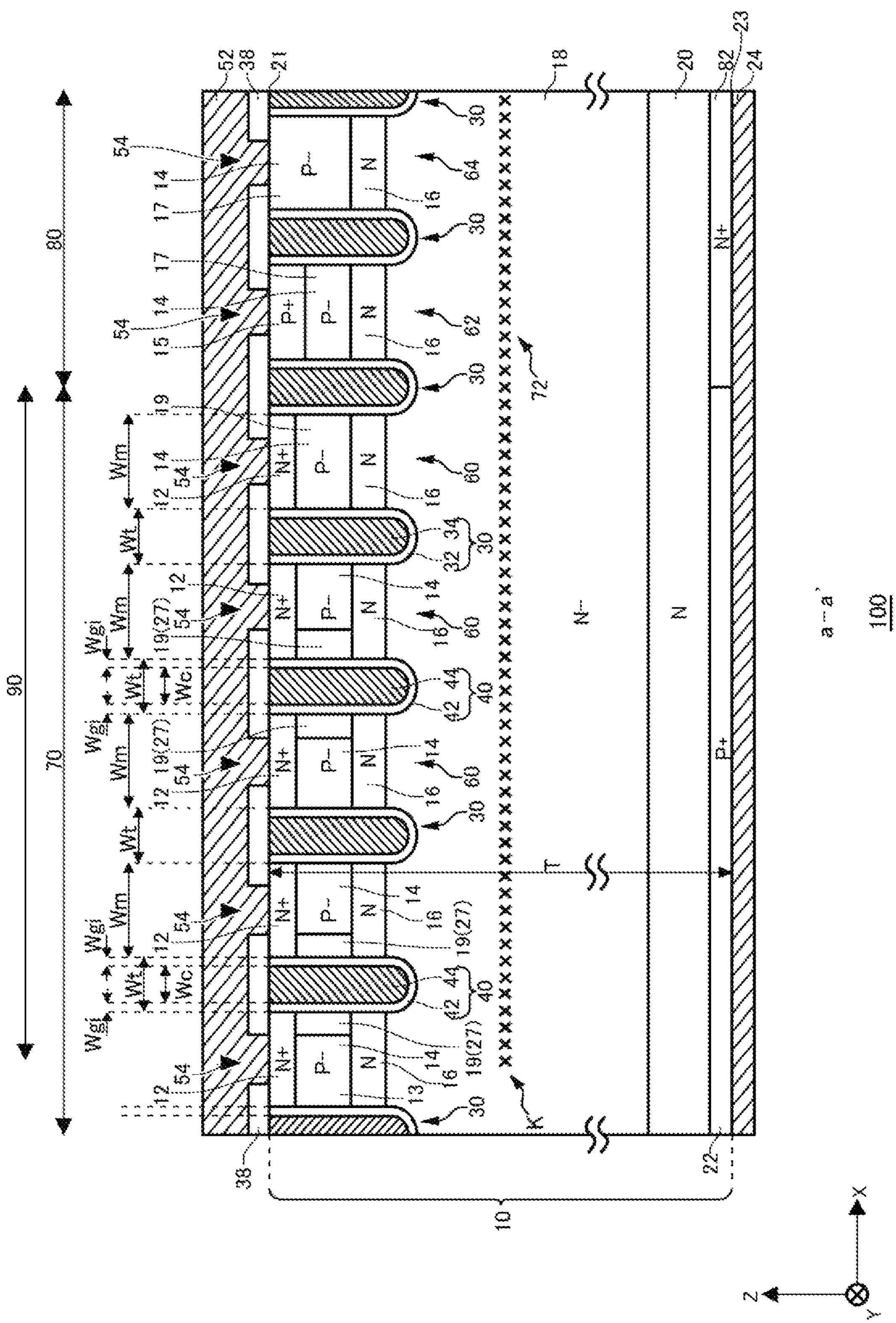
FIG. 5B shows an example of a cross-section f-f' in FIG. 5A.

FIG. 5B shows an example of a cross-section f-f' in FIG. 5A. The cross-section f-f' is a cross-section of a position corresponding to the cross-section a-a' in FIG. 2A and the like. In the present example, a boundary of the lifetime control region 72 in the X-axis direction overlaps the base region 14. A region of the base region 14 that overlaps the lifetime control region 72 and is in contact with the gate trench section 40 is provided with the threshold value adjusting section 27. The threshold value adjusting section 27 is a region in which the impurity concentration is higher than the second region 13. On the other hand, a region of the base region 14 that is in contact with a trench section (in the present example, the dummy trench section 30) not overlapping the lifetime control region 72 is provided with the second region 13. In the present example, the first mesa section 60, the second mesa section 62 and the third mesa section 64 have the same configurations as FIG. 2B but may have the same configurations as FIG. 2A. That is, the concentration in the base region 14 of each mesa section that does not overlap the boundary of the lifetime control region 72 in the X-axis direction may be equal in the vicinities of the trench sections on both sides.

Figure 6A:
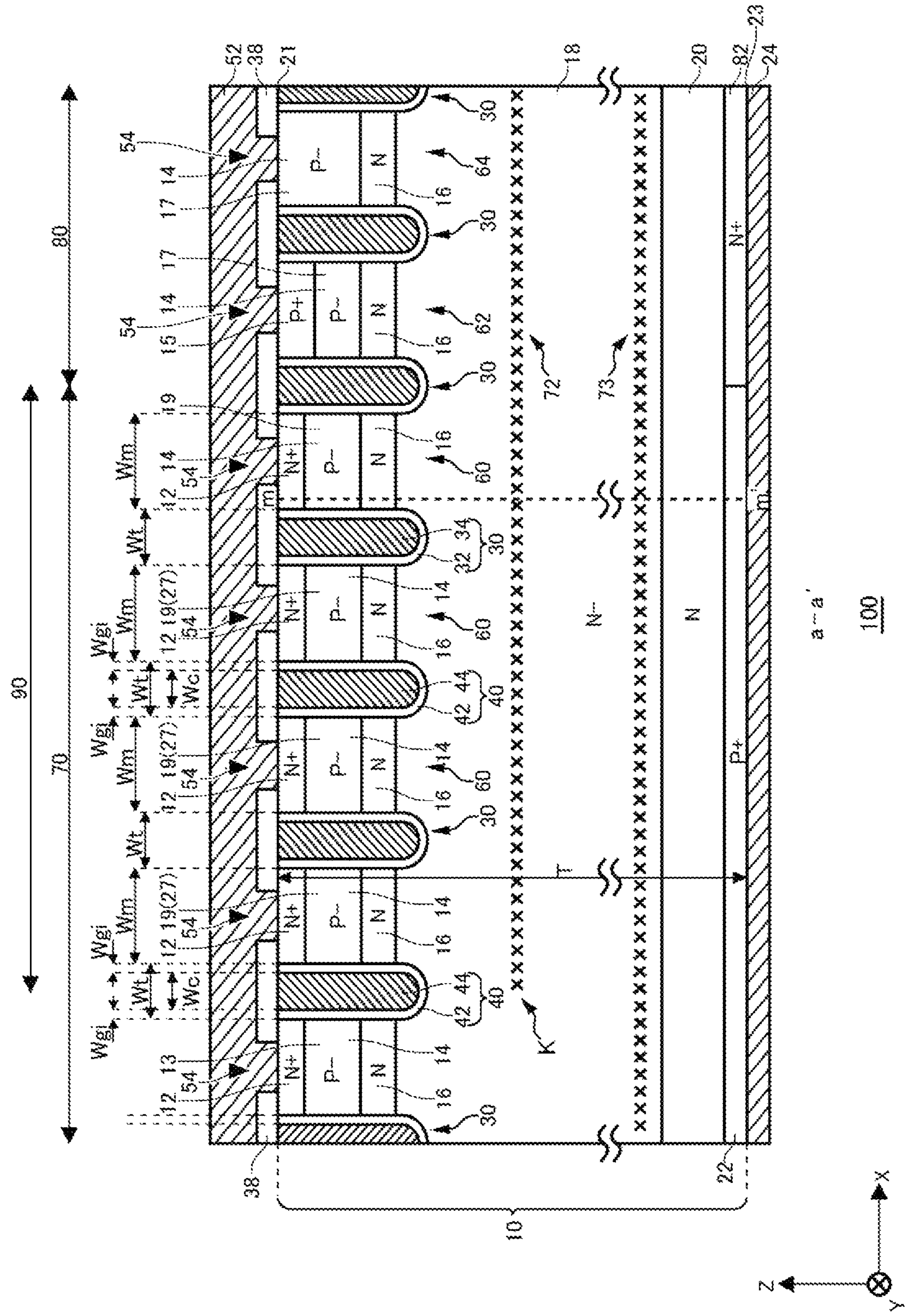
FIG. 6A shows another example of the cross-section a-a' in FIG. 1.

FIG. 6A shows another example of the cross-section a-a' in FIG. 1. The present example is different from the semiconductor device 100 shown in FIG. 2A or 2B, in that the drift region 18 is locally provided with a lifetime control region 73 including lifetime killers inside the semiconductor substrate 10, in addition to the lifetime control region 72. In FIG. 6A, peak positions, in the Z-axis direction, of a concentration distribution of lifetime killers relating to the lifetime control region 73 are indicated by the symbol "x".

In the present example, the lifetime control region 73 is provided at a position deeper than a half of the thickness T of the semiconductor substrate 10, based on the upper surface 21. The lifetime control region 73 may also be provided in the buffer region 20.

The lifetime control region 73 may have a plurality of peaks in the Z-axis direction of the concentration distribution of lifetime killers. In this case, peak concentrations at the peaks of the concentration distribution of lifetime killers may be different from each other.

The lifetime control region 73 may be provided over the entire transistor section 70 and diode section 80. The lifetime control region 73 may be provided continuously from the transistor section 70 to the diode section 80. The lifetime control region 73 may not be provided partially in the X-axis direction.

The lifetime control region 73 may be provided at a position shallower than the half of the thickness T. That is, the lifetime control region 72 and the lifetime control region 73 may be all provided at positions shallower than the half of the thickness T. Also, the lifetime control region 72 and the lifetime control region 73 may be all provided at positions deeper than the half of the thickness T. The lifetime control region 73 may be provided on the further upper surface 21-side than the lifetime control region 72. Also, the lifetime control region 73 may be provided at the same depth position as the lifetime control region 72.

The lifetime control region 73 may be formed by irradiating the particle beam from the lower surface 23. The lifetime killer relating to the lifetime control region 73 is, as an example, helium implanted to a predetermined depth position. The lifetime killer may also be hydrogen or electron beam implanted to a predetermined depth position. The lifetime control region 73 may be formed by irradiating the particle beam from the upper surface 21.

In the present example, the lifetime control region 73 is provided, in addition to the lifetime control region 72. For this reason, some of carriers drifting in the drift region 18 are likely to be recombined and disappear in both the lifetime control region 72 and the lifetime control region 73. For this reason, the semiconductor device 100 of the present example can adjust the lifetime of the carriers implanted from the lower surface 23 by adjusting the depth of the lifetime control region 73 from the lower surface 23.

Figure 6B:
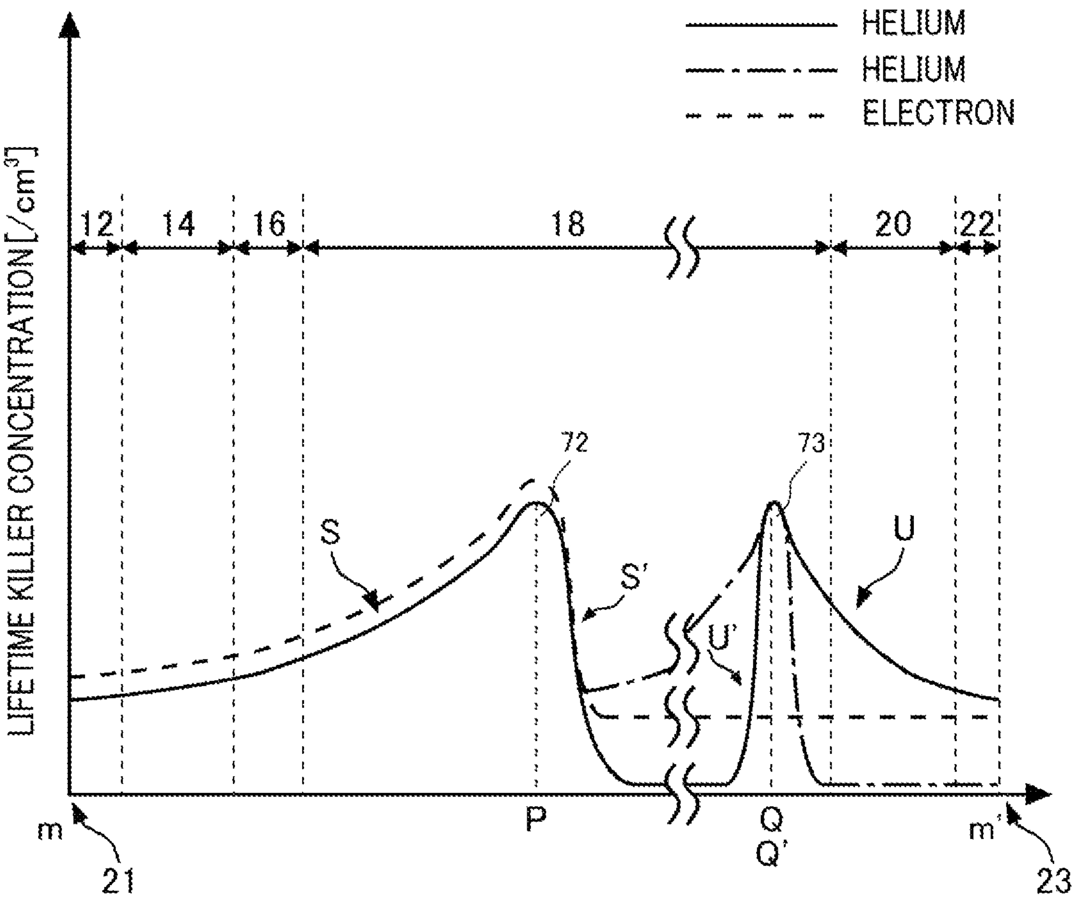
FIG. 6B shows a concentration distribution of lifetime killers along a line m-m' in FIG. 6A.

FIG. 6B shows a concentration distribution of lifetime killers along a line m-m' in FIG. 6A. In FIG. 6B, a horizontal axis indicates a depth from the upper surface 21. A position P is a peak position in the depth direction of the lifetime killer concentration in the lifetime control region 72. A position Q is a peak position in the depth direction of the lifetime killer concentration in the lifetime control region 73. The position P is the same as the position in the Z-axis direction of the symbol "x" on the upper surface 21-side in FIG. 6A. The position Q is the same as the position in the Z-axis direction of the symbol "x" on the lower surface 23-side in FIG. 6A.

The concentration distribution of lifetime killers relating to the lifetime control region 73 has a skirt U drawn from the position Q toward the lower surface 23. Also, the concentration distribution of lifetime killers has a skirt U" drawn from the position Q toward the upper surface 21. In the present example, the lifetime control region 73 is formed by irradiating the particle beam from the lower surface 23. For this reason, the skirt U is gentler than the skirt U'. The skirt U may reach the lower surface 23 or may not reach the lower surface 23. In the meantime, when the lifetime control region 73 is formed by irradiating helium from the upper surface, a concentration distribution of lifetime killers is as shown with a dashed-dotted line. In this case, since the lifetime control region 73 is formed in the entire transistor section 70, a threshold value of a region at which a channel is formed in the entire transistor section 70 may be lowered. Since the boundary section 90 has a different reduction width of the threshold value of the transistor by a magnitude of the formation of the lifetime control region 72, the contents described in the case where the lifetime control region 73 is formed by irradiating helium from the lower surface 23 also apply. In the meantime, when the lifetime control region 73 is formed by irradiating the electron beam, a concentration distribution of lifetime killers is as shown with a broken line. Since the electron beam has a high penetrating power, the concentration distribution of lifetime killers is substantially uniform from the upper surface 21 to the lower surface 23, regardless of whether the electron beam is irradiated from the upper surface 21 or the lower surface 23. In this case, an arbitrary position Q' is represented as the lifetime control region 73 by the position of the symbol "x" in the Z-axis direction in FIG. 6A. The contents described in the case where the lifetime control region 73 is formed by irradiating helium from the upper surface 21 also apply to the case where the lifetime control region 72 is formed by irradiating the electron beam.

Figure 6C:
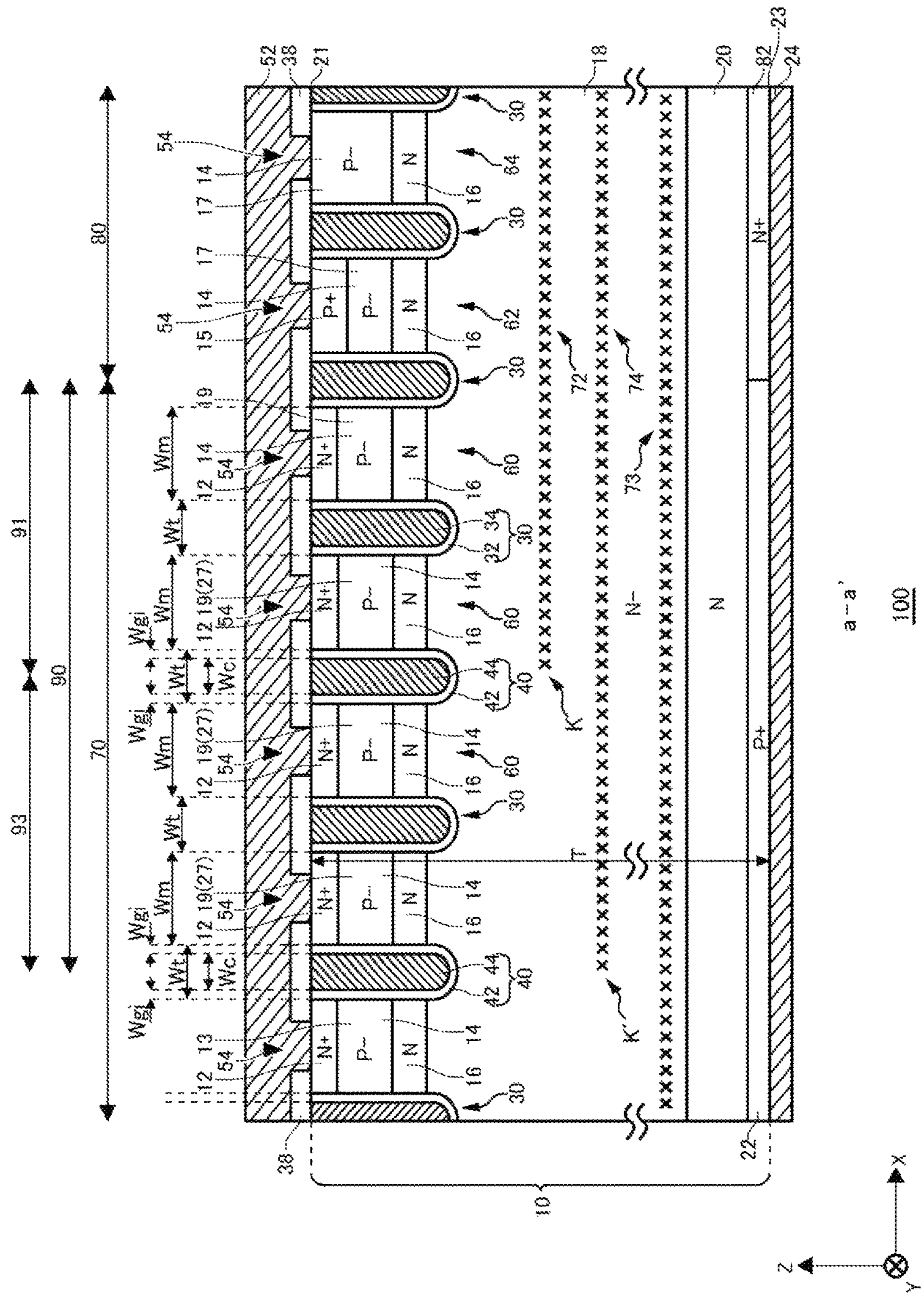
FIG. 6C shows another example of the cross-section a-a' in FIG. 1.

FIG. 6C shows another example of the cross-section a-a' in FIG. 1. The present example is different from the semiconductor device 100 shown in FIG. 6A, in that the drift region 18 is provided with a lifetime control region 74 including lifetime killers inside the semiconductor substrate 10, in addition to the lifetime control region 72 and the lifetime control region 73. In FIG. 6C, peak positions, in the Z-axis direction, of a concentration distribution of lifetime killers relating to the lifetime control region 74 are indicated by the symbol "x".

In the present example, the lifetime control region 74 is provided at a position deeper than the lifetime control region 72. Also, the lifetime control region 74 may be provided at a position shallower than the lifetime control region 72 or at the same depth as the lifetime control region 72. Also, the lifetime control region 74 may have a plurality of peaks in the Z-axis direction of the concentration distribution of lifetime killers. In this case, peak concentrations at the peaks of the concentration distribution of lifetime killers may be different from each other.

The lifetime control region 74 is provided in a part of the transistor section 70 and in the entire diode section 80. The lifetime control region 74 may be provided continuously from the transistor section 70 to the diode section 80. The lifetime control region 74 may be provided partially in a range wider than the lifetime control region 72 in the X-axis direction. In the present example, an end portion K' of the lifetime control region 74 may be provided on a further negative side of the X-axis than the end portion K of the lifetime control region 72. Specifically, the lifetime control region 74 is provided in the boundary section 90 and the diode section 80, and the lifetime control region 72 is provided in a boundary section 91, which is a part of the boundary section 90, and in the diode section 80.

The lifetime control region 74 is formed by irradiating the particle beam from the upper surface 21. The lifetime killer relating to the lifetime control region 74 is, as an example, helium implanted to a predetermined depth position. The lifetime killer may also be hydrogen or electron beam implanted to a predetermined depth position. The lifetime control region 74 may be formed by irradiating the particle beam from the lower surface 23. In the meantime, for example, when the lifetime control region 72, the lifetime control region 73 and the lifetime control region 74 are formed by irradiating helium from the upper surface 21, the concentration distribution of lifetime killers of each of the lifetime control region 72, the lifetime control region 73 and the lifetime control region 74 has a peak, and the peak becomes higher toward a side closer to the upper surface.

In the present example, the lifetime control region 74 is provided, in addition to the lifetime control region 72 and the lifetime control region 73. For this reason, some of carriers drifting in the drift region 18 are likely to be recombined and disappear in the lifetime control region 72, the lifetime control region 73 and the lifetime control region 74.

In the present example, in the boundary section 90, the reduction in threshold value of the transistor in the region in which a channel is formed is different between the boundary section 91 in which the lifetime control region 72 and the lifetime control region 74 are formed and a boundary section 93 in which the boundary section 91 is excluded from the boundary section 90 in which the lifetime control region 74 is formed. For this reason, the threshold value of the transistor is designed in advance to be different between the threshold value adjusting section 27 of the boundary section 91 and the threshold value adjusting section 27 of the boundary section 93, and the threshold value of the transistor in the boundary section 91 and the boundary section 93 is made to be the same as the threshold value of the transistor section 70 excluding the boundary section 90 after the lifetime control region 72 and the lifetime control region 74 are formed. In this way, the instability of the operation of the transistor section 70 due to the difference in threshold values of the transistor sections 70 can be suppressed.

In the present example, in the boundary section 90, the threshold value of the threshold value adjusting section 27 is adjusted to two aspects, in accordance with the lifetime control region 72 and the lifetime control region 74. However, also in a lifetime control region of another form, a plurality of threshold values of the transistor of the threshold value adjusting section 27 before the irradiation of the particle beam may be designed in accordance with a degree of an influence of the particle beam irradiation on places in which the respective channels are formed. By doing so, the threshold value of the transistor of the boundary section 90 after the formation of the lifetime control region can be made to be the same as the threshold value of the transistor section 70 excluding the boundary section 90.

Figure 7:
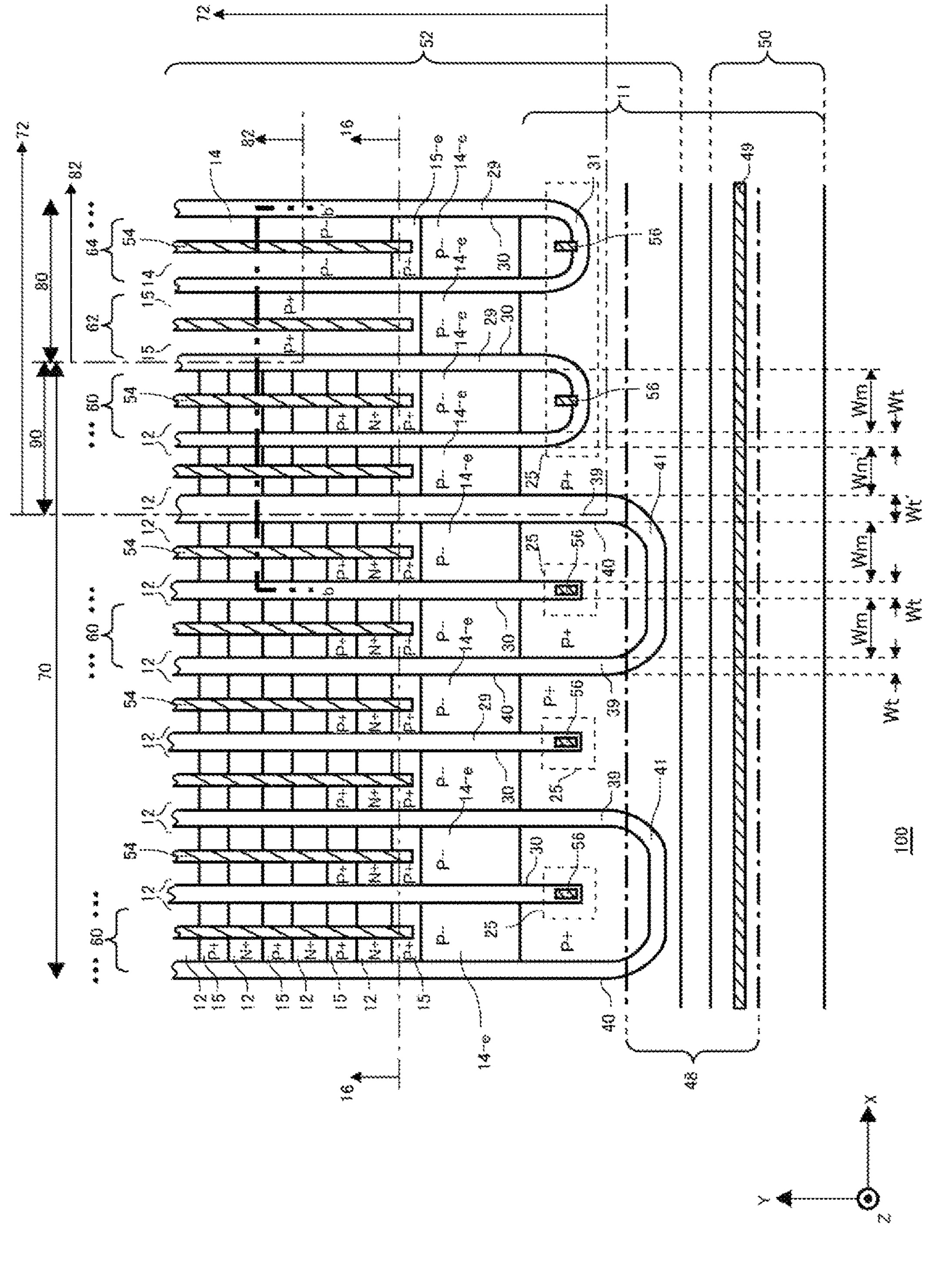
FIG. 7 partially shows another example of the upper surface of the semiconductor device 100 in accordance with one embodiment of the present invention.

FIG. 7 partially shows another example of the upper surface of the semiconductor device 100 in accordance with one embodiment of the present invention. In the present example, the gate trench section 40 is provided above an end portion of the lifetime control region 72 on the negative side of the X-axis. A width Wt' is a width of the gate trench section 40 in the X-axis direction. The present example is different from the example of FIG. 1, in that the width Wt' is greater than the width Wt. Also, the present example is different from the semiconductor device 100 of FIG. 1, in that the first region 19 does not include the threshold value adjusting section 27.

A width Wm' is a width in the X-axis direction between the gate trench section 40 having the width Wt' and the dummy trench section 30 adjacent to the gate trench section 40 on the positive side of the X-axis, in the boundary section 90. The width Wm' is smaller than the width Wm.

Figure 8:
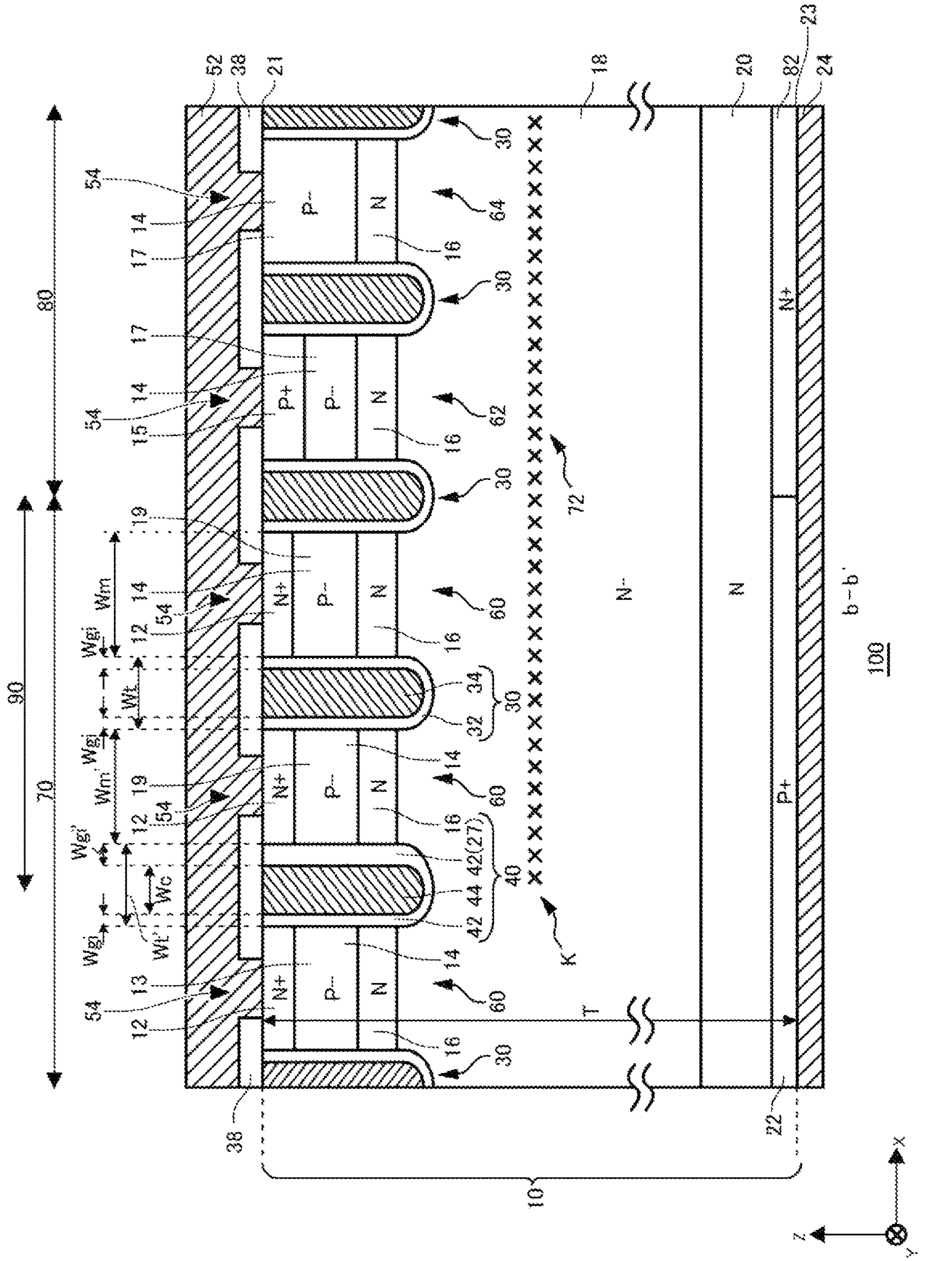
FIG. 8 shows an example of a cross-section b-b' in FIG. 7.

FIG. 8 shows an example of a cross-section b-b' in FIG. 7. The cross-section b-b' is an XZ plane passing the emitter region 12, the contact region 15 and base region 14, and the gate trench section 40 and dummy trench section 30.

In the present example, the gate insulating film 42 includes the threshold value adjusting section 27 provided in contact with the first region 19. A width Wgi' is a width of the threshold value adjusting section 27 in the arrangement direction (X-axis direction). The width Wgi' is greater than the width Wgi of the gate insulating film 42 in contact with the second region 13. The width Wgi' may be greater than or equal to 1.1 times the width Wgi.

In the present example, the width in the X-axis direction of the gate conductive section 44 of the gate trench section 40 of the boundary section 90 is equal to the width Wc. In the present example, since the width Wgi' is greater than the width Wgi, the width Wt' is greater than the width Wt. In the present example, the width Wt' is equal to a sum of the width Wc, the width Wgi and the width Wgi'.

In the present example, a sum of the width Wgi' and the width Wm' is equal to a sum of the width Wgi and the width Wm. The mesa width Wm' is smaller than the mesa width Wm by a difference between the width Wgi' and the width Wgi. In the present example, a trench pitch between two adjacent trenches in the X-axis direction is the same between any trenches.

As described above with reference to FIG. 3, in the boundary section 90, the lifetime control region 72 is formed by irradiating the particle beam from the upper surface 21. In the boundary section 90, the particle beam passes through the base region 14 and the gate trench section 40. Therefore, an interface state of a region in which a channel is formed in the base region 14 may change. For this reason, the threshold value of the transistor section 70 may be lowered.

In the transistor section 70 of the semiconductor device 100 of the present example, the threshold value adjusting section 27 for adjusting the threshold value of the transistor section 70 is provided overlapping the lifetime control region 72, as seen from above. In the present example, the gate insulating film 42 provided for the gate trench section 40 in the transistor section 70 includes the threshold value adjusting section 27.

The threshold value adjusting section 27 is provided in contact with the first region 19. In the present example, the doping concentration in the first region 19 may be equal to the doping concentration in the second region 13.

The threshold value of the transistor section 70 tends to increase as the thickness of the gate insulating film 42 increases. In the present example, the width Wgi' of the threshold value adjusting section 27 is greater than the width Wgi of the gate insulating film 42. For this reason, before the irradiation of the particle beam, the threshold value of the transistor to which the threshold value adjusting section 27 is provided is set to be higher than the threshold value of the transistor to which the threshold value adjusting section 27 is not provided.

After the particle beam passes through the base region 14 and the gate trench section 40 in the boundary section 90, the threshold value of the transistor may be lowered, as described above.

In the present example, in the boundary section 90 to which the particle beam is irradiated, the threshold value of the transistor is set high in advance. For this reason, even when the threshold value of the transistor in the boundary section 90 is lowered due to the irradiation of the particle beam, a difference between the threshold value of the transistor in the boundary section 90 and the threshold value of the transistor in the transistor section 70 excluding the boundary section 90 can be reduced. Specifically, the threshold value adjusting section 27 is preferably formed to have a large width Wgi' so that after the particle beam passes through the base region 14 and the gate trench section 40 in the boundary section 90, the threshold value of the transistor in the boundary section 90 coincides with the threshold value of the transistor in the transistor section 70 excluding the boundary section 90. For this reason, it is possible to suppress instability of the operation of the transistor section 70 due to the difference in threshold values of the transistor sections 70.

As shown in FIG. 8, in one gate trench section 40, the threshold value adjusting section 27 may be provided in contact with the first region 19 on one side (positive side of the X-axis) of the gate trench section 40 in the arrangement direction (X-axis direction), and the gate insulating film 42 may be provided in contact with the second region 13 on the other side (negative side of the X-axis) of the gate trench section 40. That is, in one gate trench section 40, the gate insulating film 42 having the width Wgi and the threshold value adjusting section 27 having the width Wgi' may be provided on both sides of the gate conductive section 44 in the X-axis direction. In the present example, the negative side of the X-axis of the gate conductive section 44 does not overlap the lifetime control region 72, as seen from above. For this reason, the threshold value adjusting section 27 may not be provided on the negative side of the X-axis of the gate conductive section 44.

In the boundary section 90, the first region 19 may be in contact with both the gate trench section 40 and the dummy trench section 30 and provided therebetween. The dummy insulating film 32 of the dummy trench section 30 may be provided in contact with the first region 19 on one side (positive side of the X-axis) of the first region 19 in the arrangement direction (X-axis direction). Also, the threshold value adjusting section 27 of the gate trench section 40 may be provided in contact with the first region 19 on the other side (negative side of the X-axis) of the first region 19.

A width of the dummy insulating film 32 may be equal to the width Wgi. The width Wgi' of the threshold value adjusting insulating film may be greater than the width of the dummy insulating film 32. In the transistor section 70, a channel is not formed in the vicinity of the sidewall of the dummy trench section 30 in the base region 14 facing the dummy trench section 30 in the X-axis direction. For this reason, it is not necessary to adjust the threshold value of the transistor section 70 in the vicinity of the sidewall of the dummy trench section 30. For this reason, the width of the dummy insulating film 32 may be smaller than the width Wgi' of the threshold value adjusting insulating film and may be equal to the width Wgi.

In the boundary section 90 of the semiconductor device 100 of the present example, the lifetime control region 72 is locally provided on the upper surface 21-side inside the semiconductor substrate 10. For this reason, while the diode section 80 operates, a drift amount of holes from the base region 14 of the boundary section 90 to the cathode region 82 can be reduced. For this reason, the reverse recovery loss of the diode section 80 can be reduced.

In the semiconductor device 100 of the present example, the threshold value adjusting section 27 is provided in the gate trench section 40 of the boundary section 90. Therefore, it is possible to suppress a difference in threshold value of the transistor section 70 while providing the lifetime control region 72. That is, the semiconductor device 100 of the present example can suppress the instability of the operation of the transistor section 70 while reducing the reverse recovery loss of the diode section 80.

Figure 9:
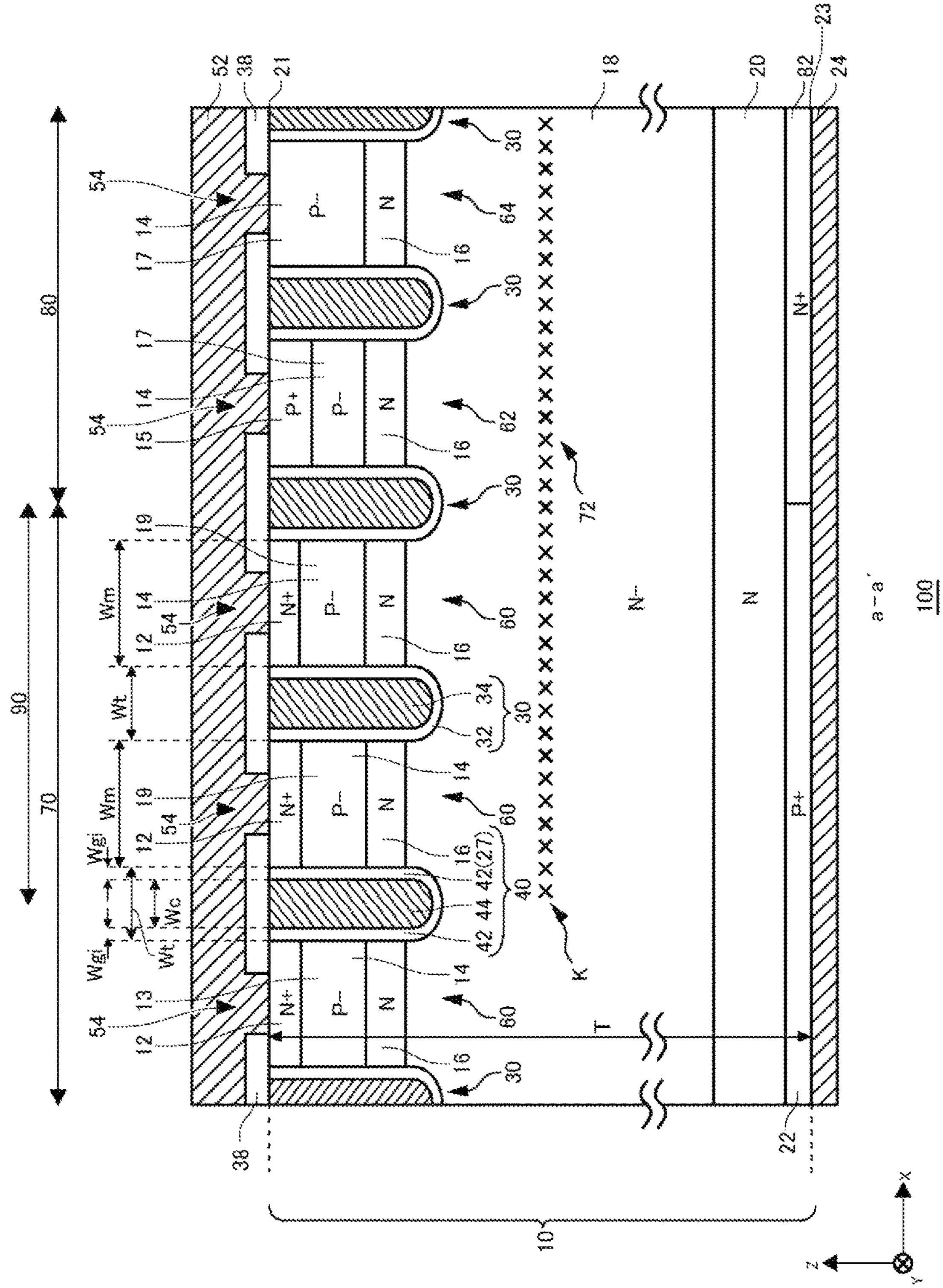
FIG. 9 shows another example of the cross-section a-a' in FIG. 1.

FIG. 9 shows another example of the cross-section a-a' in FIG. 1. The semiconductor device 100 of the present example is different from the semiconductor device shown in FIG. 2A or 2B, in that a dielectric constant of the threshold value adjusting section 27 is lower than a dielectric constant of the gate insulating film 42 excluding the threshold value adjusting section 27. Also, the semiconductor device 100 of the present example is different from the semiconductor device 100 of FIG. 2A or 2B, in that the first region 19 does not include the threshold value adjusting section 27. In the present example, the width of the threshold value adjusting section 27 may be equal to the width Wgi. A dielectric constant of the threshold value adjusting section 27 may be less than or equal to 0.9 times a dielectric constant of the gate insulating film 42 excluding the threshold value adjusting section 27.

The dielectric constant of the threshold value adjusting section 27 may be set lower than the dielectric constant of the gate insulating film 42 by making a chemical composition of the threshold value adjusting section 27 different from a chemical composition of the gate insulating film 42 excluding the threshold value adjusting section 27. The dielectric constant of the threshold value adjusting section 27 may be set lower than the dielectric constant of the gate insulating film 42 by forming the threshold value adjusting section 27 in a process different from a process of forming the gate insulating film 42 excluding the threshold value adjusting section 27, in a process of oxidizing or nitriding the semiconductor of the inner wall of the gate trench. Also, the dielectric constant of the threshold value adjusting section 27 may be set lower than the dielectric constant of the gate insulating film 42 by making a form of the threshold value adjusting section 27 different from a composition of the gate insulating film 42 in a thickness direction (X-axis direction) of the gate insulating film 42 excluding the threshold value adjusting section 27. The chemical composition or form of the threshold value adjusting section 27 may be changed entirely or partially in the thickness direction (X-axis direction).

The dielectric constant of the threshold value adjusting section 27 is set lower than the dielectric constant of the gate insulating film 42 excluding the threshold value adjusting section 27, so that the threshold value of the transistor to which the threshold value adjusting section 27 is provided is set to be higher than the threshold value of the transistor to which the threshold value adjusting section 27 is not provided. For this reason, the semiconductor device 100 having the transistor to which the threshold value adjusting section 27 is provided can suppress a difference in threshold value of the transistor section 70 while providing the lifetime control region 72. Specifically, the dielectric constant of the threshold value adjusting section 27 is preferably set lower than the dielectric constant of the gate insulating film 42 excluding the threshold value adjusting section 27 so that after the particle beam passes through the base region 14 and the gate trench section 40 in the boundary section 90, the threshold value of the transistor in the boundary section 90 coincides with the threshold value of the transistor in the transistor section 70 excluding the boundary section 90. That is, the semiconductor device 100 can suppress the instability of the operation of the transistor section 70 while reducing the reverse recovery loss of the diode section 80.

Figure 10:
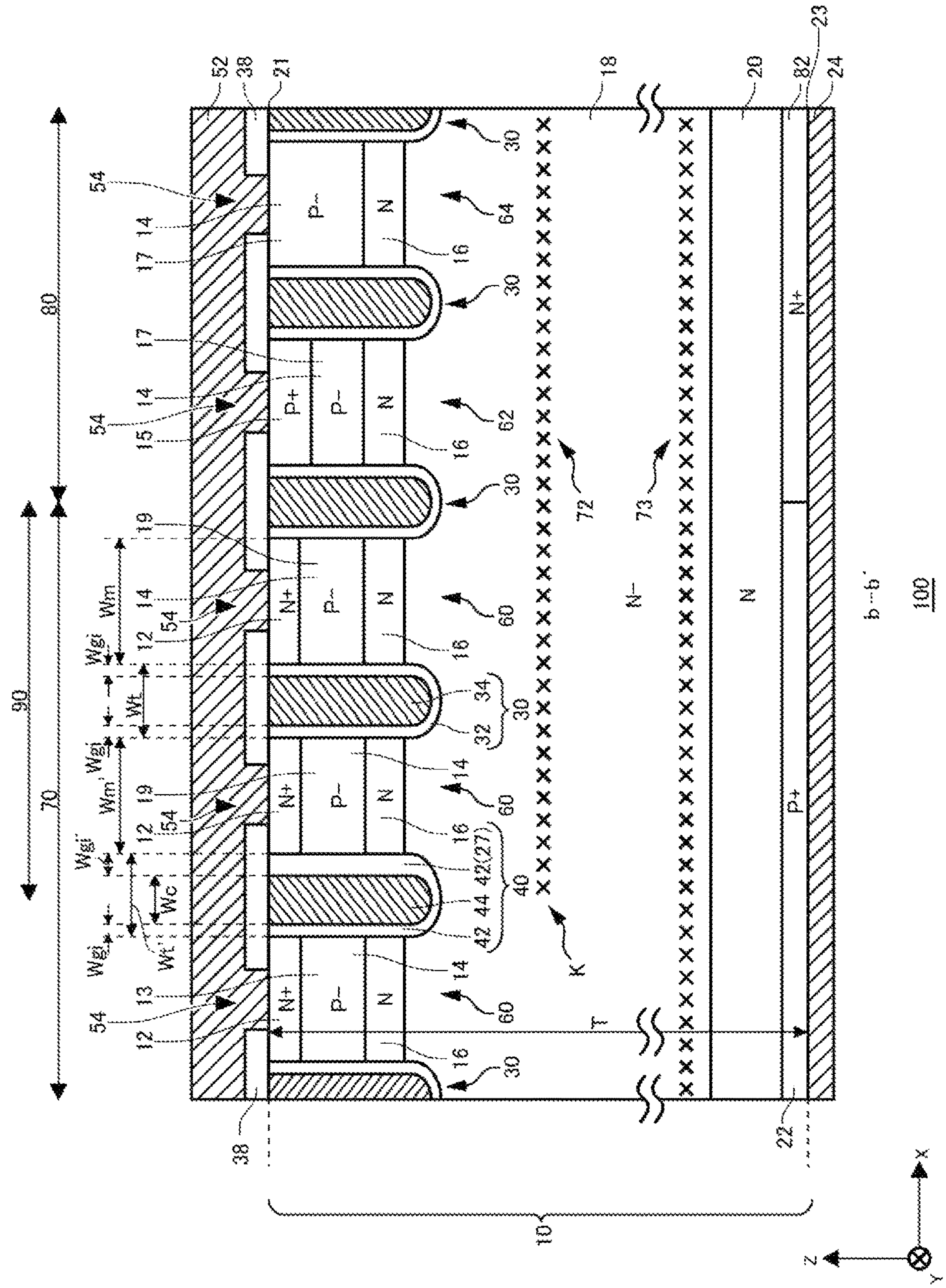
FIG. 10 shows another example of the cross-section b-b' in FIG. 7.

FIG. 10 shows another example of the cross-section b-b' in FIG. 7. The present example is different from the semiconductor device 100 shown in FIG. 8, in that the drift region 18 is locally provided with the lifetime control region 73 inside the semiconductor substrate 10, in addition to the lifetime control region 72. In FIG. 10, peak positions, in the Z-axis direction, of the concentration distribution of lifetime killers relating to the lifetime control region 73 are indicated by the symbol "x".

In the present example, the lifetime control region 73 is provided at a position deeper than a half of the thickness T of the semiconductor substrate 10, based on the upper surface 21. The lifetime control region 73 may be provided in the buffer region 20.

The lifetime control region 73 may have a plurality of peaks in the Z-axis direction of the concentration distribution of lifetime killers. In this case, peak concentrations at the peaks of the concentration distribution of lifetime killers may be different from each other.

The lifetime control region 73 may be provided in the entire transistor section 70 and diode section 80. The lifetime control region 73 may be provided continuously from the transistor section 70 to the diode section 80. The lifetime control region 73 may not be provided partially in the X-axis direction.

The lifetime control region 73 may be provided at a position shallower than the half of the thickness T. That is, the lifetime control region 72 and the lifetime control region 73 may be all provided at positions shallower than the half of the thickness T. Also, the lifetime control region 72 and the lifetime control region 73 may be all provided at positions deeper than the half of the thickness T. The lifetime control region 73 may be provided on the further upper surface 21-side than the lifetime control region 72.

The lifetime control region 73 may be formed by irradiating the particle beam from the lower surface 23. The lifetime killer relating to the lifetime control region 73 is, as an example, helium implanted to a predetermined depth position. The lifetime killer may also be hydrogen or electron beam implanted to a predetermined depth position. The lifetime control region 73 may be formed by irradiating the particle beam from the upper surface 21.

In the present example, since the lifetime control region 73 is provided, in addition to the lifetime control region 72, some of carriers drifting in the drift region 18 are likely to be recombined and disappear in both the lifetime control region 72 and the lifetime control region 73. For this reason, the semiconductor device 100 of the present example can adjust the lifetime of the carriers implanted from the lower surface 23 by adjusting the depth of the lifetime control region 73 from the lower surface 23.

Figure 11A:
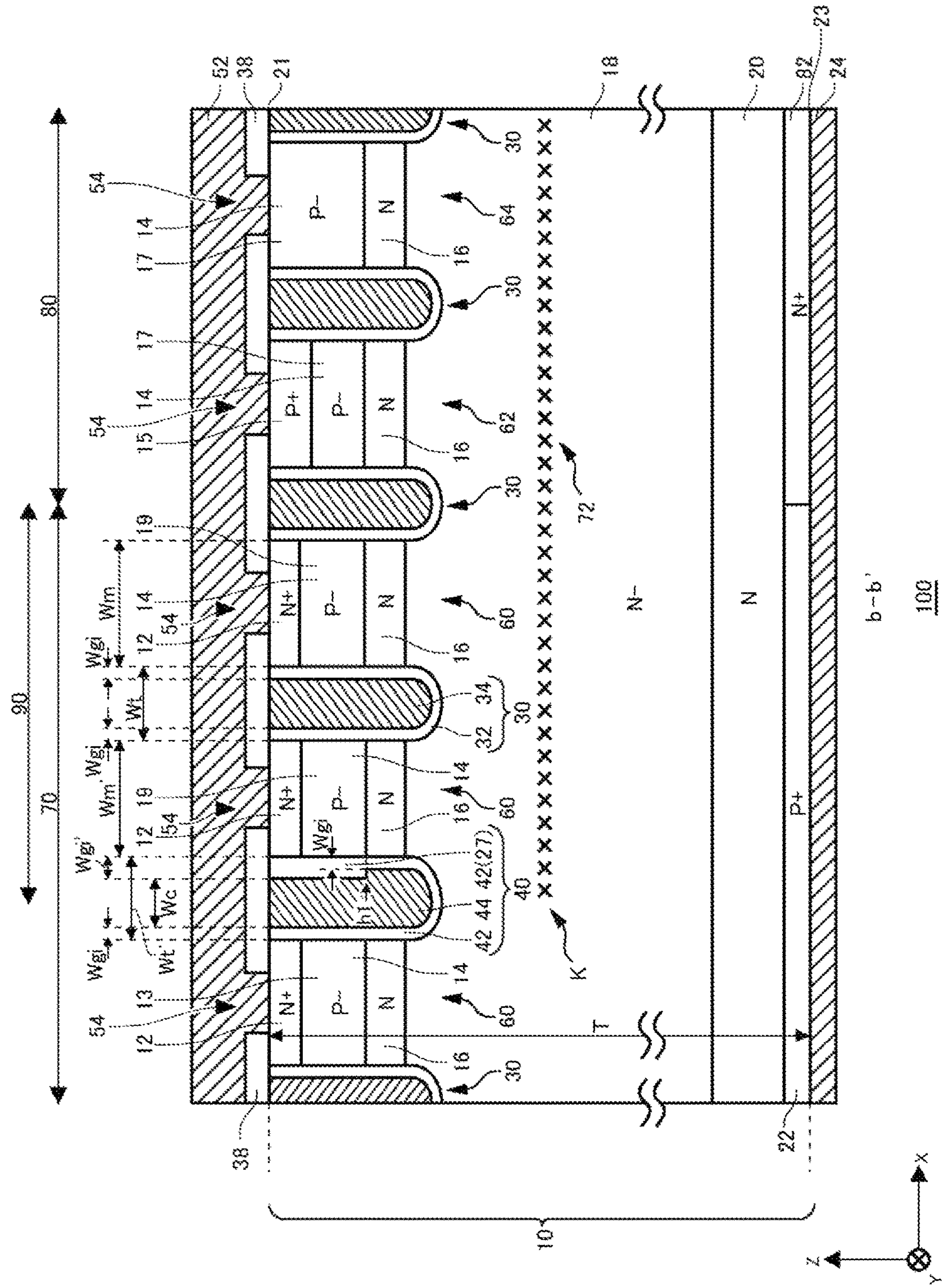
FIG. 11A shows another example of a threshold value adjusting section 27 in FIG. 8.

FIG. 11A shows another example of the threshold value adjusting section 27 in FIG. 8. The present example is different from the semiconductor device 100 of FIG. 8, in that the gate insulating film 42 includes locally the threshold value adjusting section 27 in the Z-axis direction, which is provided in contact with the first region 19, i.e., is a partial thick film.

In the present example, the gate trench section 40 in contact with the first region 19 is configured so that the upper gate insulating film 42 including a part facing the first region 19 is relatively thick and the lower gate insulating film 42 is relatively thin on the basis of a position hl as a boundary. That is, the gate insulating film 42 is formed relatively thick, so that the threshold value adjusting section 27 is formed. In the meantime, a width of the threshold value adjusting section 27 in the X-axis direction is the width Wgi'. A width in the X-axis direction of the gate insulating film 42 below the threshold value adjusting section 27 may be equal to the width Wgi.

Figure 11B:
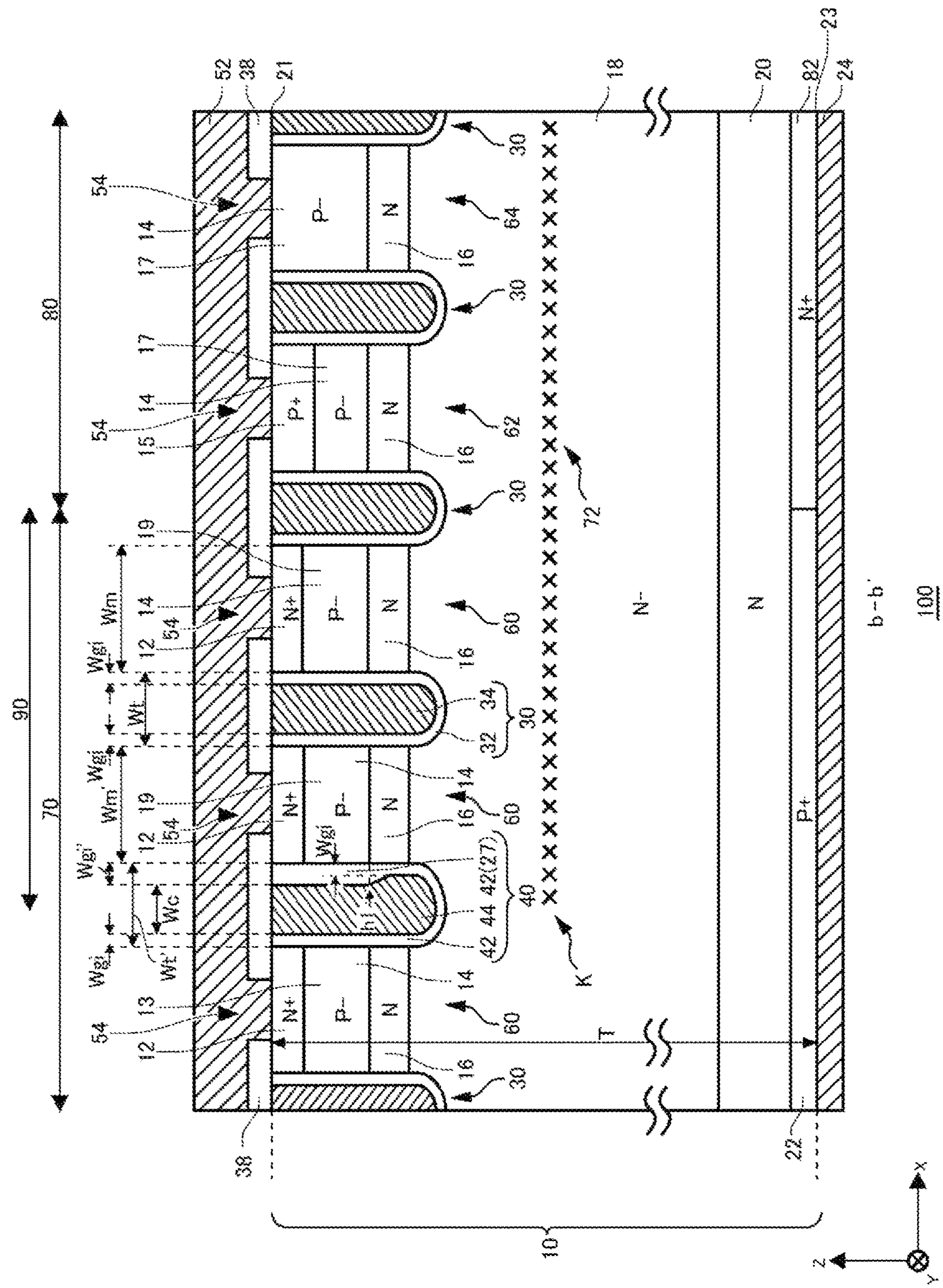
FIG. 11B shows another example of the threshold value adjusting section 27 in FIG. 8.

FIG. 11B shows another example of the threshold value adjusting section 27 in FIG. 8. In the present example, the gate insulating film 42 has a predetermined gradient in the depth direction on the basis of the position hl as a boundary. The present example is an example where the gate insulating film 42 includes locally the threshold value adjusting section 27 in the Z-axis direction, which is provided in contact with the first region 19, above the position hl.

Figure 11C:
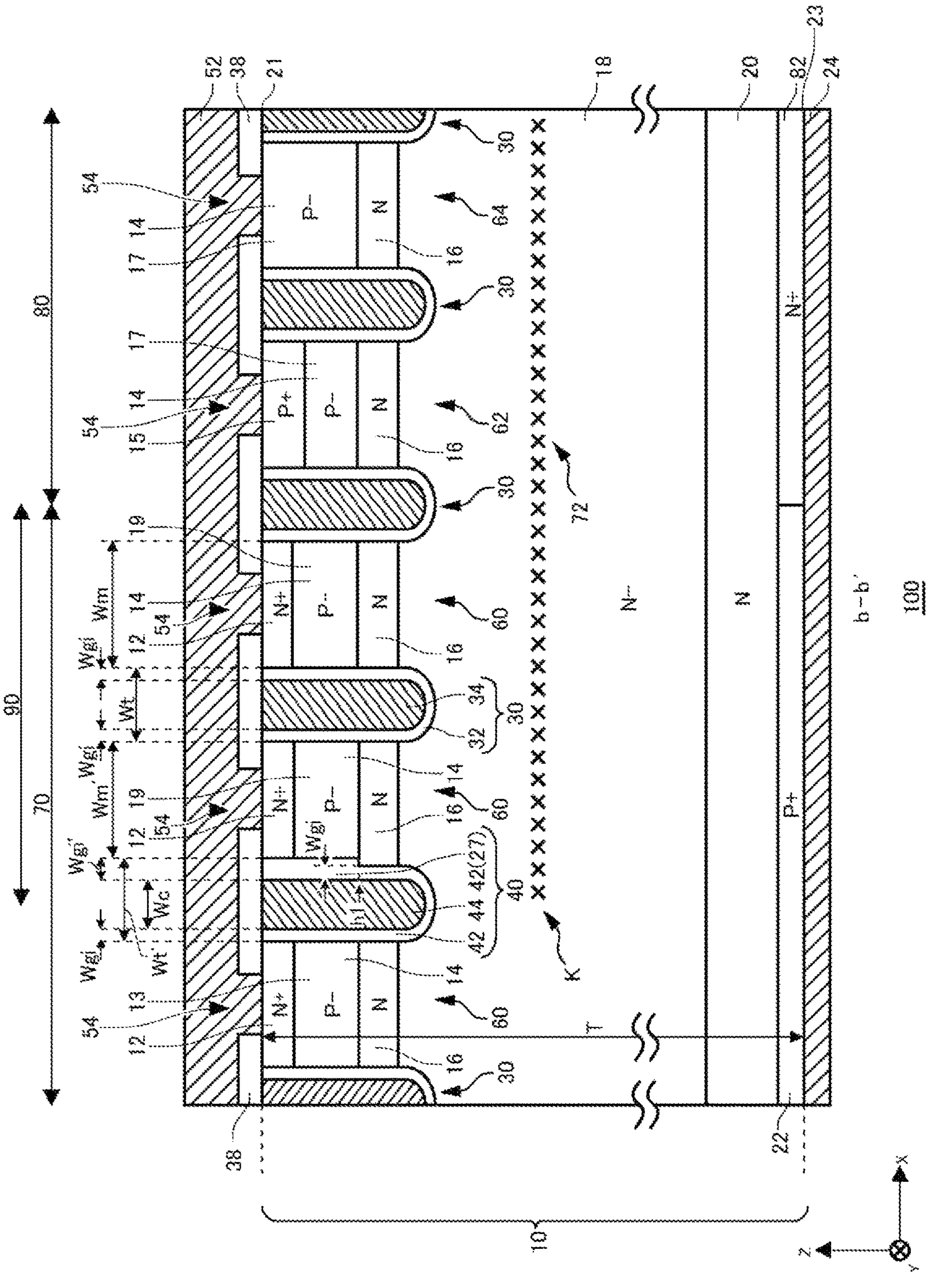
FIG. 11C shows another example of the threshold value adjusting section 27 in FIG. 8.

FIG. 11C shows another example of the threshold value adjusting section 27 in FIG. 8. In the present example, the gate insulating film 42 protrudes toward the first region 19 on the basis of the position hl as a boundary. The present example is also an example where the gate insulating film 42 includes locally the threshold value adjusting section 27 in the Z-axis direction, which is provided in contact with the first region 19, above the position hl.

Figure 11D:
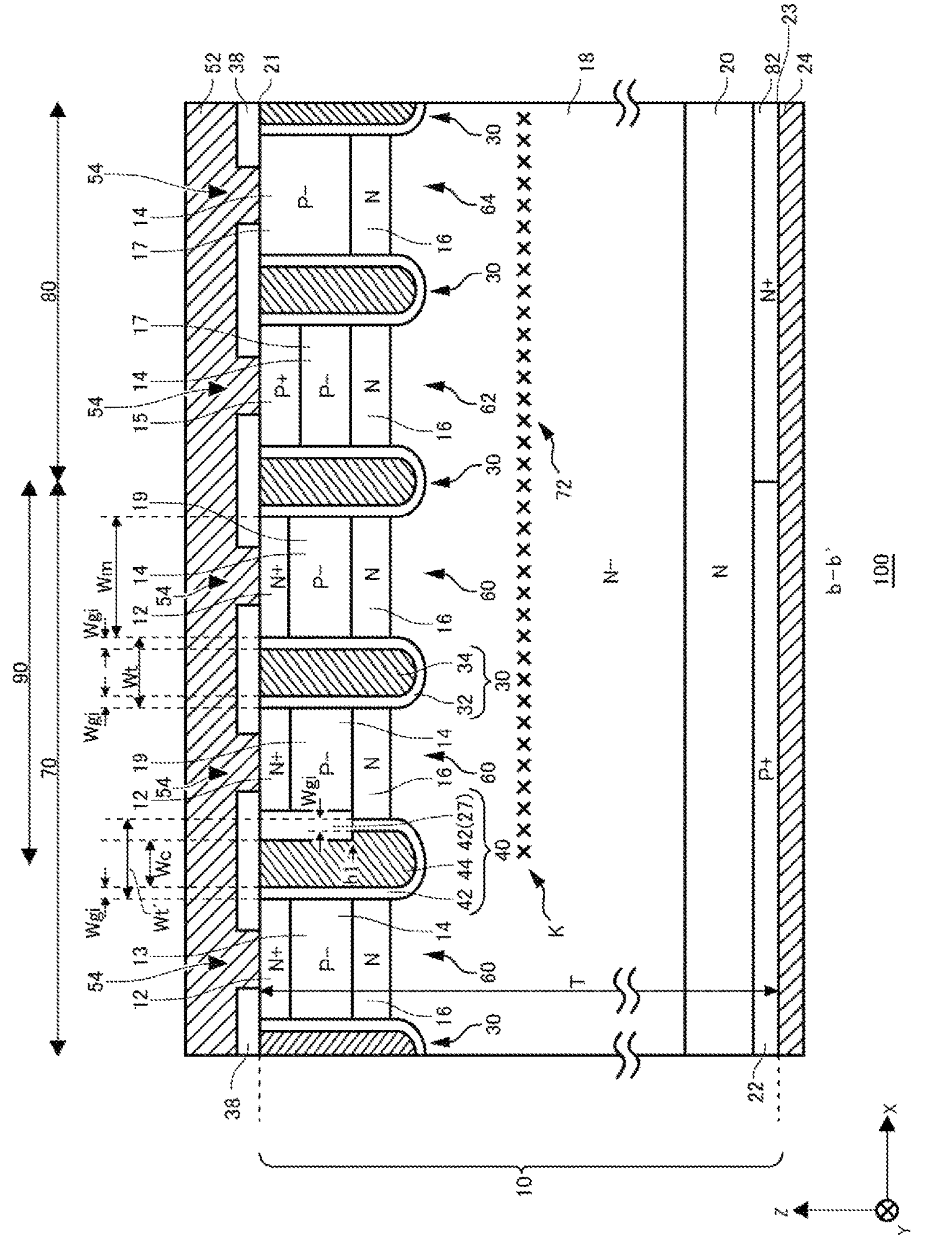
FIG. 11D shows another example of the threshold value adjusting section 27 in FIG. 8.

FIG. 11D shows another example of the threshold value adjusting section 27 in FIG. 8. In the present example, the gate conductive section 44 is recessed toward an opposite side to the first region 19 above the position hl, and the gate insulating film 42 protrudes stepwise toward the first region 19 on the basis of the position hl as a boundary. The present example is also an example where the gate insulating film 42 includes locally the threshold value adjusting section 27 in the Z-axis direction, which is provided in contact with the first region 19, above the position hl.

Figure 12:
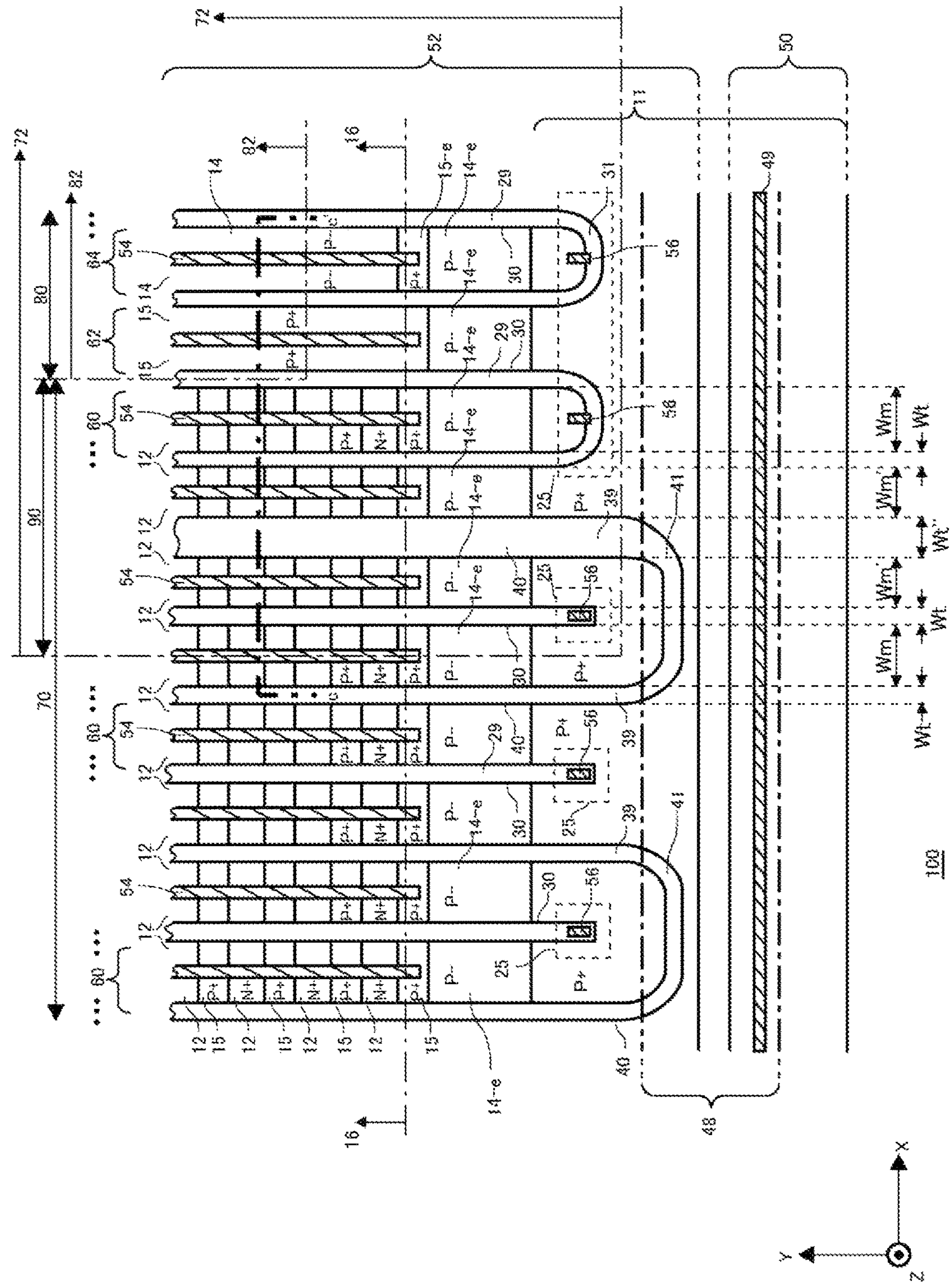
FIG. 12 partially shows another example of the upper surface of the semiconductor device 100 in accordance with one embodiment of the present invention.

FIG. 12 partially shows another example of the upper surface of the semiconductor device 100 in accordance with one embodiment of the present invention. The semiconductor device 100 of the present example is different from the semiconductor device 100 of FIG. 7, in that an end portion of the lifetime control region 72 on the negative side of the X-axis is arranged below the first mesa section 60. In the present example, one of the two U-shaped gate trench sections 40 arranged closest to the diode section 80 is arranged in the boundary section 90 and the other is arranged in the transistor section 70 excluding the boundary section 90. In the present example, an end portion of the lifetime control region 72 on the negative side of the X-axis is arranged below the first mesa section 60 sandwiched between the dummy trench section 30 arranged at a center of the two gate trench sections 40 in the X-axis direction and the other gate trench section 40. The end portion may be provided below the contact hole 54 provided above the first mesa section 60.

In the present example, a width Wt" is a width in the X-axis direction of the gate trench section 40 provided above the lifetime control region 72. In the present example, a width of one gate trench section 40, which is arranged in the boundary section 90, of the two U-shaped gate trench sections 40 is equal to the width Wt". Also, a width of the other gate trench section 40 of the two gate trench sections 40 is equal to the width Wt. That is, the width of the one gate trench section 40 and the width of the other gate trench section 40 are different. In the meantime, the width Wt" is greater than the width Wt' in the semiconductor device 100 shown in FIGS. 7 and 8.

Figure 13:
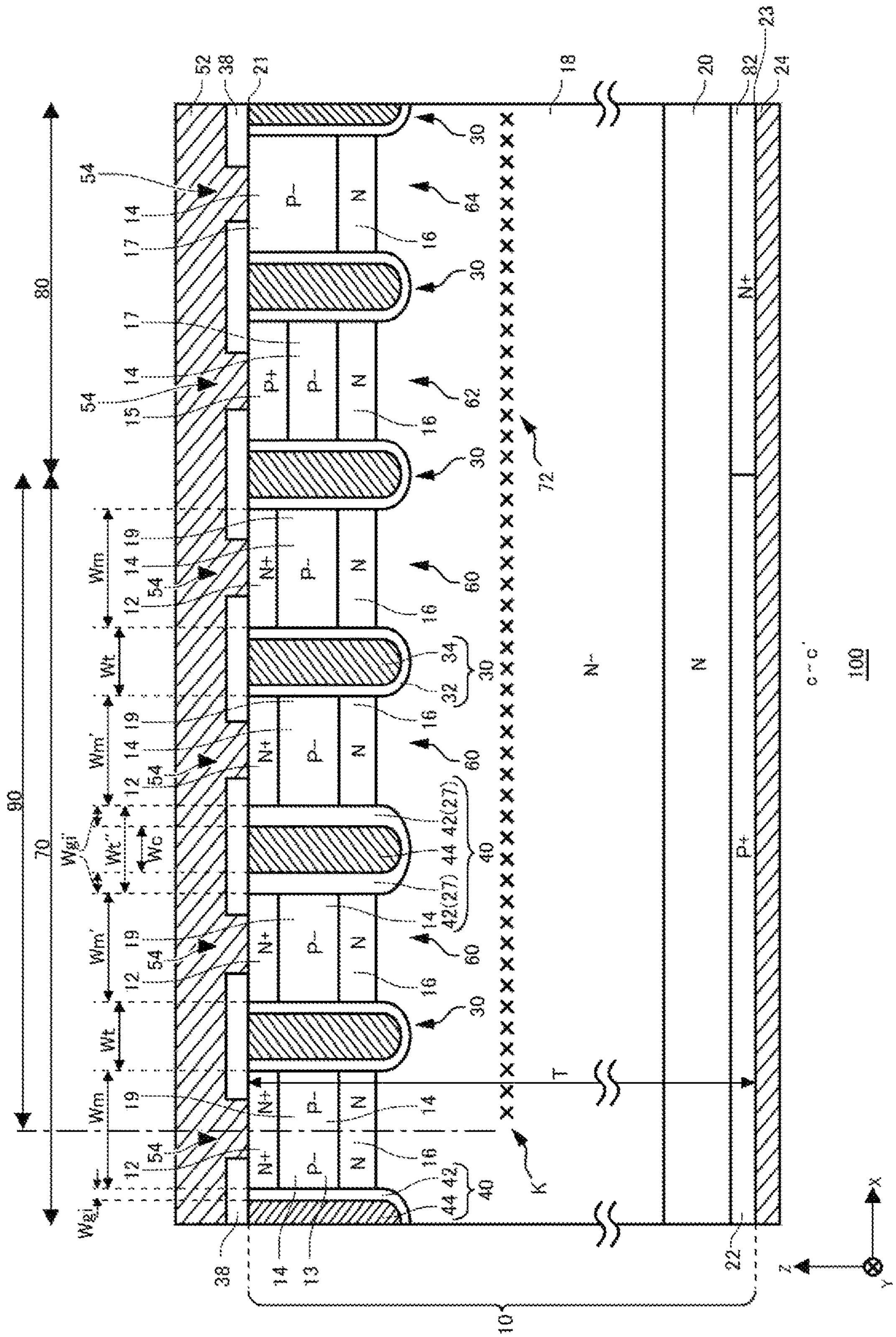
FIG. 13 shows an example of a cross-section c-c' in FIG. 12.

FIG. 13 shows an example of a cross-section c-c' in FIG. 12. The cross-section c-c' is an XZ plane passing the emitter region 12, the contact region 15 and base region 14, and the gate trench section 40 and dummy trench section 30.

In the present example, an end portion K of the lifetime control region 72 is sandwiched between the gate trench section 40 and the dummy trench section 30 and is arranged below the first mesa section 60 in contact with both the gate trench section 40 and the dummy trench section 30. The end portion K may also be arranged below the contact hole 54.

In the present example, the first region 19 overlapping the lifetime control region 72 as seen from above is each provided on both sides in the X-axis direction of the gate conductive section 44 provided for one gate trench section 40 in the boundary section 90. The threshold value adjusting section 27 having the width Wgi' is each provided on both sides in the X-axis direction of the gate conductive section 44 provided for the one gate trench section 40.

In the present example, a width in the X-axis direction of the gate conductive section 44 provided for the gate trench section 40 in the boundary section 90 is equal to the width Wc. Since the threshold value adjusting section 27 is each provided on both sides in the X-axis direction of the gate conductive section 44, the width Wt" of the gate trench section 40 in the X-axis direction is greater than the width Wt' in the semiconductor device 100 shown in FIGS. 7 and 8. In the present example, a sum of twice the width Wgi' and the width Wc is equal to the width Wt".

In the present example, the lifetime control region 72 is formed by irradiating the particle beam from the upper surface 21 to both sides in the X-axis direction of the gate trench section 40. After the particle beam passes through the base region 14 and the gate trench section 40 in the boundary section 90, the threshold value of the transistor may be lowered, as described above.

In the present example, the threshold value adjusting section 27 is each provided on both sides in the X-axis direction of the gate conductive section 44 provided for the gate trench section 40 in the boundary section 90. For this reason, before the irradiation of the particle beam, the threshold value of the transistor to which the threshold value adjusting section 27 is provided is set to be higher than the threshold value of the transistor to which the threshold value adjusting section 27 is not provided.

In the present example, the threshold value of the transistor is set high in advance in the boundary section 90 to which the particle beam is irradiated. For this reason, even when the threshold value of the transistor in the boundary section 90 is lowered due to the irradiation of the particle beam, a difference between the threshold value of the transistor in the boundary section 90 and the threshold value of the transistor in the transistor section 70 excluding the boundary section 90 can be reduced. Specifically, the threshold value adjusting section 27 is preferably formed to have a large width Wgi' so that after the particle beam passes through the base region 14 and the gate trench section 40 in the boundary section 90, the threshold value of the transistor in the boundary section 90 coincides with the threshold value of the transistor in the transistor section 70 excluding the boundary section 90. For this reason, it is possible to suppress instability of the operation of the transistor section 70 due to the difference in threshold values of the transistor sections 70.

In the boundary section 90 of the semiconductor device 100 of the present example, the lifetime control region 72 is locally provided on the upper surface 21-side inside the semiconductor substrate 10. For this reason, while the diode section 80 operates, a drift amount of holes from the base region 14 of the boundary section 90 to the cathode region 82 can be reduced. For this reason, the reverse recovery loss of the diode section 80 can be reduced.

In the semiconductor device 100 of the present example, the threshold value adjusting section 27 is provided in the gate trench section 40 of the boundary section 90. Therefore, it is possible to suppress a difference in threshold value of the transistor section 70 while providing the lifetime control region 72. That is, the semiconductor device 100 of the present example can suppress the instability of the operation of the transistor section 70 while reducing the reverse recovery loss of the diode section 80.

In the meantime, also in the present example, a partial thick film in the Z-axis direction may be adopted, like the semiconductor device 100 shown in FIG. 11A. In this case, in the present example, a partial thick film is each formed on both sides in the X-axis direction.

Figure 14:
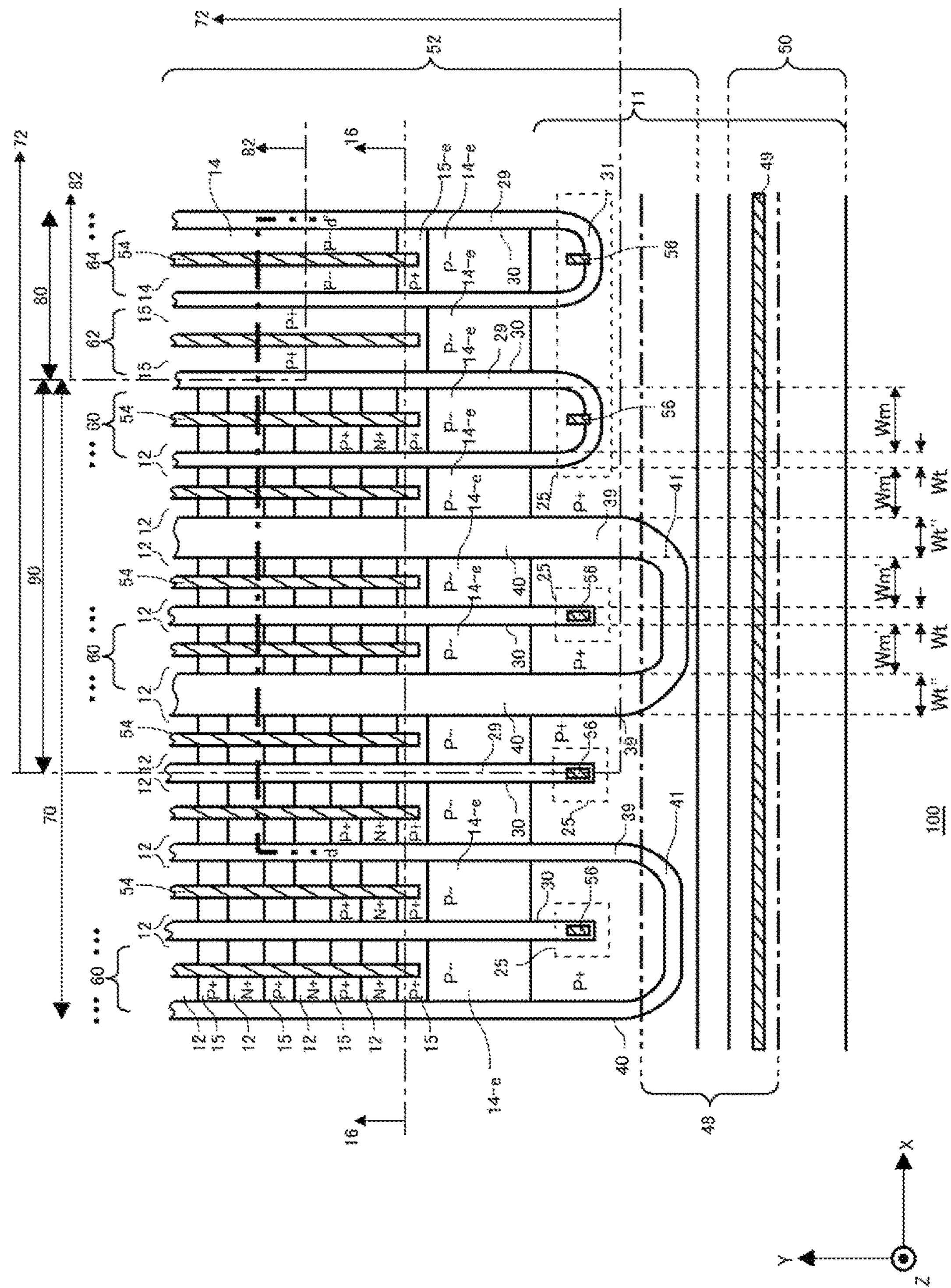
FIG. 14 partially shows another example of the upper surface of the semiconductor device 100 in accordance with one embodiment of the present invention.

FIG. 14 partially shows another example of the upper surface of the semiconductor device 100 in accordance with one embodiment of the present invention. The semiconductor device 100 of the present example is different from the semiconductor device 100 of FIG. 7, in that an end portion of the lifetime control region 72 on the negative side of the X-axis is arranged below the dummy trench section 30. In the present example, the two gate trench sections 40 are arranged in the extension direction in the boundary section 90. On the negative side of the X-axis of the gate trench section 40 on the negative side of the X-axis, the dummy trench section 30 is arranged adjacent to the gate trench section 40. An end portion of the lifetime control region 72 on the negative side of the X-axis is arranged below the dummy trench section 30.

In the present example, the widths in the X-axis direction of the two gate trench sections 40 provided above the lifetime control region 72 are all equal to the width Wt". In the present example, the widths of the two first mesa sections 60 sandwiched between the dummy trench section 30 arranged at the center in the X-axis direction of the two gate trench sections 40 and the gate trench sections 40 are all equal to the width Wm'.

Figure 15:
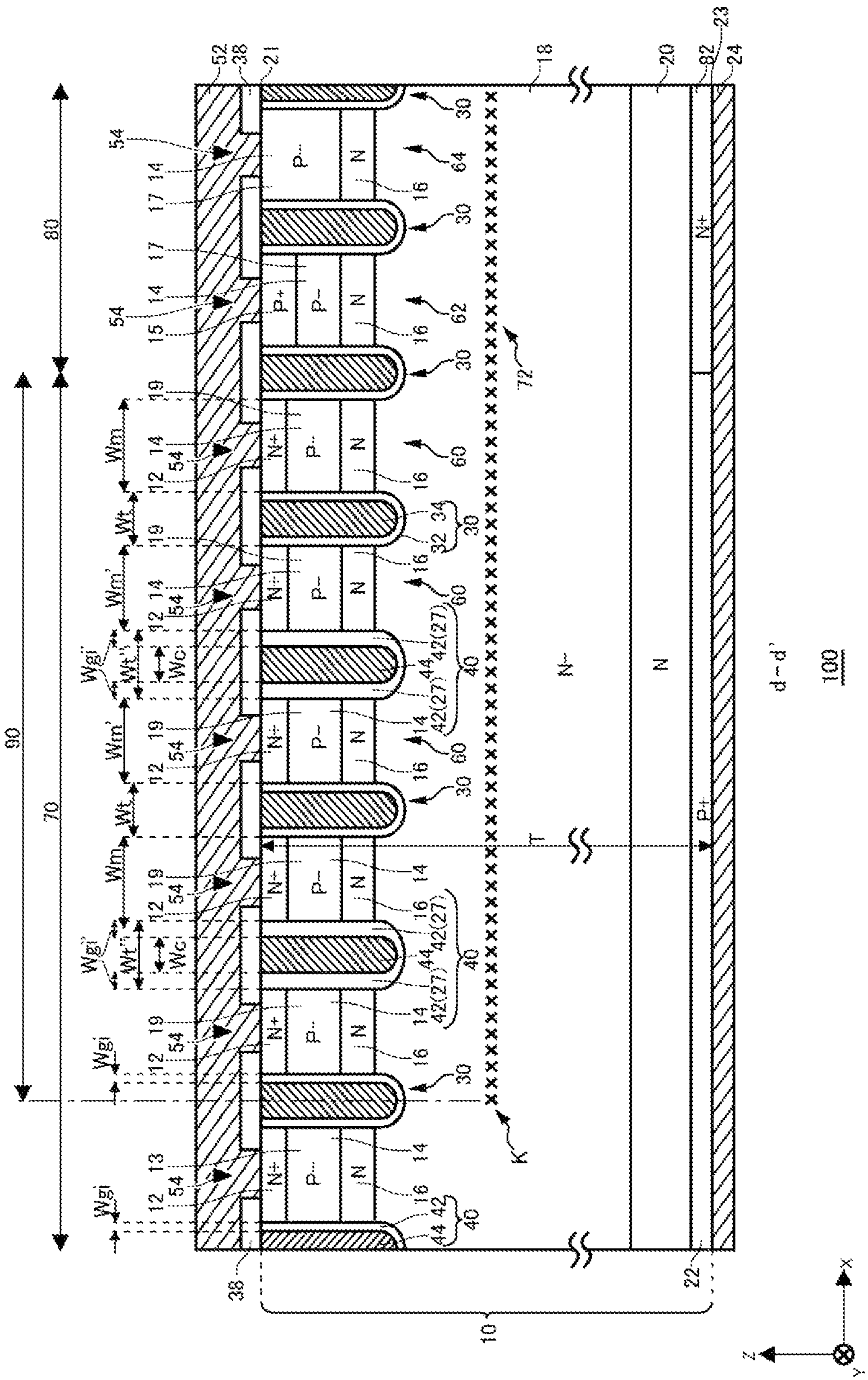
FIG. 15 shows an example of a cross-section d-d' in FIG. 14.

FIG. 15 shows an example of a cross-section d-d' in FIG. 14. The cross-section d-d' is an XZ plane passing the emitter region 12, the contact region 15 and base region 14, and the gate trench section 40 and dummy trench section 30.

In the present example, on the negative side of the X-axis of the gate trench section 40 on the negative side of the X-axis, the dummy trench section 30 is arranged adjacent to the gate trench section 40. An end portion K of the lifetime control region 72 is arranged below the dummy trench section 30.

In the present example, the boundary section 90 is provided with the two gate trench sections 40. The first region 19 overlapping the lifetime control region 72 as seen from above is each provided on both sides in the X-axis direction of the gate conductive section 44 provided for the one gate trench section 40. The threshold value adjusting section 27 having the width Wgi' is each provided on both sides in the X-axis direction of the gate conductive section 44 provided for one gate trench section 40. Also, the first region 19 is each provided on both sides in the X-axis direction of the gate conductive section 44 provided for the other gate trench section 40. The threshold value adjusting section 27 is each provided on both sides in the X-axis direction of the gate conductive section 44 provided for the other gate trench section 40.

In the present example, the lifetime control region 72 is formed by irradiating the particle beam from the upper surface 21 to both sides in the X-axis direction of the gate trench section 40. After the particle beam passes through the base region 14 and the gate trench section 40 in the boundary section 90, the threshold value of the transistor may be lowered, as described above.

In the present example, the threshold value adjusting section 27 is each provided on both sides in the X-axis direction of the gate conductive section 44 provided for the two gate trench sections 40 in the boundary section 90. For this reason, before the irradiation of the particle beam, the threshold value of the transistor to which the threshold value adjusting section 27 is provided is set to be higher than the threshold value of the transistor to which the threshold value adjusting section 27 is not provided.

In the present example, the threshold value of the transistor is set high in advance in the boundary section 90 to which the particle beam is irradiated. For this reason, even when the threshold value of the transistor in the boundary section 90 is lowered due to the irradiation of the particle beam, a difference between the threshold value of the transistor in the boundary section 90 and the threshold value of the transistor in the transistor section 70 excluding the boundary section 90 can be reduced. Specifically, the threshold value adjusting section 27 is preferably formed to have a large width Wgi' so that after the particle beam passes through the base region 14 and the gate trench section 40 in the boundary section 90, the threshold value of the transistor in the boundary section 90 coincides with the threshold value of the transistor in the transistor section 70 excluding the boundary section 90. For this reason, it is possible to suppress instability of the operation of the transistor section 70 due to the difference in threshold values of the transistor sections 70.

In the boundary section 90 of the semiconductor device 100 of the present example, the lifetime control region 72 is locally provided on the upper surface 21-side inside the semiconductor substrate 10. For this reason, while the diode section 80 operates, a drift amount of holes from the base region 14 of the boundary section 90 to the cathode region 82 can be reduced. For this reason, the reverse recovery loss of the diode section 80 can be reduced.

Figure 16:
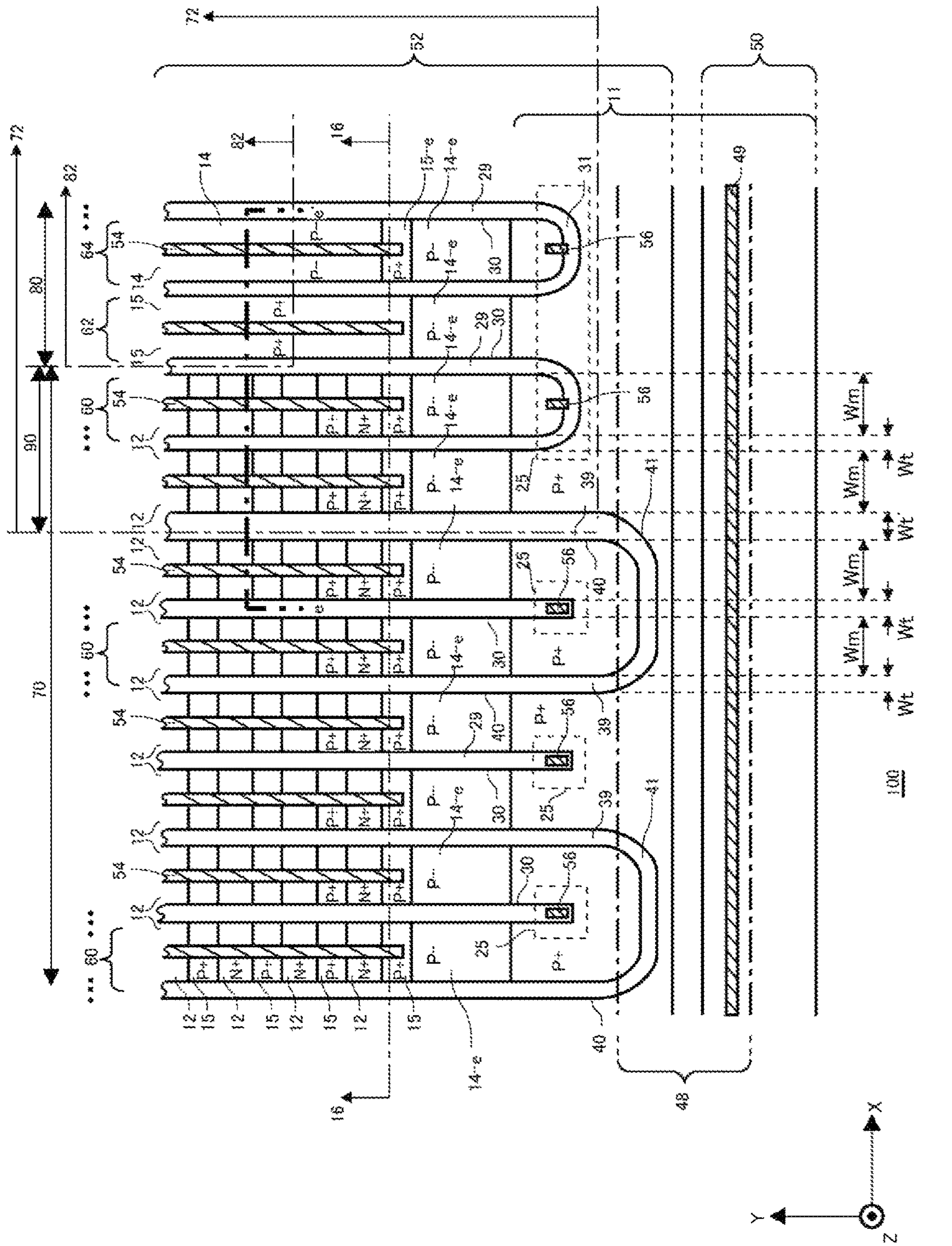
FIG. 16 partially shows another example of the upper surface of the semiconductor device 100 in accordance with one embodiment of the present invention.

FIG. 16 partially shows another example of the upper surface of the semiconductor device 100 in accordance with one embodiment of the present invention The semiconductor device 100 of the present example is different from the semiconductor device 100 shown in FIG. 7, in that the width of the first mesa section 60 in contact with the gate trench section 40 having the width Wt' in the boundary section 90 is equal to the width Wm. That is, in the present example, the widths of the first mesa sections 60 are all equal to the width Wm. In the present example, a trench pitch between a trench having the gate trench section 40 of the width Wt' and another trench adjacent to the trench in the X-axis direction is greater than a trench pitch between two trenches each having the width Wt.

Figure 17:
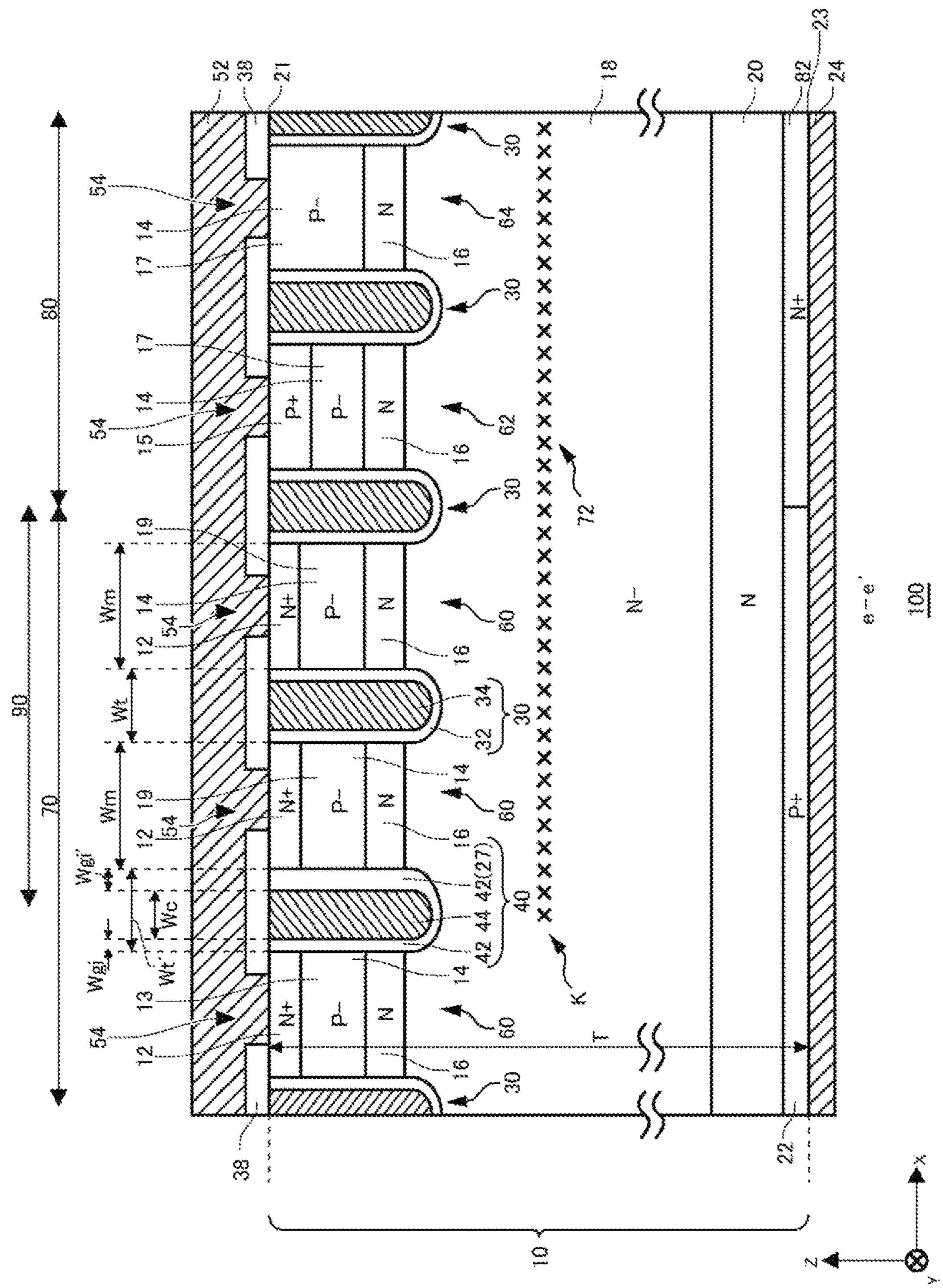
FIG. 17 shows an example of a cross-section e-e' in FIG. 16.

FIG. 17 shows an example of a cross-section e-e' in FIG. 16. The cross-section e-e' is an XZ plane passing the emitter region 12, the contact region 15 and base region 14, and the gate trench section 40 and dummy trench section 30.

In the present example, the width in the X-axis direction of the first mesa section 60 in contact with the threshold value adjusting section 27 having the width Wgi' is equal to the width Wm. That is, the width of the first mesa section 60 in contact with the gate insulating film 42 having the width Wgi and the width of the first mesa section 60 in contact with the threshold value adjusting section 27 are all equal to the width Wm.

In the present example, the lifetime control region 72 is formed by irradiating the particle beam from the upper surface 21 to both sides in the X-axis direction of the gate trench section 40. After the particle beam passes through the base region 14 and the gate trench section 40 in the boundary section 90, the threshold value of the transistor may be lowered, as described above.

In the present example, the threshold value adjusting section 27 is provided on one side in the X-axis direction of the gate conductive section 44 provided for the gate trench section 40 in the boundary section 90. For this reason, before the irradiation of the particle beam, the threshold value of the transistor to which the threshold value adjusting section 27 is provided is set to be higher than the threshold value of the transistor to which the threshold value adjusting section 27 is not provided.

In the present example, the threshold value of the transistor is set high in advance in the boundary section 90 to which the particle beam is irradiated. For this reason, even when the threshold value of the transistor in the boundary section 90 is lowered due to the irradiation of the particle beam, a difference between the threshold value of the transistor in the boundary section 90 and the threshold value of the transistor in the transistor section 70 excluding the boundary section 90 can be reduced. Specifically, the threshold value adjusting section 27 is preferably formed to have a large width Wgi' so that after the particle beam passes through the base region 14 and the gate trench section 40 in the boundary section 90, the threshold value of the transistor in the boundary section 90 coincides with the threshold value of the transistor in the transistor section 70 excluding the boundary section 90. For this reason, it is possible to suppress instability of the operation of the transistor section 70 due to the difference in threshold values of the transistor sections 70.

Also, in the present example, the width of the first mesa section 60 provided on one side of the gate trench section 40 in the X-axis direction and in contact with the gate insulating film 42 having the width Wgi and the width of the first mesa section 60 provided on the other side and in contact with the threshold value adjusting section 27 are equal. For this reason, it is possible to make a current density of the transistor uniform on both sides of the gate trench section 40 in the X-axis direction. For this reason, it is possible to suppress a difference between a current density of the transistor in the boundary section 90 and a current density of the transistor in the transistor section 70 excluding the boundary section 90.

In the boundary section 90 of the semiconductor device 100 of the present example, the lifetime control region 72 is locally provided on the upper surface 21-side inside the semiconductor substrate 10. For this reason, while the diode section 80 operates, a drift amount of holes from the base region 14 of the boundary section 90 to the cathode region 82 can be reduced. For this reason, the reverse recovery loss of the diode section 80 can be reduced.

In the semiconductor device 100 of the present example, the threshold value adjusting section 27 is provided in the gate trench section 40 of the boundary section 90. Therefore, it is possible to suppress a difference in threshold value of the transistor section 70 while providing the lifetime control region 72. That is, the semiconductor device 100 of the present example can suppress the instability of the operation of the transistor section 70 while reducing the reverse recovery loss of the diode section 80.

Figure 18:
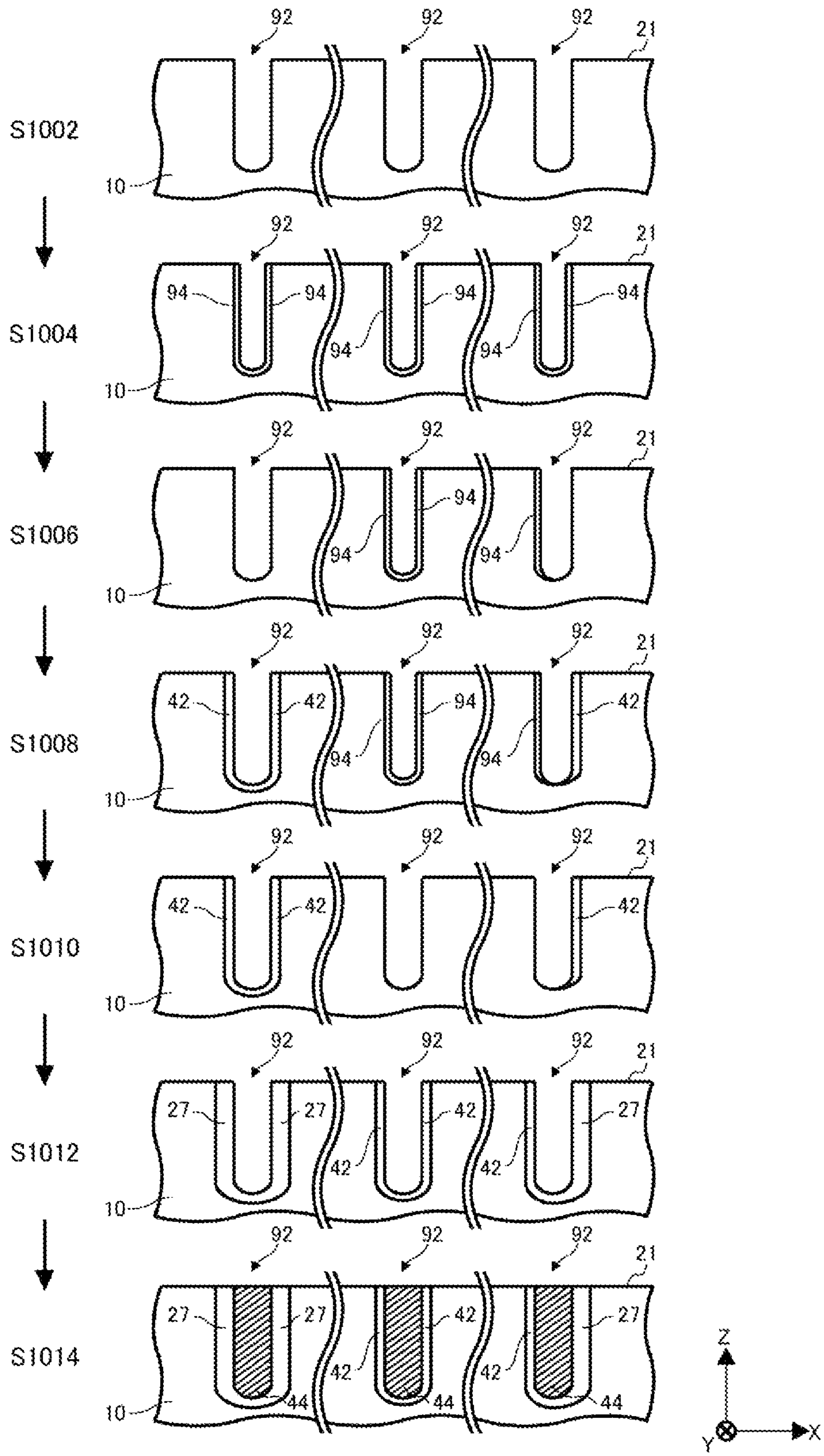
FIG. 18 is a flowchart and sectional views for showing an example of a manufacturing process of a gate trench section 40 provided with a threshold value adjusting section 27.

FIG. 18 is a flowchart and sectional views for showing an example of a manufacturing process of the gate trench section 40 provided with the threshold value adjusting section 27. In the present example, an example where the threshold value adjusting section 27 is each provided on both sides of the gate conductive section 44, an example where the threshold value adjusting section 27 is provided on one side of the gate conductive section 44, and an example where the threshold value adjusting section 27 is not provided on any side of the gate conductive section 44.

In step S1002, the semiconductor substrate 10 is formed with a trench 92. The trench 92 may be formed by etching the semiconductor substrate 10.

In step S1004, a nitride film 94 is formed on a sidewall of the trench 92. The nitride film 94 may be formed by nitriding the sidewall of the trench 92.

In step S1006, the nitride film 94 is partially removed. On the sidewall on which a threshold value adjusting section 27 will be formed in step S1012, the nitride film 94 is formed by step S1004. In step S1006, the nitride film 94 is removed The nitride film 94 may be removed by patterning etching in which the nitride film 94 formed by step S1004 is masked on a sidewall on which a threshold value adjusting section 27 is not formed in step S1012. On the sidewall from which the nitride film 94 has been removed, the sidewall of the trench 92 is again exposed.

In step S1008, a gate insulating film 42 is formed on the re-exposed sidewall of the trench 92. The gate insulating film 42 may also be formed by oxidizing the sidewall of the trench 92. On the sidewall from which the nitride film 94 has been removed, a thick oxide film, as compared to the sidewall on which the nitride film 94 is formed, is formed by accelerated oxidation.

In step S1010, the nitride film 94 formed on the sidewall of the trench 92 is removed. The nitride film 94 may be removed by etching. On the sidewall from which the nitride film 94 has been removed, the sidewall of the trench 92 is again exposed.

In step S1012, the gate insulating film 42 formed already and the sidewall of the trench 92 exposed in step S1010 are all oxidized. By this step, a gate insulating film 42 is formed on the sidewall of the trench 92. Also, the sidewall on which the gate insulating film 42 is already formed is further oxidized to form a threshold value adjusting section 27 having a greater thickness than the gate insulating film 42.

In step S1014, the trench 92 is filled with a conducive member, so that a gate conductive section 44 is formed. The conductive member is, for example, polysilicon. The conductive member may fill up to the upper surface 21. By the above steps, the gate trench section 40 where the threshold value adjusting section 27 is provided on at least one side of the gate conductive section 44 in the X-axis direction is manufactured.

The specific method of configuring the threshold value adjusting section 27 by the thickness of the gate insulating film 42 is not limited to step S1002 to step S1014. For example, the thickness of the gate insulating film 42 is partially changed in the Z-axis direction by irradiation of an ion beam, so that the threshold value adjusting section 27 may be configured. That is, the threshold value adjusting section 27 may be formed in a part ranging from the upper surface 21 to the position hl in the Z-axis direction of the gate insulating film 42 provided on a side of the gate trench section 40 facing the first region 19 by the irradiation of the ion beam, as shown in FIG. 11A. In the meantime, in the above embodiment, similarly to the method of changing the thickness of the gate insulating film 42 to configure the threshold value adjusting section 27, the dielectric constant of the gate insulating film 42 may be partially changed in the Z-axis direction to configure the threshold value adjusting section 27, or the dielectric constant on both sides or one side of the gate insulating film 42 in the X-axis direction may be changed to configure the threshold value adjusting section 27.

Figure 19:
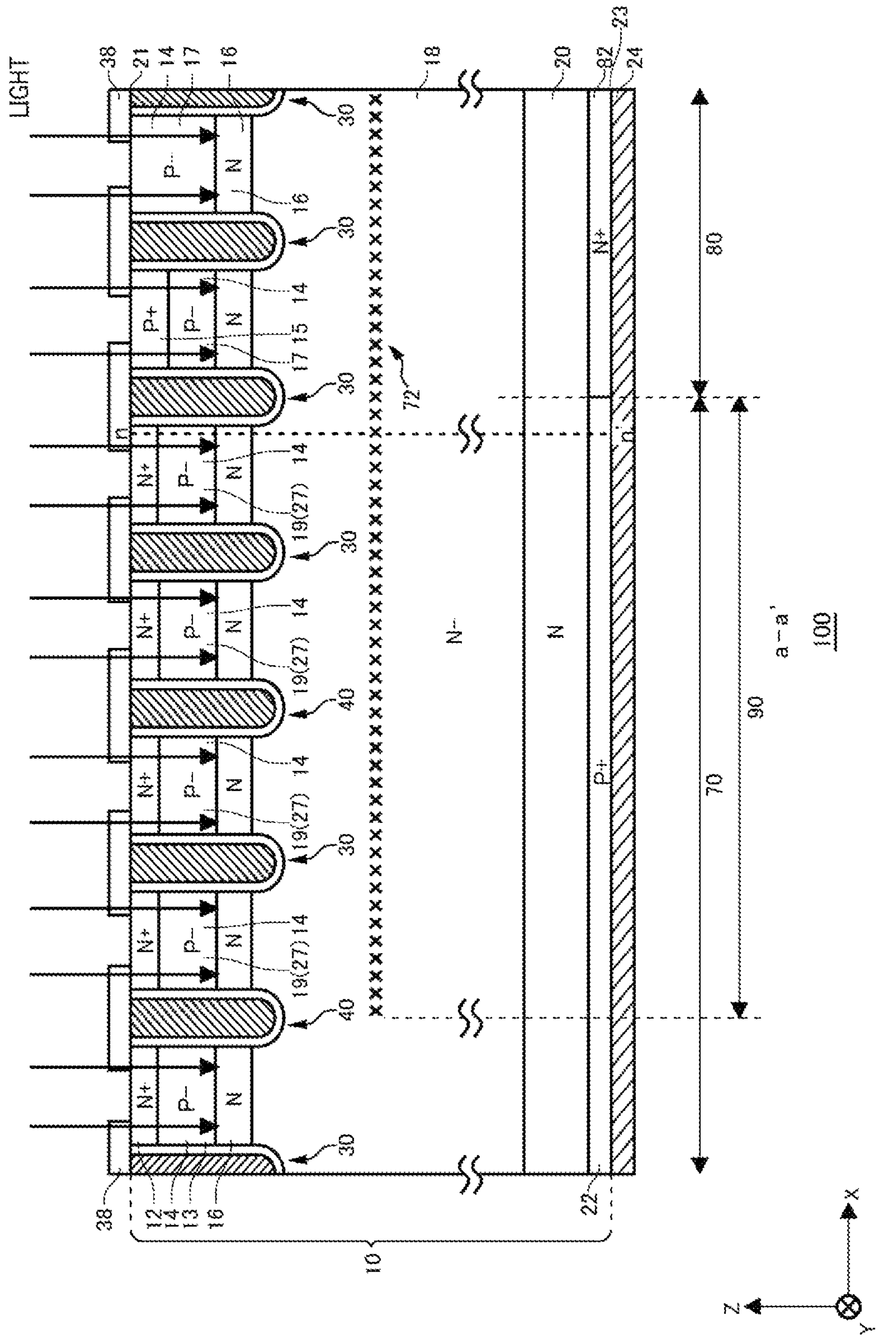
FIG. 19 is a sectional view for illustrating the semiconductor device 100 in accordance with another embodiment.

FIG. 19 is a sectional view for illustrating the semiconductor device 100 in accordance with another embodiment. In the semiconductor device 100 of the present example, the base region 14 (i.e., the first region 19) of the boundary section 90 functions as the threshold value adjusting section 27. The functions and structures excluding the first region 19 may be the same as any one semiconductor device 100 described in FIGS. 1 to 18.

As described above, when the lifetime control region 72 is formed by irradiating the particle beam from the upper surface 21 of the semiconductor substrate 10, the lifetime killers such as crystal defects are formed in the region that the particle beam has passed. When the lifetime killers such as crystal defects are formed in the first region 19, a threshold voltage of the transistor may vary. The concentration distribution of lifetime killers in the depth direction of the semiconductor substrate 10 is similar to the example of FIG. 4A, for example.

In the present example, in a manufacturing process of the semiconductor device 100, the crystal defects in the first region 19 are recovered by irradiating light reaching the first region 19 from the upper surface 21 of the semiconductor substrate 10. Thereby, the first region 19 functions as the threshold value adjusting section 27 that suppresses variation in threshold value due to the formation of the lifetime control region 72.

By controlling a wavelength or intensity of the light to be irradiated, it is possible to control a depth at which the light reaches the inside the semiconductor substrate 10. In a case where the semiconductor substrate 10 is formed of silicon, when laser having a wavelength of about 800 nm is irradiated with the intensity of 1.8 J/cm$^2$, the laser reaches a depth of about 1.51 μm from the upper surface 21. In the present example, laser having a wavelength of 700 nm or longer may be irradiated with the intensity of 1.5 J/cm$^2$ or higher. However, preferably, the light does not reach a depth position at which the lifetime killer concentration in the lifetime control region 72 becomes a peak. The wavelength of the light may be equal to or shorter than 1.1 μm. The intensity of the light may be equal to or lower than 3.0 J/cm$^2$. Also, an irradiation time period of the light may be 50 ns or longer and 200 ns or shorter. The irradiation conditions of the light may be changed as appropriate, depending on the depth positions of the base region 14 and the lifetime control region 72.

Figure 20:
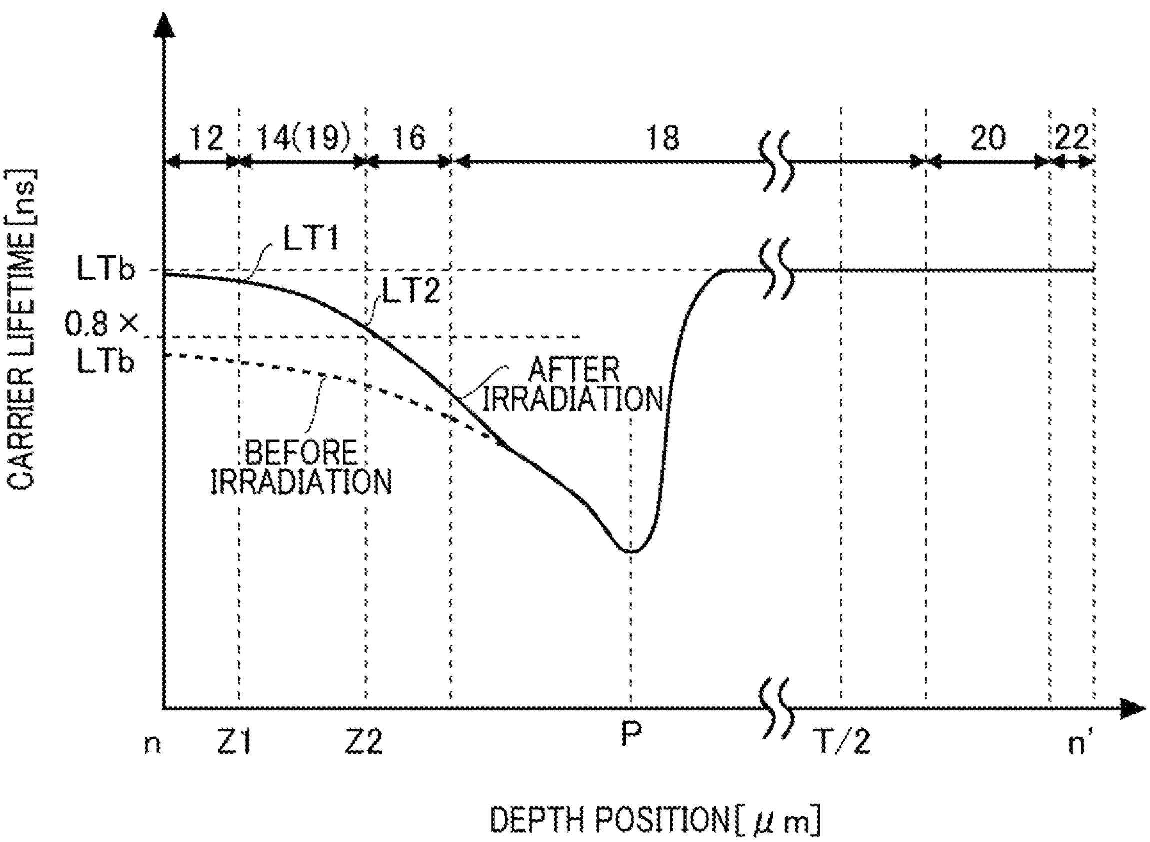
FIG. 20 shows an example of a carrier lifetime distribution in a cross-section n-n' of FIG. 19.

FIG. 20 shows an example of a carrier lifetime distribution in a cross-section n-n' of FIG. 19. In FIG. 20, a solid line indicates the carrier lifetime after light for recovering crystal defects is irradiated (i.e., after forming the threshold value adjusting section 27), and a broken line indicates the carrier lifetime before the light is irradiated.

In FIG. 20, below the first region 19, the carrier lifetime at a position of a depth T/2 from the upper surface 21 is denoted as LTb. T is the thickness of the semiconductor substrate 10. When the particle beam is irradiated to the depth position P so as to form the lifetime control region 72, crystal defects are formed from the upper surface 21 to a vicinity of the position P. As a result, the carrier lifetime is lowered from the upper surface 21 to the vicinity of the position P.

When the crystal defects are formed in the first region 19, the threshold value of the transistor section 70 may vary. As described above with reference to FIG. 19, in the semiconductor device 100, the light reaching the first region 19 is irradiated to recover the crystal defects included in the first region 19. As a result, the carrier lifetime of the first region 19 is also recovered.

In the present example, the carrier lifetime at an upper end of the first region 19 functioning as the threshold value adjusting section 27 is denoted as LT1, and the carrier lifetime at a lower end is denoted as LT2. The carrier lifetimes LT1 and LT2 may be measured at positions adjacent to the trench section or may be measured at a center of the first mesa section 60 in the X-axis direction.

The carrier lifetime LT1 may be equal to or greater than 80% of the carrier lifetime LTb. The crystal defects are recovered up to the above level, so that the variation in threshold value can be sufficiently suppressed. Also, the carrier lifetime LT2 may be equal to or greater than 80% of the carrier lifetime LTb. That is, the carrier lifetime LT may be equal to or greater than 80% of the carrier lifetime LTb over the entire range from the upper end to the lower end of the first region 19. Thereby, the variation in threshold value can be further suppressed. The carrier lifetime LT1 may be equal to or greater than 90% of the carrier lifetime LTb or may be the same as the carrier lifetime LTb. The carrier lifetime LT2 may be equal to or greater than 90% of the carrier lifetime LTb or may be the same as the carrier lifetime LTb. The carrier lifetime LT1 may be greater than or the same as the carrier lifetime LT2.

Figure 21:
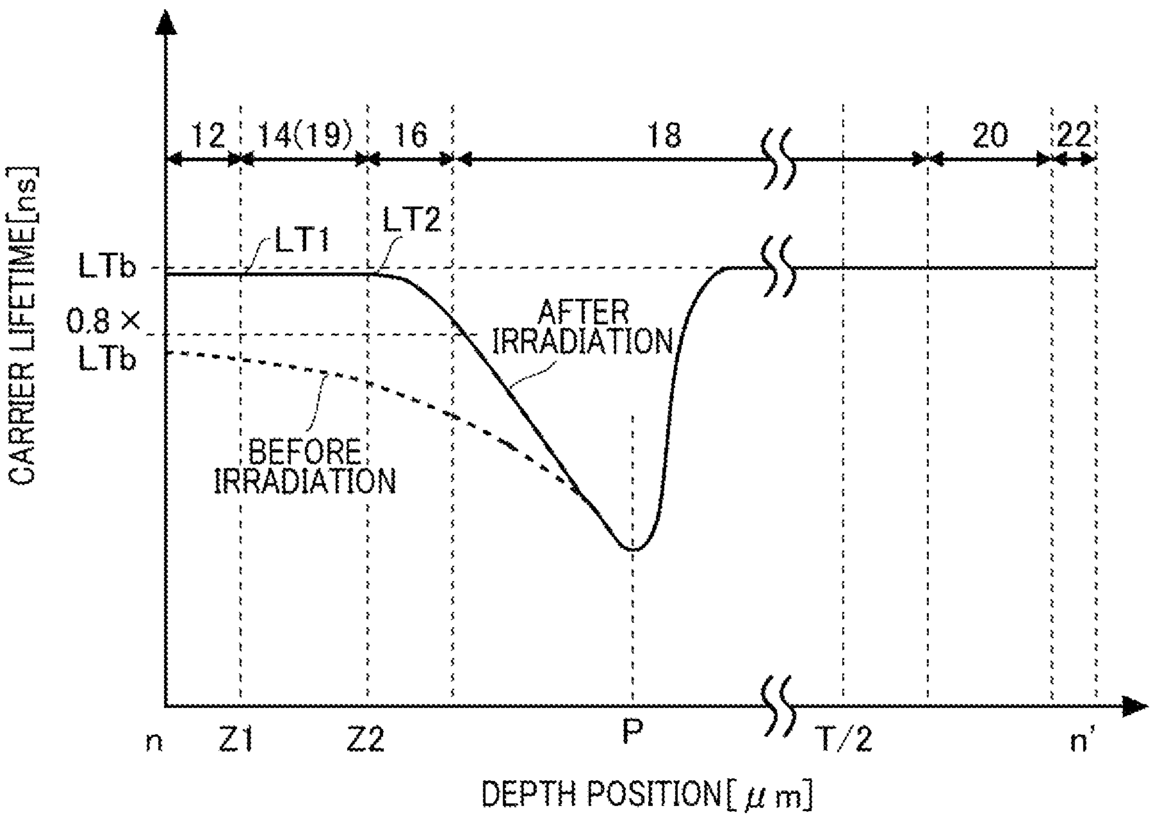
FIG. 21 shows another example of the carrier lifetime distribution in the cross-section n-n' of FIG. 19.

FIG. 21 shows another example of the carrier lifetime distribution in the cross-section n-n' of FIG. 19. In the present example, the carrier lifetime LT1 is the same as the carrier lifetime LT2. Note that, the configuration "the same" may include a predetermined error. For example, when an error between the two carrier lifetimes is within 5%, it may be said that the two carrier lifetimes are the same. The carrier lifetimes LT1 and LT2 may be the same as the carrier lifetime LTb. By the above configuration, the crystal defects in the first region 19 are sufficiently recovered, so that the variation in threshold value can be suppressed. The carrier lifetime distribution can be adjusted by the intensity, wavelength, depth, irradiation time and the like of light to be irradiated.

Figure 22:
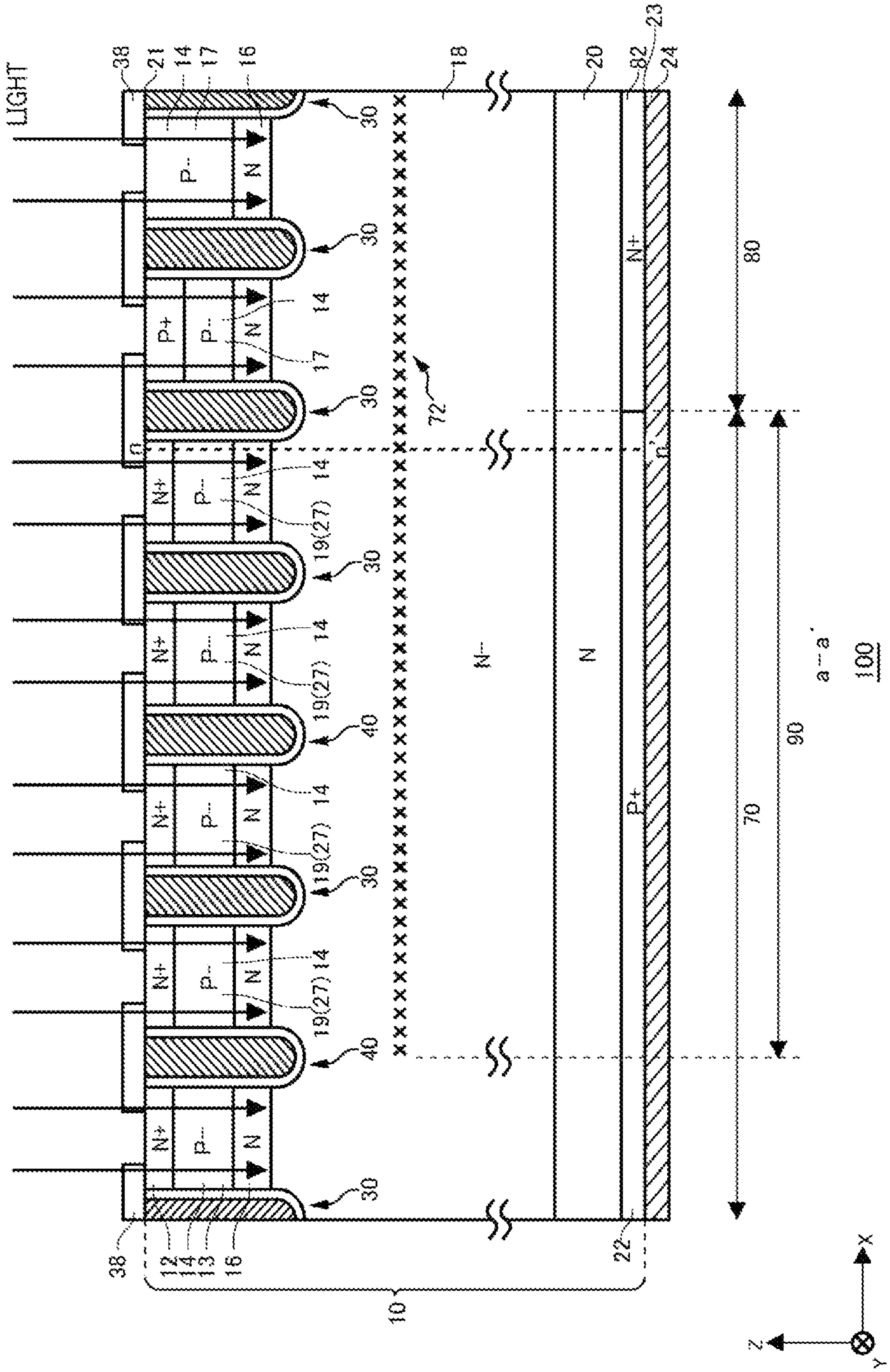
FIG. 22 shows another example of the semiconductor device 100.

FIG. 22 shows another example of the semiconductor device 100. In the present example, the reaching depth of the irradiation light is changed with respect to the semiconductor device 100 described with reference to FIG. 19. The other structures may be the same as the semiconductor device 100 described in FIGS. 19 to 21.

In the present example, light that reaches the accumulation region 16 is irradiated. Note that, the configuration "the light reaches" may indicate that light having an intensity of 10% or higher with respect to the intensity on the upper surface 21 of the semiconductor substrate 10 reaches. The intensity of light inside the semiconductor substrate 10 may be calculated from a light absorption coefficient of the material (for example, silicon) of the semiconductor substrate 10 and the intensity and wavelength of the irradiation light.

According to the present example, it is also possible to recover the crystal defects in the accumulation region 16. In this case, a carrier accumulation effect by the accumulation region 16 is improved, so that an on-resistance of the transistor section 70 can be reduced. Also, since the intensity of light in the first region 19 is increased, the crystal defects in the first region 19 can be further recovered.

Figure 23:
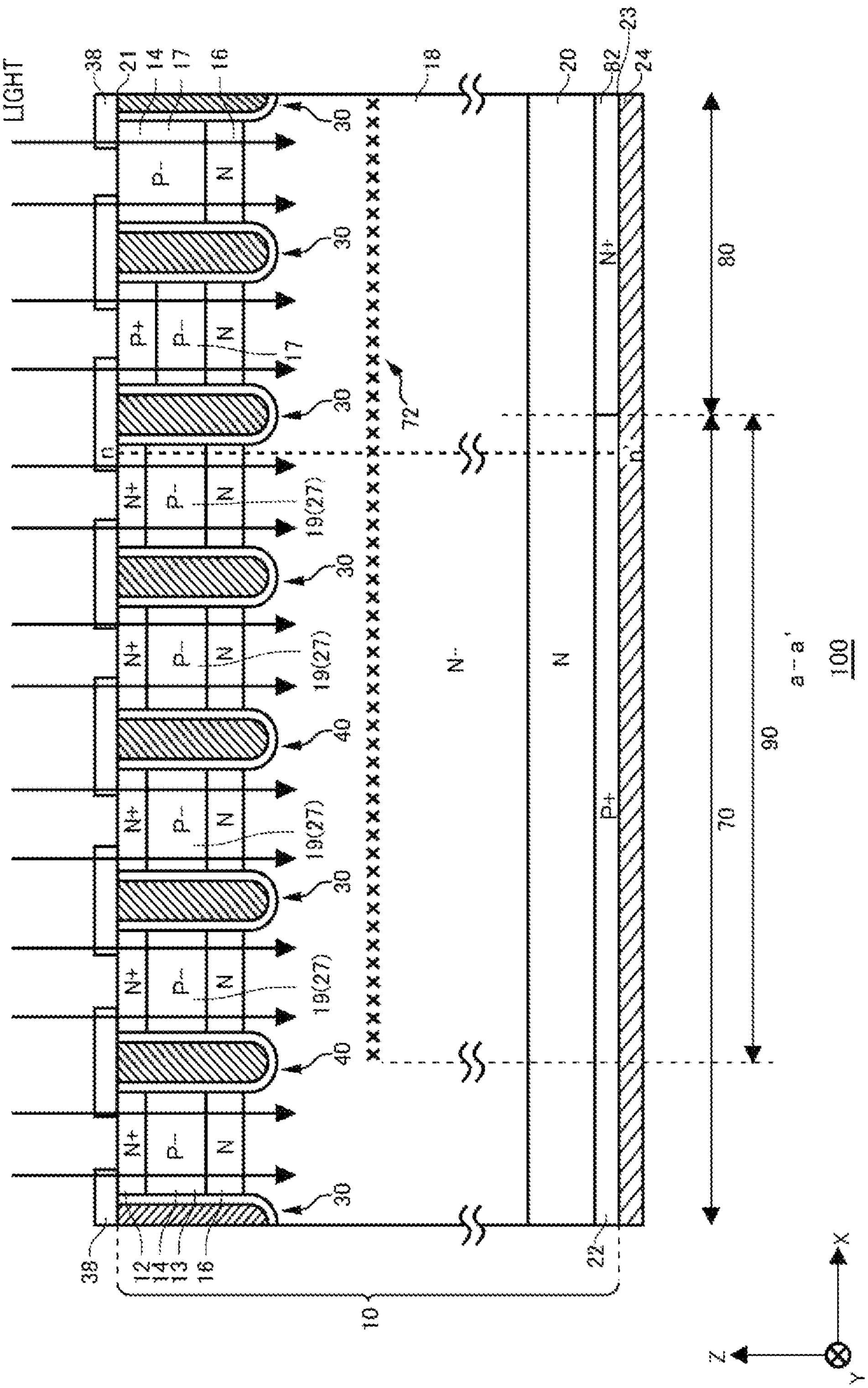
FIG. 23 shows another example of the semiconductor device 100.

FIG. 23 shows another example of the semiconductor device 100. In the present example, the reaching depth of the irradiation light is changed with respect to the semiconductor device 100 described with reference to FIG. 19. The other structures may be the same as the semiconductor device 100 described in FIGS. 19 to 21.

In the present example, light that reaches between the accumulation region 16 and the lifetime control region 72 is irradiated. The position of the lifetime control region 72 may be a position at which the concentration distribution of lifetime killers becomes a peak. According to the present example, it is possible to recover the crystal defects over a wider range above the lifetime control region 72. Also, it is possible to reduce the width of the lifetime control region 72 in the depth direction. The irradiation light may reach above the bottom of each trench section or may reach below the bottom of each trench section.

Figure 24:
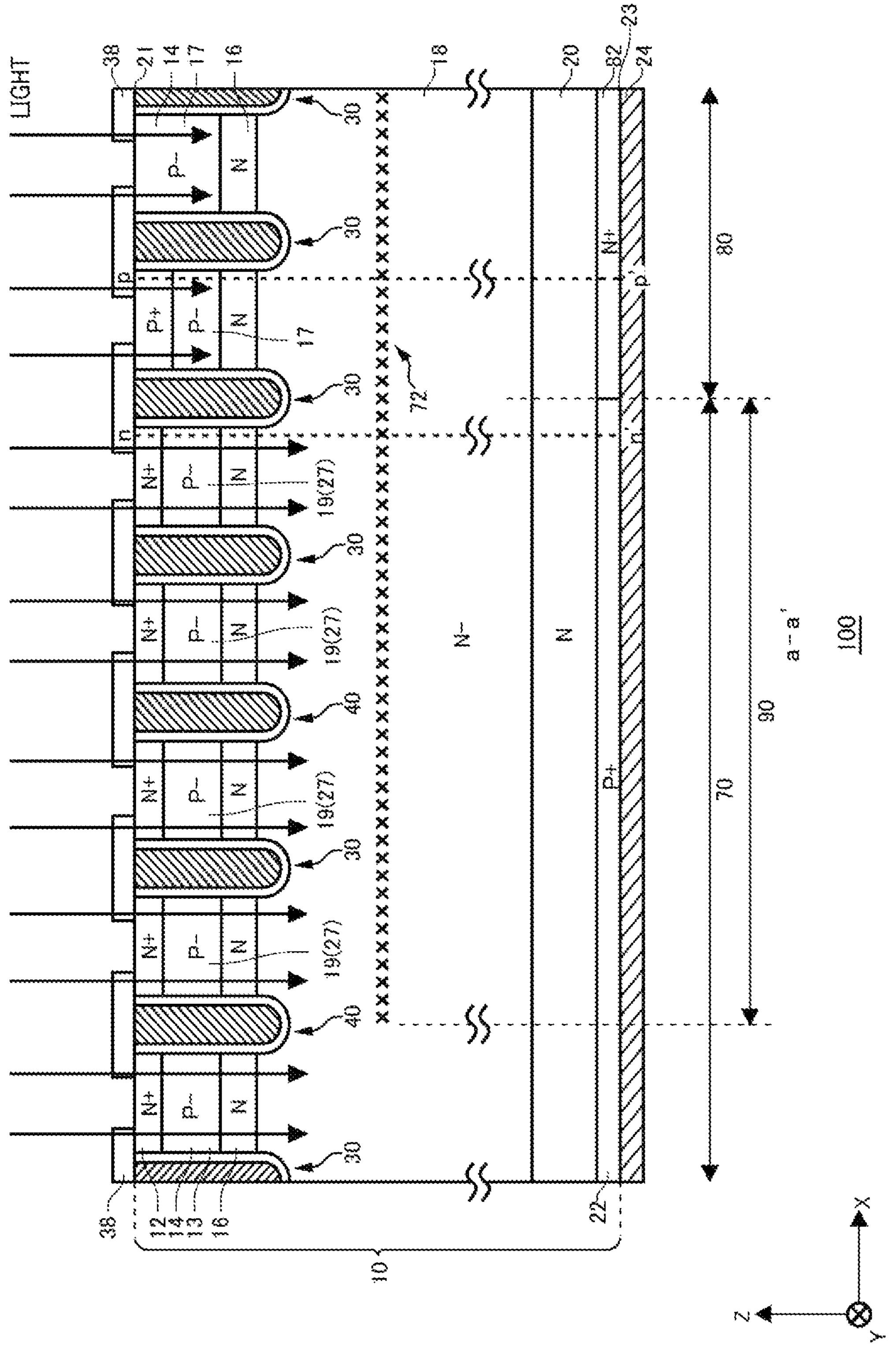
FIG. 24 shows another example of the semiconductor device 100.

FIG. 24 shows another example of the semiconductor device 100. In the present example, light that is irradiated to the transistor section 70 and light that is irradiated to the diode section 80 are different. As an example, the light that is irradiated to the transistor section 70 reaches a deeper position than the light that is irradiated to the diode section 80. The light that is irradiated to the transistor section 70 and the light that is irradiated to the diode section 80 may be different in terms of at least one of the wavelength and the intensity. Also, a shield for attenuating light may be provided above the diode section 80. Also, the light may be irradiated to the transistor section 70 and may not be irradiated to the diode section 80. By the above configuration, while reducing the carrier lifetime in the diode section 80, it is possible to suppress the variation in threshold value in the transistor section 70.

Figure 25:
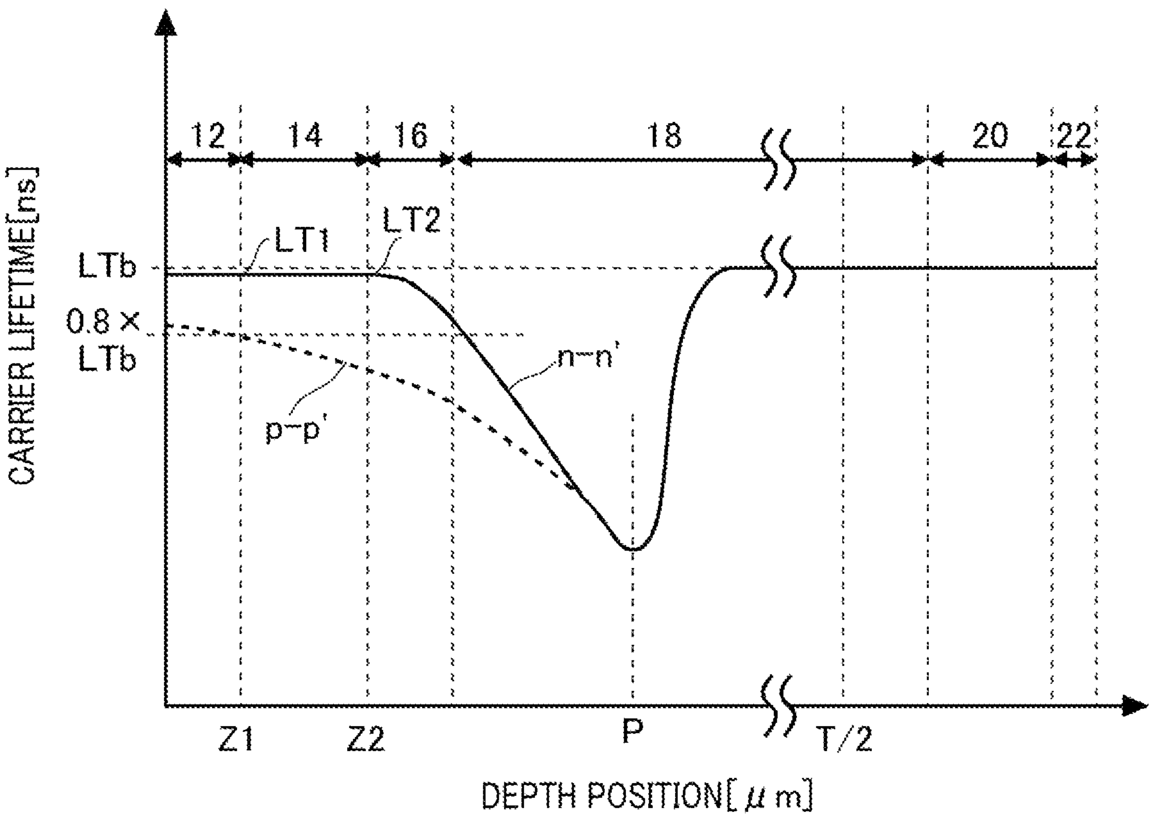
FIG. 25 shows an example of a carrier lifetime distribution in a cross-section n-n' and a cross-section p-p' shown in FIG. 24.

FIG. 25 shows an example of a carrier lifetime distribution in a cross-section n-n' and a cross-section p-p' shown in FIG. 24. The cross-section n-n' is a cross-section in the boundary section 90, and the cross-section p-p' is a cross-section in the diode section 80.

As described above, the light that is irradiated to the diode section 80 reaches only the shallower position than the light that is irradiated to the boundary section 90. For this reason, in the diode section 80, more crystal defects than the transistor section 70 remain and the carrier lifetime is shortened. When comparing the carrier lifetime at the same depth position, the first region 19 functioning as the threshold value adjusting section 27 has a part in which the carrier lifetime is greater than the base region 14 of the diode section 80. In the entire first region 19, the carrier lifetime may be greater than the base region 14 of the diode section 80.

Figure 26:
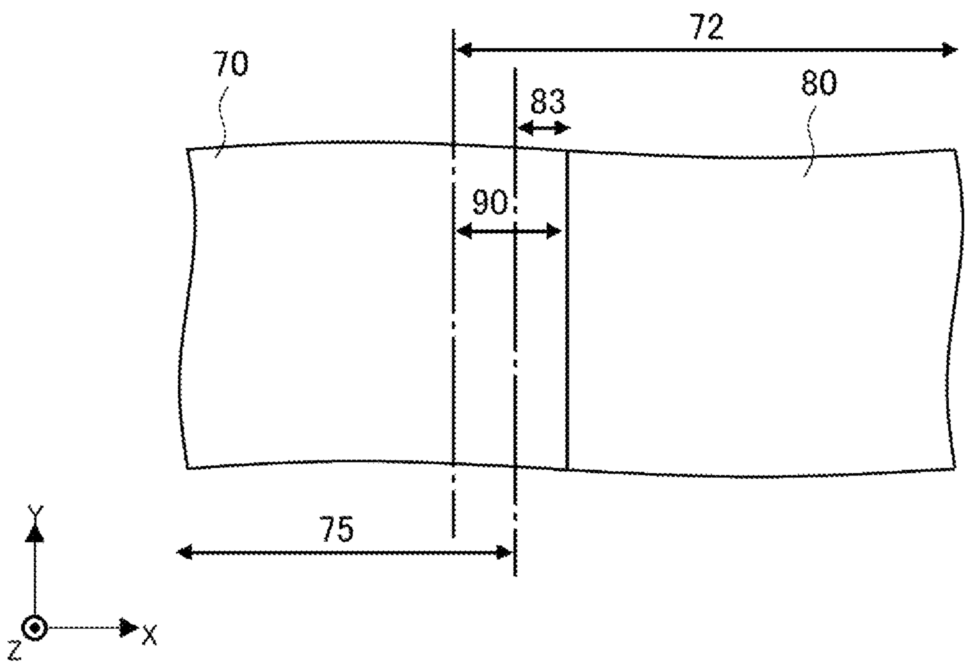
FIG. 26 shows an example of an irradiation range 75 within which light for recovering crystal defects is irradiated.

FIG. 26 shows an example of an irradiation range 75 within which light for recovering crystal defects is irradiated. The light is irradiated to at least a portion of the boundary section 90, and the light is not irradiated to at least a portion of the diode section 80. In the example of FIG. 26, the light is not irradiated to the entire diode section 80 and an adjacent region 83 of the boundary section 90 adjacent to the diode section 80. In this case, the carrier lifetime in the adjacent region 83 is equivalent to the diode section 80. According to the present example, it is possible to suppress carriers from flowing from the adjacent region 83 toward the diode section 80. Also, it is possible to suppress the variation in threshold value in the boundary section 90 excluding the adjacent region 83.

Figure 27:
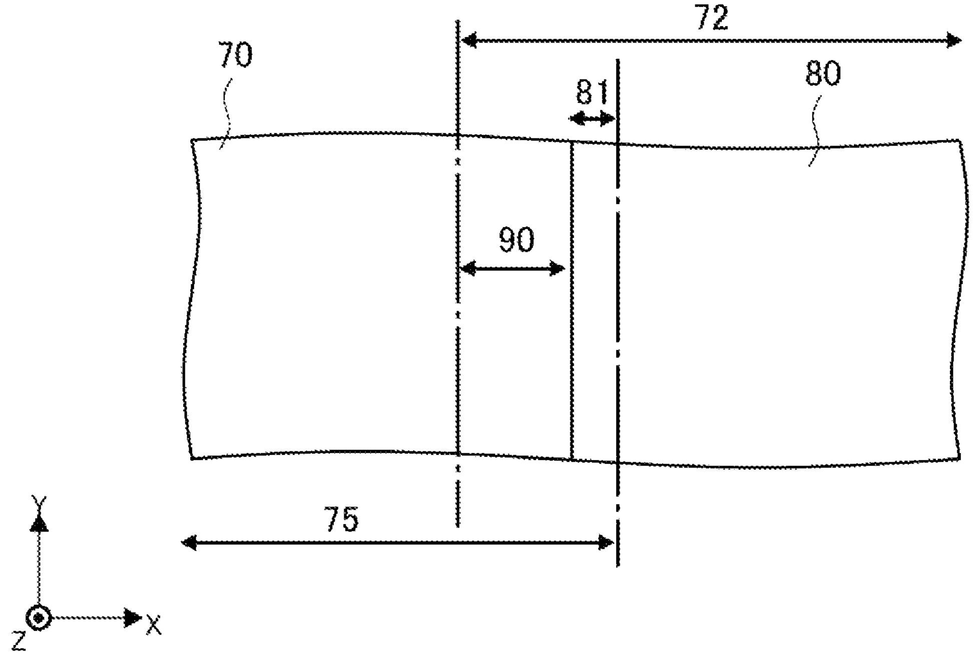
FIG. 27 shows another example of the irradiation range 75.

FIG. 27 shows another example of the irradiation range 75. In the present example, the light is irradiated to the entire transistor section 70 and an adjacent region 81 of the diode section 80 adjacent to the transistor section 70. The light is not irradiated to a region of the diode section 80 excluding the adjacent region 81. In this case, it is possible to suppress the variation in threshold value in the entire boundary section 90. Also, even when a position of the irradiation range 75 deviates, it is possible to suppress the variation in threshold value in the boundary section 90.

Figure 28:
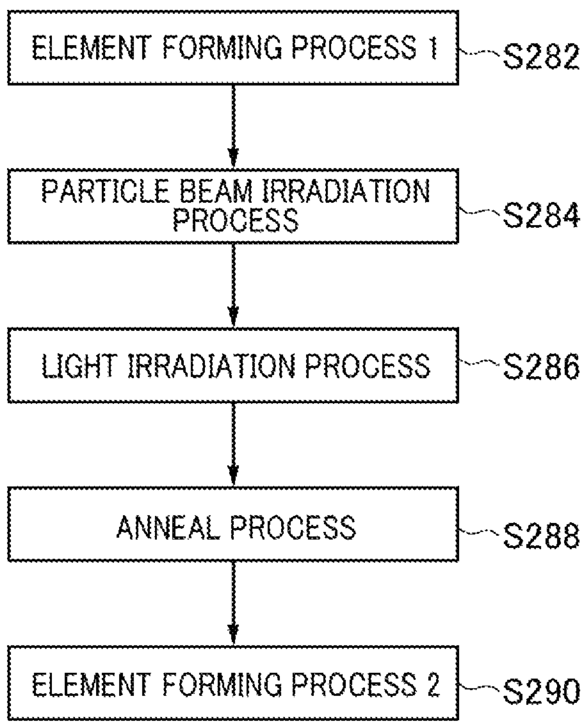
FIG. 28 shows a part of the manufacturing process of the semiconductor device 100 described in FIGS. 19 to 27.

FIG. 28 shows a part of the manufacturing process of the semiconductor device 100 described in FIGS. 19 to 27. In an element forming process 1 (S282), basic structures such as the transistor section 70, the diode section 80, the edge termination structure part and the like are formed inside the semiconductor substrate 10. In S282, the emitter region 12, the base region 14, the accumulation region 16, the drift region 18, the gate trench section 40, the dummy trench section 30, and the interlayer dielectric film 38 may also be formed. Also, the lower surface of the semiconductor substrate 10 may be ground to adjust the thickness of the semiconductor substrate 10 and to form the collector region 22, the cathode region 82, the buffer region 20 and the collector electrode 24. Note that, at least a part of the emitter region 12, the base region 14, the accumulation region 16, the interlayer dielectric film 38, the gate trench section 40 and the dummy trench section 30 may be formed in an element forming process 2 (S290) to be described later. Also, at least a part of the grinding on the lower surface-side of the semiconductor substrate 10 and the formation of the collector region 22, the cathode region 82, the buffer region 20 and the collector electrode 24 may be performed in the element forming process 2 (S290).

Subsequently, in a particle beam irradiating process (S284), the particle beam is irradiated from the upper surface 21-side of the semiconductor substrate 10, so that the lifetime control region 72 is formed. The lifetime control region 72 is formed from a part of the transistor section 70 to the diode section 80, below the base region 14. By the particle beam irradiating process (S284) and an anneal process (S288) to be described later, the lifetime control region 72 may be formed. The particle beam may be helium, hydrogen, an electron beam or the like.

Subsequently, in a light irradiation process (S286), light for recovering crystal defects is irradiated from the upper surface 21-side of the semiconductor substrate 10. The irradiation light is preferably irradiated before forming a member of a metal material on a side above the lifetime control region 72. For example, the irradiation light is irradiated from the upper surface 21-side of the semiconductor substrate 10 before forming the emitter electrode 52. Thereby, it is possible to cause the irradiation light to enter the inside the semiconductor substrate 10 without being blocked by the metal material.

The irradiation light is irradiated to a range in which at least the first region 19 is provided, as seen from above. Also, the irradiation light is irradiated so as to reach the first region 19 in the depth direction. The reaching depth of the irradiation light is adjusted as appropriate, as described above with reference to FIGS. 19 to 24. The irradiation light may be irradiated to the entire upper surface 21 of the semiconductor substrate 10 or may be irradiated selectively to some region thereof. By the irradiation light, the carrier lifetime of at least the first region 19 is recovered to adjust the threshold value of the transistor section.

Subsequently, in an anneal process (S288), the semiconductor substrate 10 is entirely annealed. S288 is performed at a temperature and time at which at least a part of the crystal defects in the lifetime control region 72 remains. By adjusting the anneal temperature and time in S288, it is possible to adjust the concentration of the lifetime killers and the carrier lifetime in the lifetime control region 72.

Note that, in the light irradiation process S286, the light may be irradiated to a depth at which the concentration of the lifetime killers in the lifetime control region 72 can be adjusted. In this case, the anneal process S288 may be omitted.

Subsequently, in an element forming process 2 (S290), a metal member such as the emitter electrode 52 is formed. Also, a protective film or the like may be formed above the emitter electrode 52.

Figure 29A:
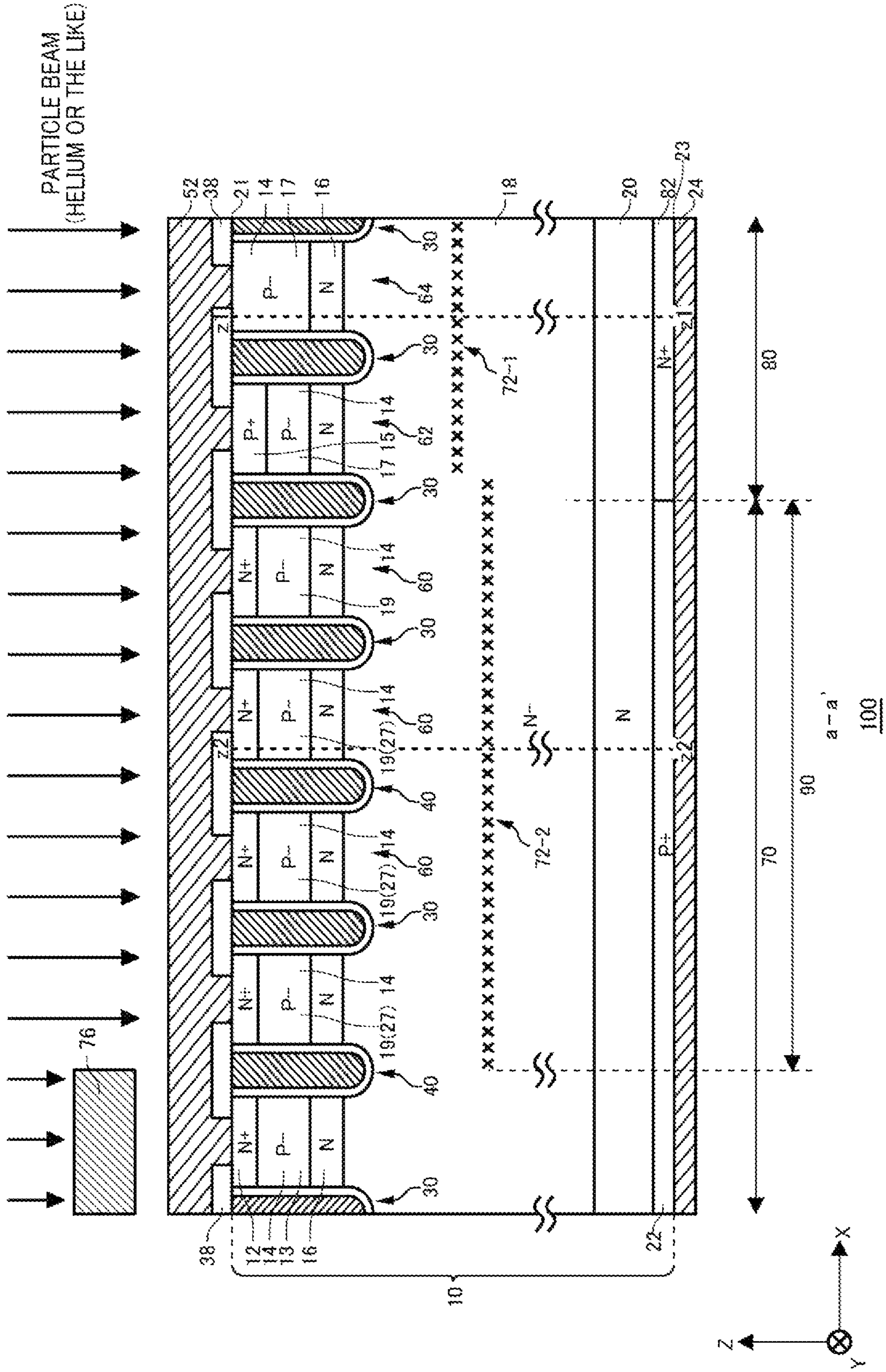
FIG. 29A shows another example of the cross-section a-a'.

FIG. 29A shows another example of the cross-section a-a'. The threshold value adjusting section 27 of the present example is a part of the base region 14 in the transistor section 70. The threshold value adjusting section 27 may be the base region 14 that is in contact with the gate trench section 40.

In the present example, a crystal defect density in the threshold value adjusting section 27 is lower than a crystal defect density in the base region 14 of the diode section 80. The structures except the crystal defect density distribution may be the same as any of the examples described in FIGS. 1 to 28. The crystal defects are vacancy-type defects that are generated when particles of helium or the like pass through the semiconductor substrate 10. The crystal defect density indicates a density per unit volume.

The crystal defect density in the threshold value adjusting section 27 is lower than the crystal defect density in the base region 14, so that it is possible to reduce the variation in threshold value of the transistor section 70 due to the irradiation of particles of helium or the like. The crystal defect density in the threshold value adjusting section 27 may be ¾ or less or ½ or less of the crystal defect density in the base region 14 of the diode section 80.

The crystal defect density in the threshold value adjusting section 27 may be adjusted by the depth position of the lifetime control region 72, for example. The depth position of the lifetime control region 72 corresponds to a particle implantation position (i.e., a range) of helium or the like. In the present example, the particles of helium or the like are implanted from the upper surface 21 of the semiconductor substrate 10.

The crystal defects formed in the semiconductor substrate 10 are formed in a higher density toward a side closer to the particle implantation position of helium or the like. For this reason, it is possible to reduce the crystal defect density in the threshold value adjusting section 27 by increasing a distance between the threshold value adjusting section 27 and the lifetime control region 72. In the present example, a distance between the threshold value adjusting section 27 and a lifetime control region 72-2 is greater than a distance between the base region 14 of the diode section 80 and a lifetime control region 72-1.

The lifetime control region 72-2 is provided in a deeper position than the lifetime control region 72-1, as seen from the upper surface 21. The depth position of the lifetime control region 72 can be adjusted by acceleration energy of particles of helium or the like. Also, the range of helium or the like may be adjusted by causing particles of helium or the like to penetrate a buffer material provided above the upper surface 21 of the semiconductor substrate 10.

Figure 29B:
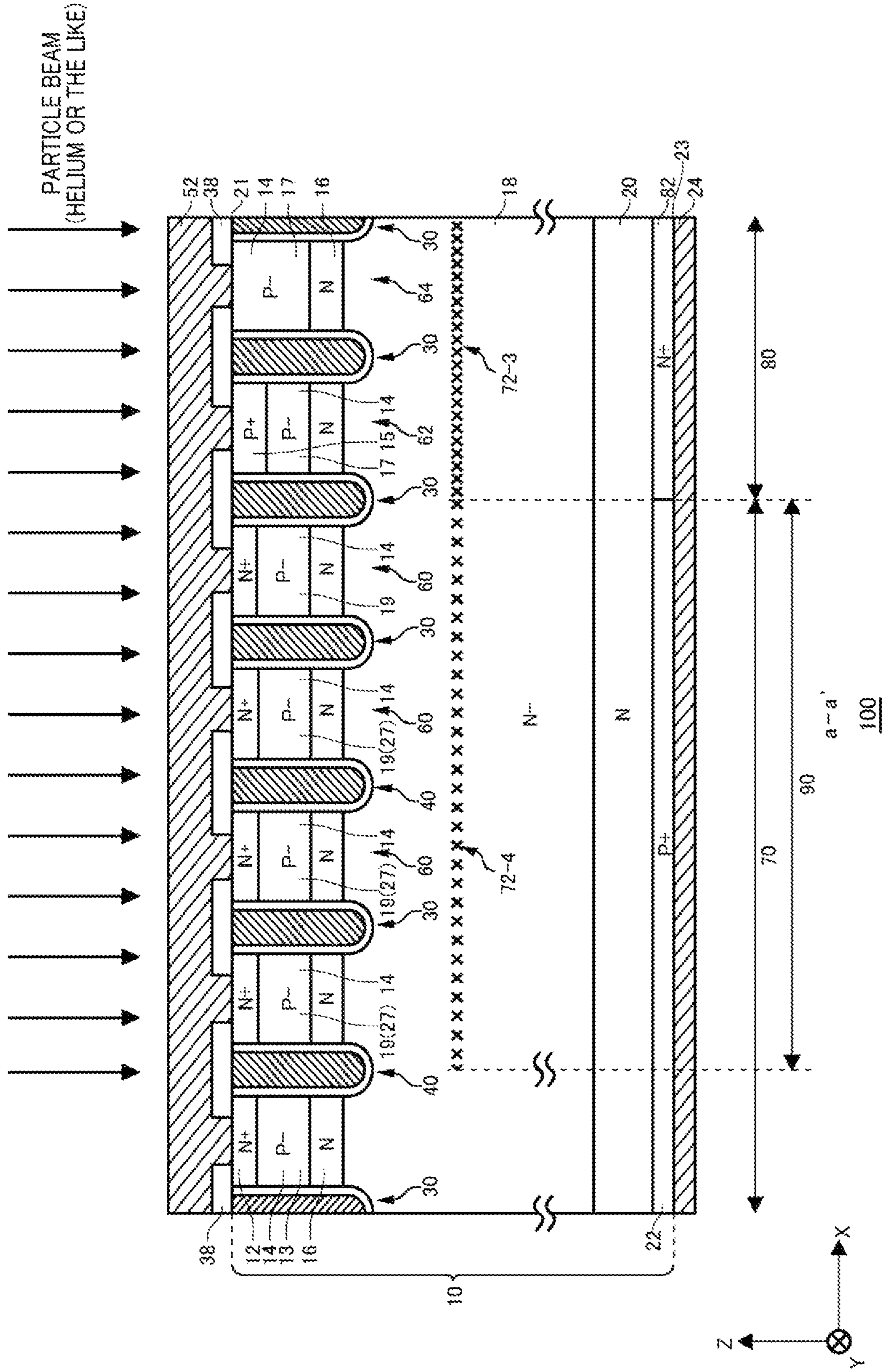
FIG. 29B shows another example of the cross-section a-a'.

FIG. 29B shows another example of the cross-section a-a'. Also in the present example, the crystal defect density in the threshold value adjusting section 27 is lower than the crystal defect density in the base region 14 of the diode section 80. In FIG. 29B, a density of the symbols “x” pictorially shows the crystal defect density. The present example is different from the example of FIG. 29A, in terms of the method of adjusting the crystal defect density in the threshold value adjusting section 27. The other structures are the same as the example of FIG. 29A.

In the present example, a crystal defect density in a lifetime control region 72-4 located below the threshold value adjusting section 27 is lower than a crystal defect density in a lifetime control region 72-3 of the diode section 80. In the example of FIG. 29B, the lifetime control region 72-4 is provided over the entire boundary section 90 in the X-axis direction. Positions of the lifetime control region 72-4 and the lifetime control region 72-3 in the depth direction may be the same or may be different, like the example of FIG. 29A.

The crystal defects formed in the semiconductor substrate 10 are formed in a higher density as more particles of helium or the like are implanted. For this reason, when the number of the particles of helium or the like that are irradiated to the lifetime control region 72-4 below the threshold value adjusting section 27 is made smaller than the number of the particles of helium or the like that are irradiated to the lifetime control region 72-3 of the diode section 80, it is possible to reduce the crystal defect density in the threshold value adjusting section 27. That is, when a dose amount per unit area of particles of helium or the like to the lifetime control region 72-4 is made smaller than a dose amount per unit area of particles of helium or the like to the lifetime control region 72-3, it is possible to reduce the crystal defect density in the threshold value adjusting section 27.

As described in FIG. 19 and the like, the crystal defects can also be recovered by the irradiation of light. That is, the crystal defects in the threshold value adjusting section 27 may be adjusted by selectively irradiating light to the threshold value adjusting section 27 after implanting the particles of helium or the like to the diode section 80 and the boundary section 90 in a uniform dose amount. Also, as described later, the crystal defects can be recovered by hydrogen. The crystal defects in the threshold value adjusting section 27 may be adjusted by selectively irradiating hydrogen to the threshold value adjusting section 27.

Figure 29C:
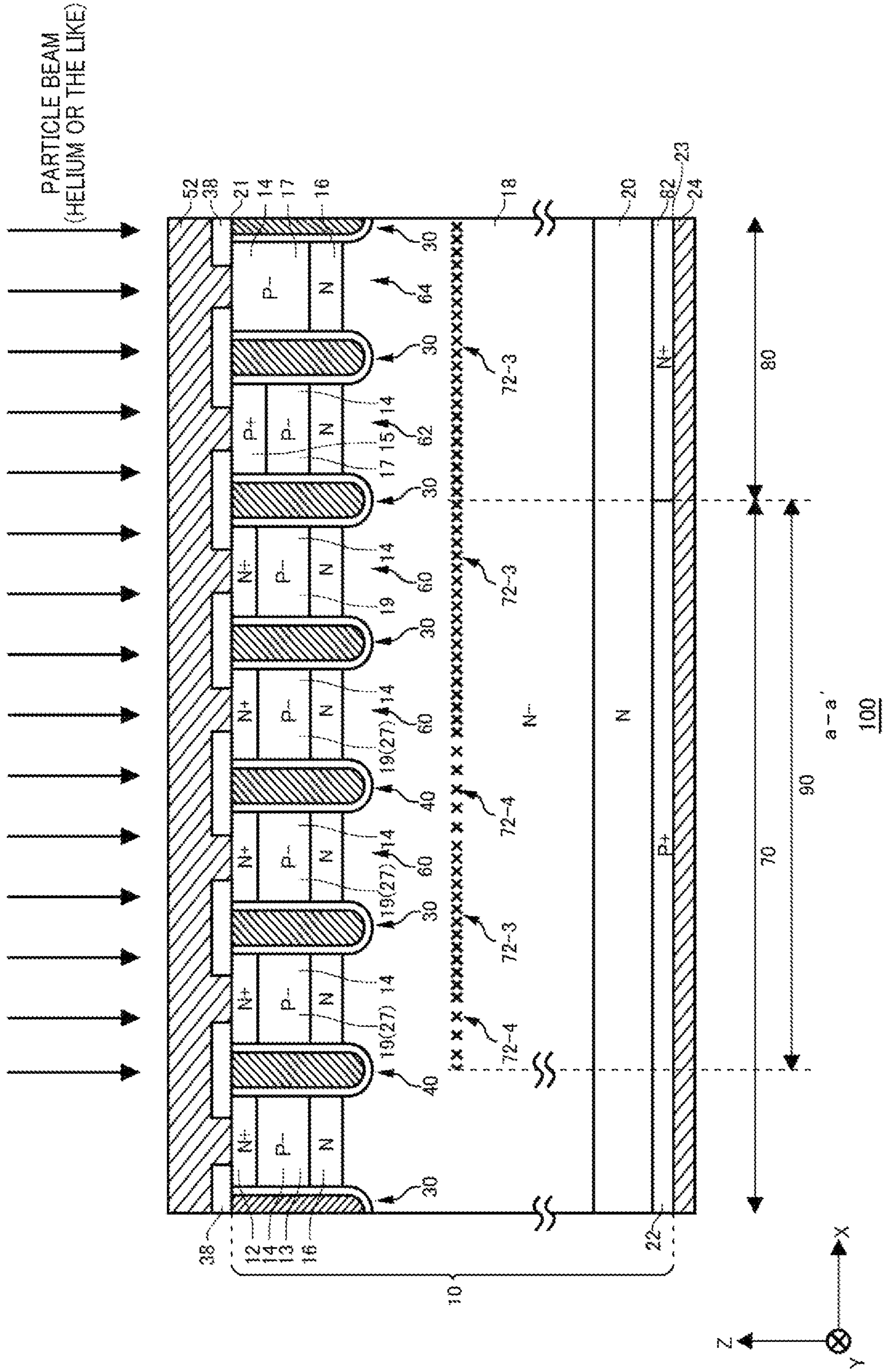
FIG. 29C shows another example of the cross-section a-a'.

FIG. 29C shows another example of the cross-section a-a'. In the present example, the arrangements of the lifetime control region 72-3 and the lifetime control region 72-4 are different from the example of FIG. 29B. The other structures are the same as the example of FIG. 29B. In the present example, the lifetime control region 72-3 may be arranged below the dummy trench section 30 of the region of the transistor section 70 where the lifetime control region 72 is provided. The lifetime control region 72-4 may also be arranged below the gate trench section 40. Also, the lifetime control region 72-4 is arranged below a part of the threshold value adjusting section 27, which is in contact with the gate trench section 40. Even with the above configuration, the threshold value adjusting section 27 can be provided in the base region 14 adjacent to the gate trench section 40.

Figure 30:
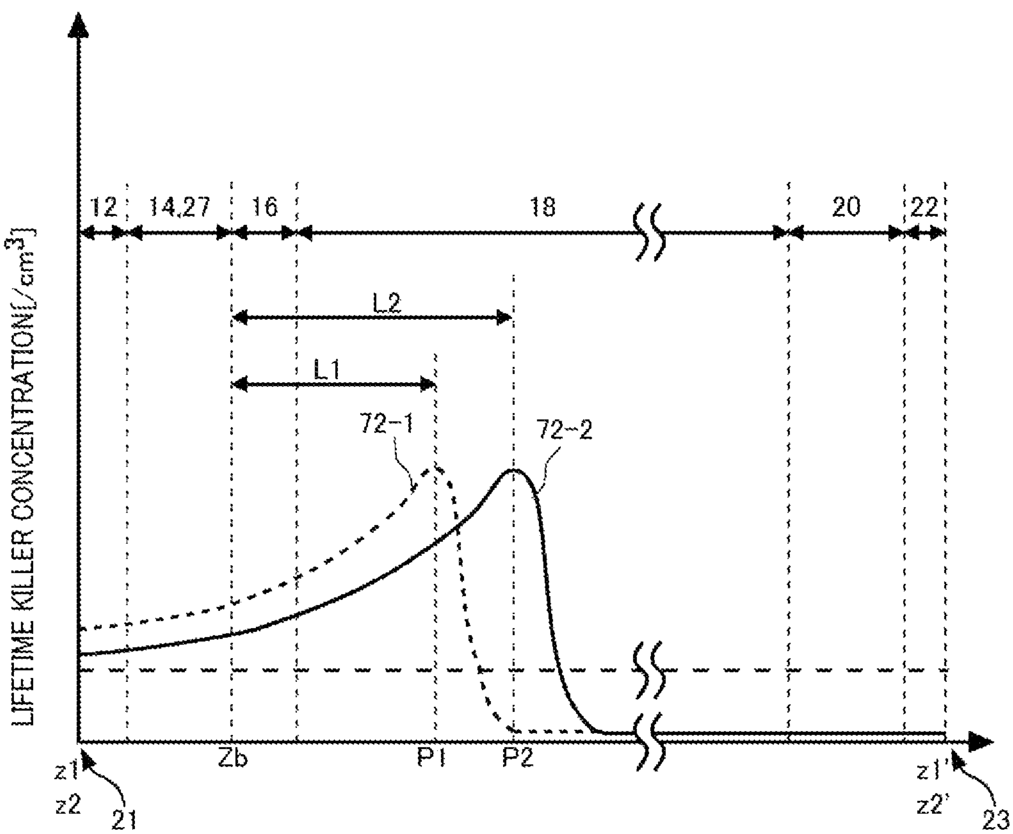
FIG. 30 shows an example of the concentration distribution of lifetime killers in a z1-z1' line and a z2-z2' line in FIG. 29A.

FIG. 30 shows an example of the concentration distribution of lifetime killers in a z1-z1' line and a z2-z2' line in FIG. 29A. In the present example, the lifetime killer is the above-described crystal defect. The z1-z1' line passes the base region 14 of the diode section 80 and the lifetime control region 72-1, and the z2-z2' line passes the threshold value adjusting section 27 and the lifetime control region 72-2. In FIG. 30, the base region 14 and the threshold value adjusting section 27 occupy the same range in the depth direction (the horizontal axis in the graph).

The lifetime control region 72-1 and the lifetime control region 72-2 each have peaks in peak positions P1 and P2 and have a skirt S and a skirt S', like the lifetime control region 72 described in FIG. 4A. In FIG. 30, the symbols of the skirts S and S' are omitted.

The peak position P2 of the lifetime control region 72-2 is arranged on the further lower surface 23-side of the semiconductor substrate 10 than the peak position P1 of the lifetime control region 72-1. The dose amounts per unit area of particles of helium or the like in the peak position P1 and the peak position P2 may be the same.

A distance between a lower end position Zb of the base region 14 and the peak position P1 of the lifetime control region 72-1 is denoted as L1. In the present example, the lower end position Zb of the base region 14 is a boundary between the base region 14 and the accumulation region 16. A distance between a lower end position Zb of the threshold value adjusting section 27 and the peak position P2 of the lifetime control region 72-2 is denoted as L2. In the present example, the lower end position Zb of the threshold value adjusting section 27 is a boundary between the threshold value adjusting section 27 and the accumulation region 16.

Since the distance L2 is greater than the distance L1, the lifetime killer concentration (i.e., the crystal defect density) in the threshold value adjusting section 27 is smaller than the lifetime killer concentration in the base region 14, as shown in FIG. 30. For this reason, the variation in threshold value of the transistor section 70 can be suppressed. In the present example, the distances L1 and L2 are defined using the peak positions of the distribution of the lifetime killers (crystal defects). In another example, the distances L1 and L2 may be defined using peak positions of a distribution of particles of helium or the like, instead of the peak positions of the distribution of the lifetime killers (crystal defects). The distribution of the lifetime killers and the distribution of particles of helium or the like are similar.

Figure 31:
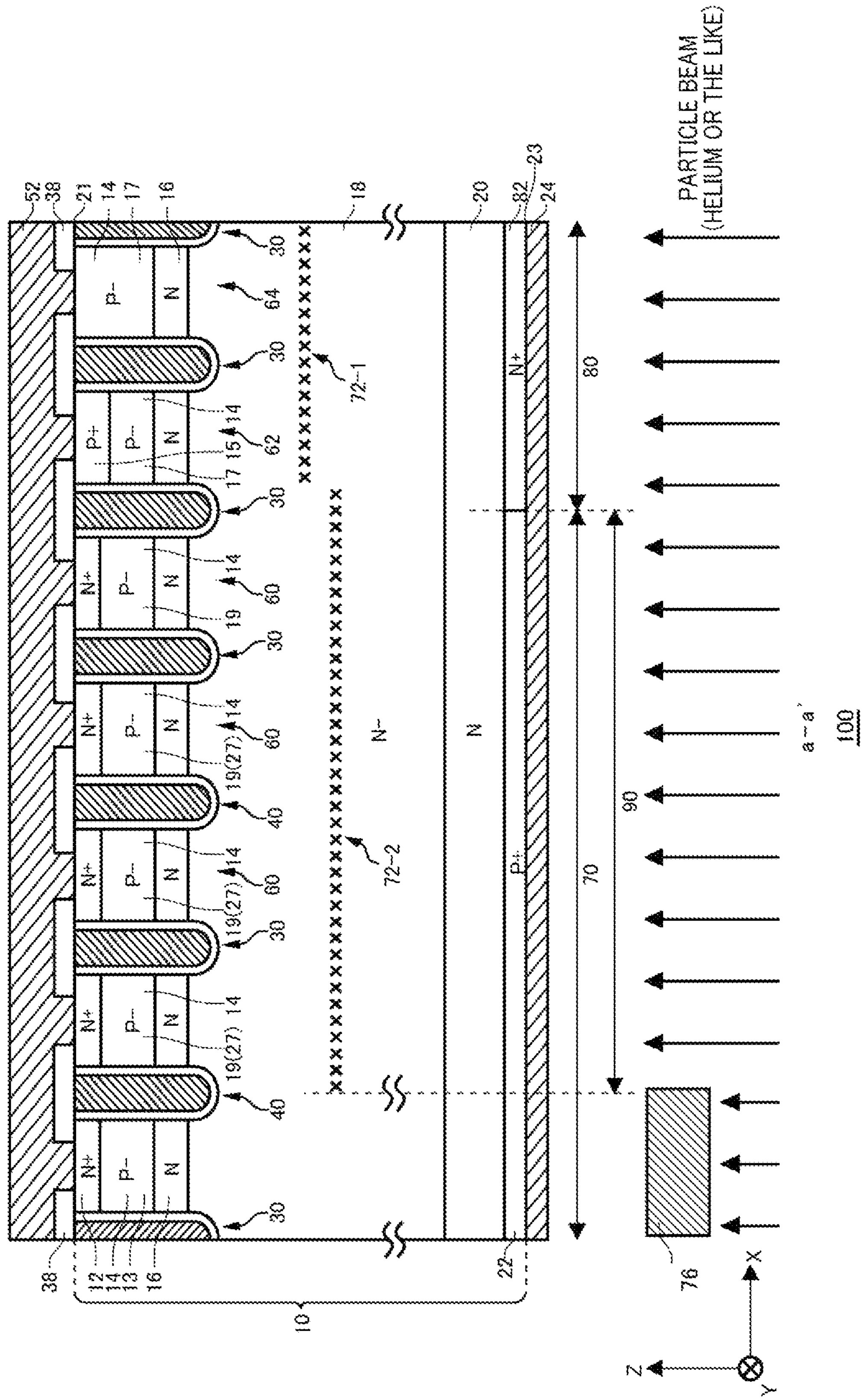
FIG. 31 shows another example of the cross-section a-a'.

FIG. 31 shows another example of the cross-section a-a'. The present example is different from the example of FIG. 29A, in that the particles of helium or the like for forming the lifetime control region 72-1 and the lifetime control region 72-2 are implanted from the lower surface 23-side of the semiconductor substrate 10. The other structures are the same as the example of FIG. 29A.

In the present example, the depth position of each lifetime control region 72 is similar to the example of FIG. 29A. Even in the case where helium or the like is irradiated from the lower surface 23-side, the lifetime control region 72-2 is provided separately from the threshold value adjusting section 27, so that the crystal defect density in the threshold value adjusting section 27 is reduced to suppress the variation in threshold value.

In another example, the lifetime control region 72-1 may be formed by irradiating helium or the like from the upper surface 21-side, and the lifetime control region 72-2 may be formed by irradiating helium or the like from the lower surface 23-side. As shown in FIG. 30 and the like, since the skirt S' on the opposite side to the irradiation surface is sharply changed, it is possible to reduce the crystal defect density in the threshold value adjusting section 27. In this case, the lifetime control region 72-1 and the lifetime control region 72-2 may be provided at the same depth position.

Figure 32:
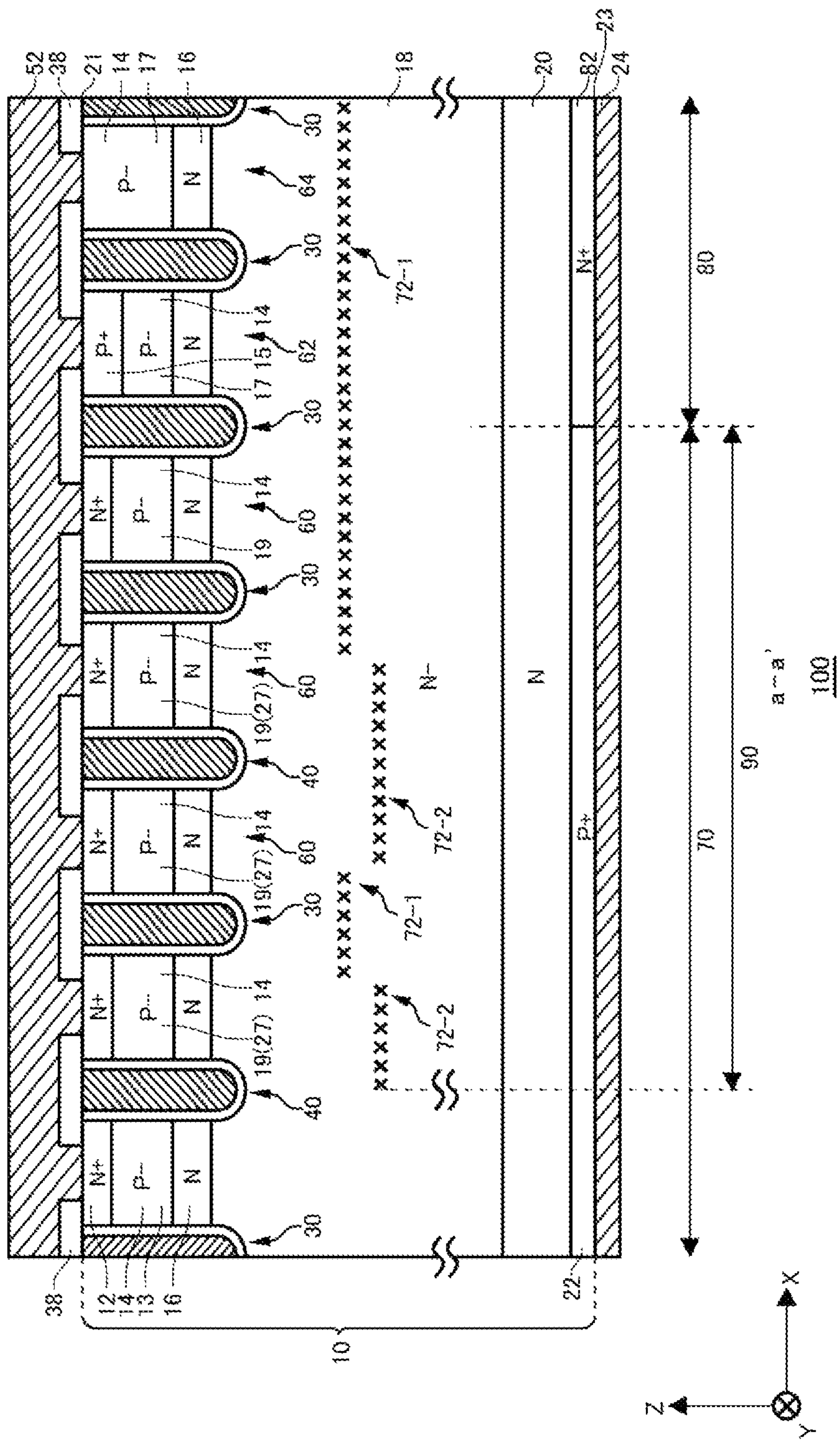
FIG. 32 shows another example of the cross-section a-a'.

FIG. 32 shows another example of the cross-section a-a'. In the present example, the arrangement of the lifetime control region 72-1 and the lifetime control region 72-2 are different from the examples described in FIGS. 29A to 31. The other structures are the same as any of the examples described in FIGS. 29A to 31. Each of the lifetime control region 72-1 and the lifetime control region 72-2 may be formed by irradiating the particles from any of the upper surface 21 and the lower surface 23. As described above, the lifetime control region 72-2 is arranged on the further lower surface 23-side than the lifetime control region 72-1.

In the present example, the lifetime control region 72-1 may be arranged below the dummy trench section 30 of the region of the transistor section 70 where the lifetime control region 72 is provided. The lifetime control region 72-2 may also be arranged below the gate trench section 40. Also, the lifetime control region 72-2 is arranged below a part of the threshold value adjusting section 27, which is in contact with the gate trench section 40.

Even with the above configuration, it is possible to reduce the crystal defect density in the threshold value adjusting section 27. Therefore, it is possible to suppress the variation in threshold value of the transistor section 70. In the transistor section 70, the lifetime control region 72-1 and the lifetime control region 72-2 may be alternately arranged two or more times in the X-axis direction.

Figure 33:
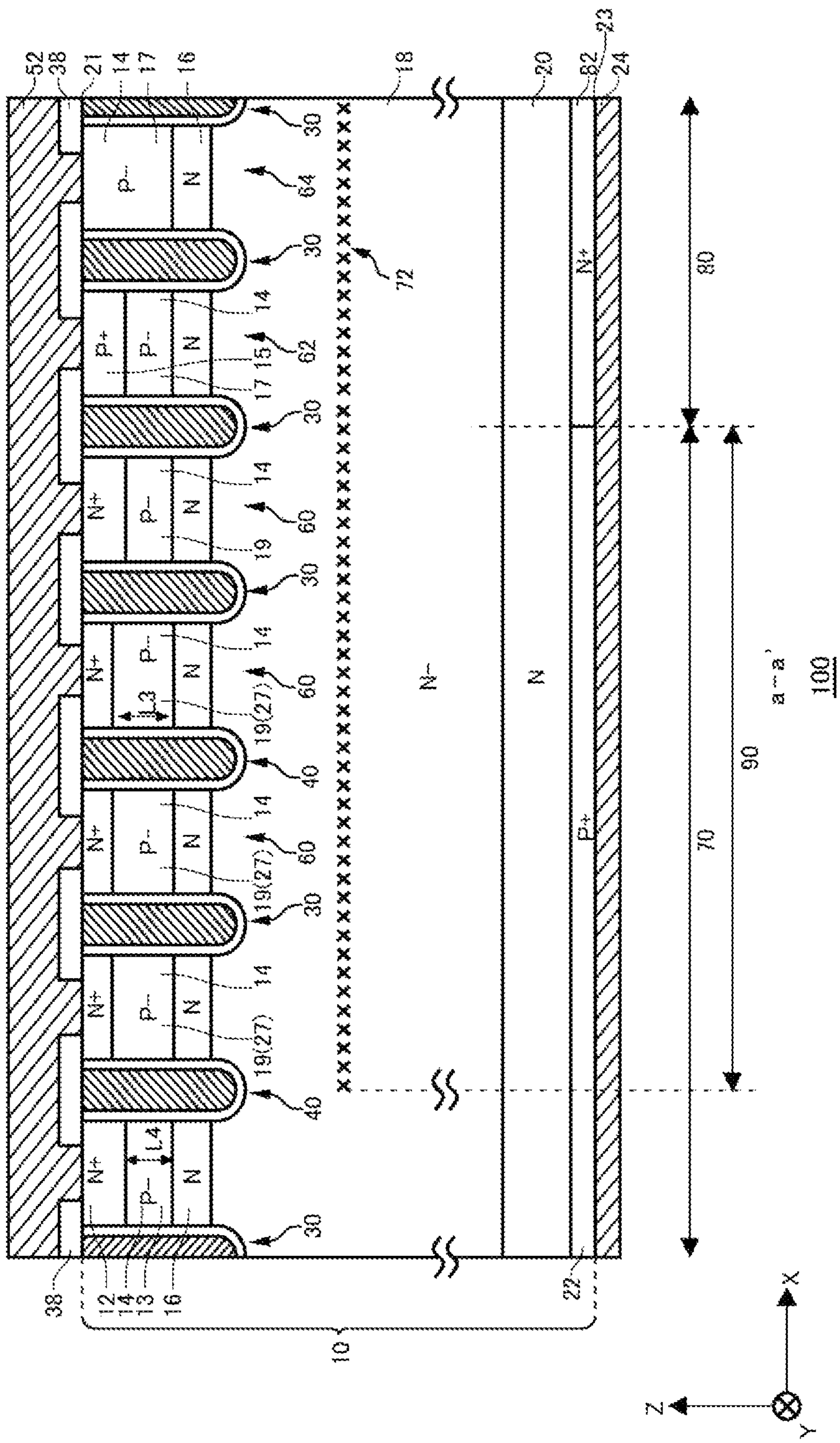
FIG. 33 shows another example of the cross-section a-a'.

FIG. 33 shows another example of the cross-section a-a'. The threshold value adjusting section 27 of the present example is a part of the base region 14 in the transistor section 70. The threshold value adjusting section 27 may also be the base region 14 that is in contact with the gate trench section 40.

In the present example, a length L3 of the threshold value adjusting section 27 in the depth direction is longer than a length L4 of the second region 13 in the depth direction. The second region 13 is a region, which does not overlap the lifetime control region 72, of the base region 14 of the transistor section 70.

A depth position of a lower end of the threshold value adjusting section 27 may be the same as a depth position of a lower end of the second region 13. In this case, an upper end of the threshold value adjusting section 27 is arranged closer to the upper surface 21 of the semiconductor substrate 10 than an upper end of the second region 13.

The length of the threshold value adjusting section 27 corresponds to a channel length. For this reason, when the threshold value adjusting section 27 is formed long, it is possible to cancel the variation in threshold value due to the formation of the lifetime control region 72. In the process of forming the threshold value adjusting section 27, dopants may be implanted in multiple positions in the depth direction. Also, the threshold value adjusting section 27 may have a larger heat history than the second region 13. That is, the threshold value adjusting section 27 may have a total heat treatment time longer than the second region 13.

Also, the length of the threshold value adjusting section 27 may be adjusted by adjusting a depth at which the accumulation region 16 is formed. For example, when the accumulation region 16 is formed in a deeper position, it is possible to further deepen a boundary position between the threshold value adjusting section 27 and the accumulation region 16. Thereby, it is possible to lengthen the threshold value adjusting section 27. Note that, a peak value of the doping concentration in the threshold value adjusting section 27 may be the same as or different from a peak value of the doping concentration in the second region 13.

Figure 34:
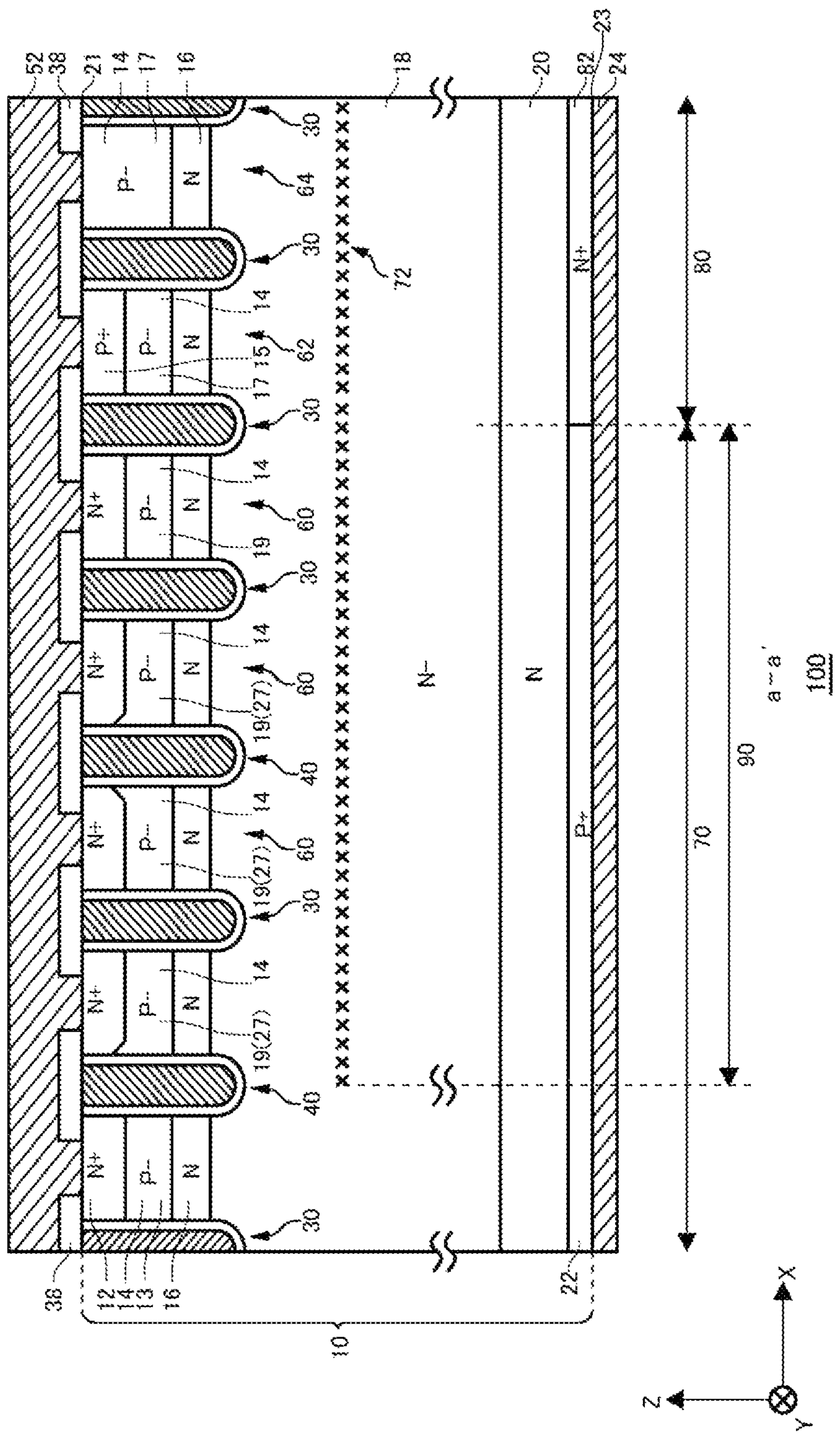
FIG. 34 shows another example of the cross-section a-a'.

FIG. 34 shows another example of the cross-section a-a'. In the present example, a shape of the threshold value adjusting section 27 is different from the example of FIG. 33. The other structures are the same as the example of FIG. 33. In the threshold value adjusting section 27 of the present example, a length in the depth direction of a part in contact with the gate trench section 40 is longer than a length in the depth direction of a part in contact with the dummy trench section 30. The length of the part in contact with the dummy trench section 30 may be equal to the length of the second region 13. A junction depth may be formed different in the vicinity of each of the trench sections on both sides by performing finer photolithography than FIG. 33 to selectively implant the impurity elements into the base region 14 and the emitter region 12 or implanting the impurity elements from the sidewall in a state where the gate trench section 40 and the dummy trench section 30 are not filled, for example. Even with the above configuration, it is possible to adjust the threshold value.

Figure 35:
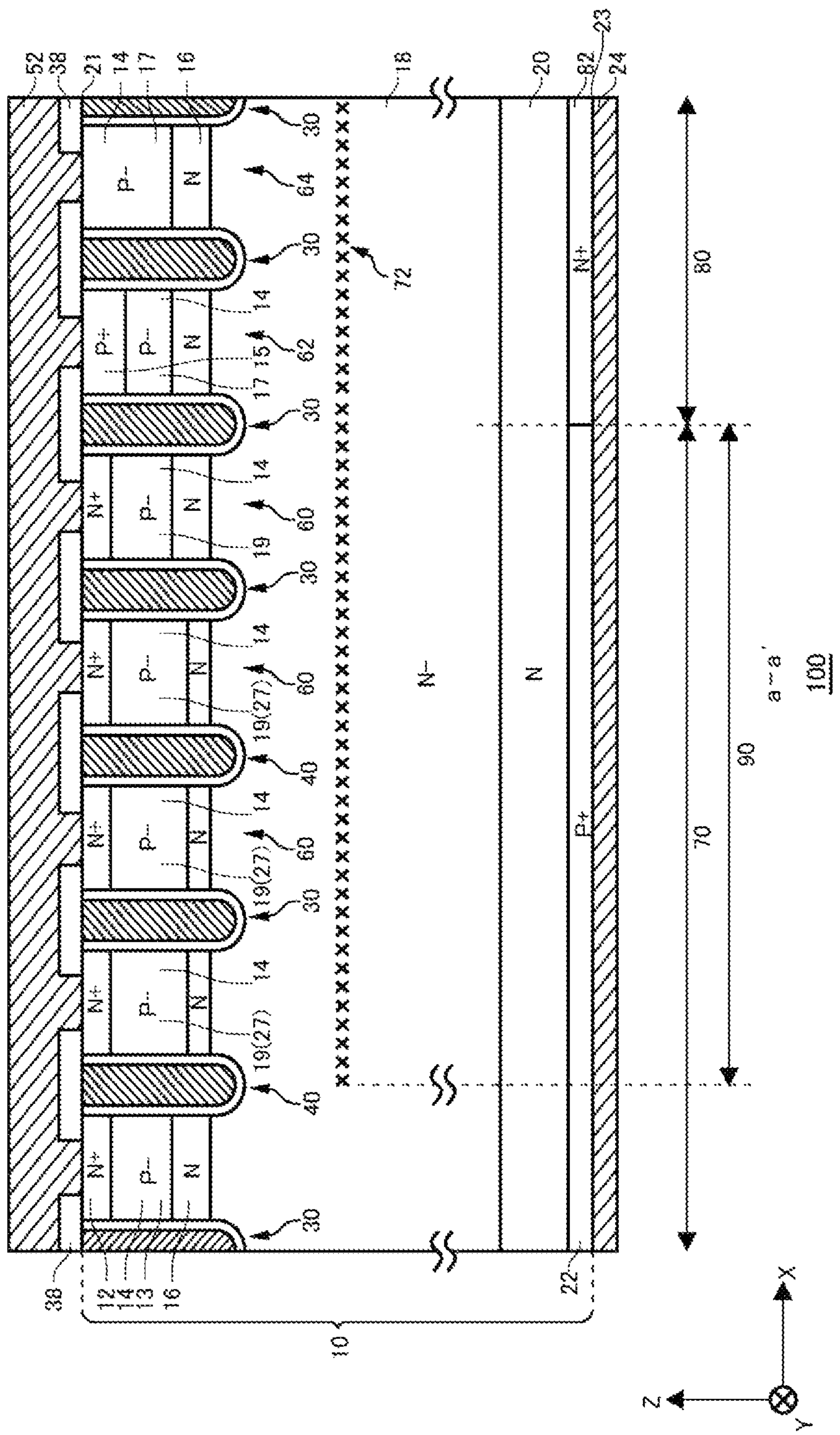
FIG. 35 shows another example of the cross-section a-a'.

FIG. 35 shows another example of the cross-section a-a'. In the present example, the position of the threshold value adjusting section 27 is different from the example of FIG. 33. The other structures are the same as the example of FIG. 33. An upper end position of the threshold value adjusting section 27 of the present example is the same as an upper end position of the second region 13. A lower end position of the threshold value adjusting section 27 is arranged on the further lower surface 23-side than a lower end position of the second region 13. The positions of the upper and lower ends indicate positions in the depth direction. Even with the above configuration, it is possible to adjust the threshold value.

Figure 36:
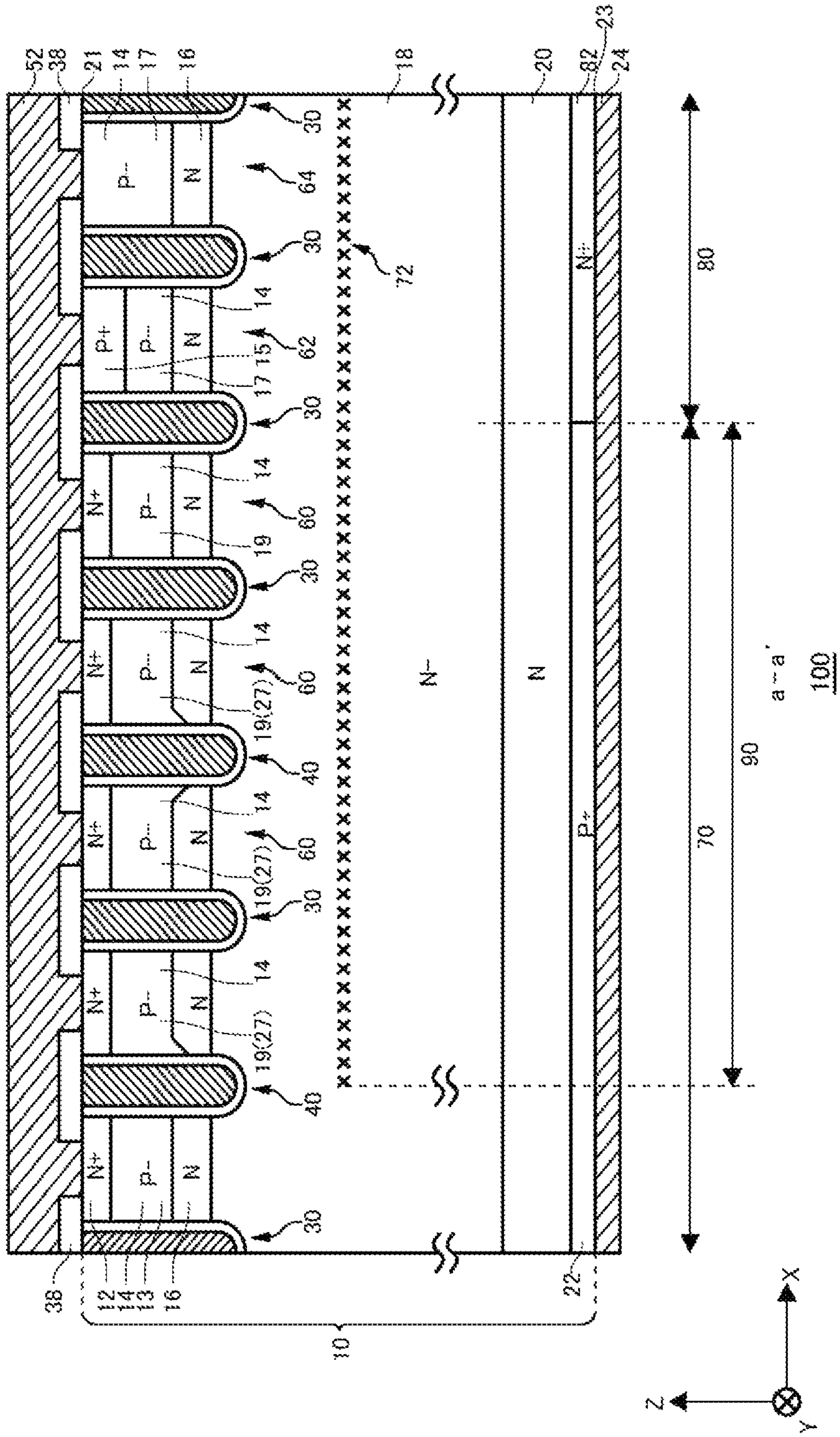
FIG. 36 shows another example of the cross-section a-a'.

FIG. 36 shows another example of the cross-section a-a'. In the present example, a shape of the threshold value adjusting section 27 is different from the example of FIG. 35. The other structures are the same as the example of FIG. 35. In the threshold value adjusting section 27 of the present example, a length in the depth direction of the part in contact with the gate trench section 40 is longer than a length in the depth direction of the part in contact with the dummy trench section 30. The length of the part in contact with the dummy trench section 30 may be equal to the length of the second region 13. The junction depth may be formed to be different in the vicinity of each of the trench sections on both sides by performing finer photolithography than that illustrated in FIG. 35 to selectively implant the impurity elements into the base region 14 and the accumulation region 16, or by implanting the impurity elements from the sidewall in a state where the gate trench section 40 and the dummy trench section 30 are not filled, for example. Even with the above configuration, it is possible to adjust the threshold value.

Figure 37:
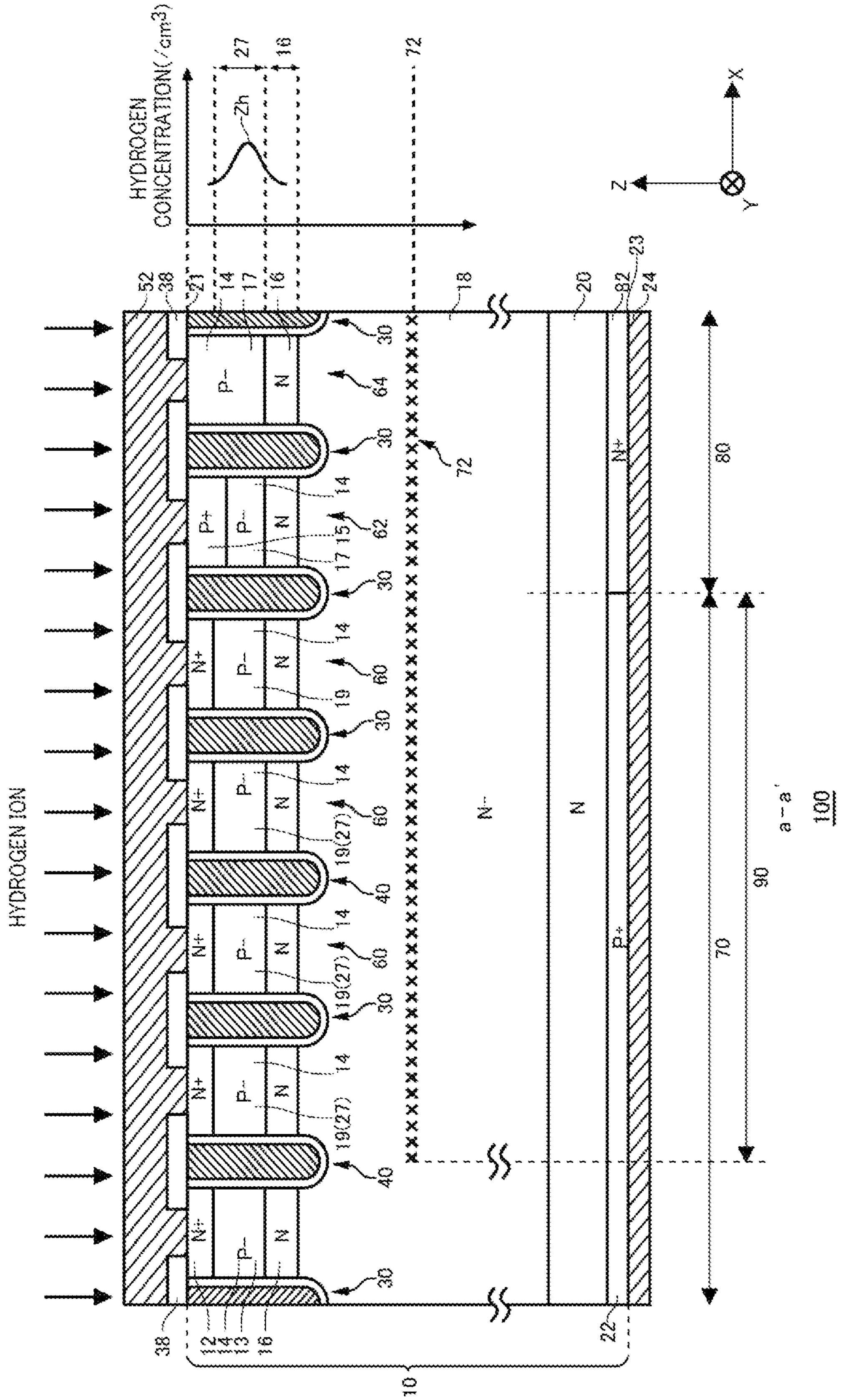
FIG. 37 shows another example of the cross-section a-a'.

FIG. 37 shows another example of the cross-section a-a'. The threshold value adjusting section 27 of the present example is a part of the base region 14 in the transistor section 70. The threshold value adjusting section 27 may be the base region 14 that is in contact with the gate trench section 40. FIG. 37 shows an example of a hydrogen concentration distribution in the depth direction in the vicinity of the threshold value adjusting section 27.

In the present example, the threshold value adjusting section 27 includes hydrogen donors. The hydrogen donor may also be a complex defect in which hydrogen and vacancy are combined with each other. For example, the complex defect is a VOH defect transformed to donors as hydrogen (H), oxygen (O) and vacancy (V) (including double vacancy (VV)) in the substrate are combined. The VOH defect functions as a donor for supplying an electron. In the entire semiconductor substrate 10, a predetermined concentration of oxygen is included. Also, the lifetime control region 72 is formed, so that vacancy-type defects are formed. The hydrogen ions such as protons are implanted into the semiconductor substrate 10 and a heat treatment is performed, so that hydrogen, oxygen and vacancy are combined to be VOH defects. The vacancy defects combined with hydrogen and oxygen do not function as the lifetime killers to recombine with carriers. For this reason, the threshold value adjusting section 27 includes the hydrogen donors, so that it is possible to reduce the vacancy defect density in the threshold value adjusting section 27 and to suppress the variation in threshold value.

In the semiconductor substrate 10 of the present example, hydrogen is implanted from the upper surface 21 or the lower surface 23 to the vicinity of the threshold value adjusting section 27. For example, a peak position Zh of the hydrogen concentration distribution in the depth direction may be arranged inside the threshold value adjusting section 27. By performing the heat treatment after the hydrogen implantation, it is possible to form the hydrogen donors in the threshold value adjusting section 27, thereby reducing the vacancy defects. Note that, when a peak of a donor concentration exists at the same depth position as the peak position Zh of the hydrogen concentration distribution, the hydrogen donor may be regarded as existing in the threshold value adjusting section 27.

Note that, the hydrogen concentration is such a concentration that the threshold value adjusting section 27 is not inverted into N type due to the hydrogen donors. The concentration of the hydrogen donors may be equal to or smaller than a half or 1/10 of a concentration of acceptors in the threshold value adjusting section 27.

The hydrogen implantation may be performed on the entire surface of the semiconductor substrate 10. In another example, hydrogen may be selectively implanted into the region in which the lifetime control region 72 is formed. In another example, hydrogen may be selectively implanted into the region of the transistor section 70 in which the lifetime control region 72 is formed. In another example, hydrogen may be selectively implanted into the threshold value adjusting section 27.

Figure 38:
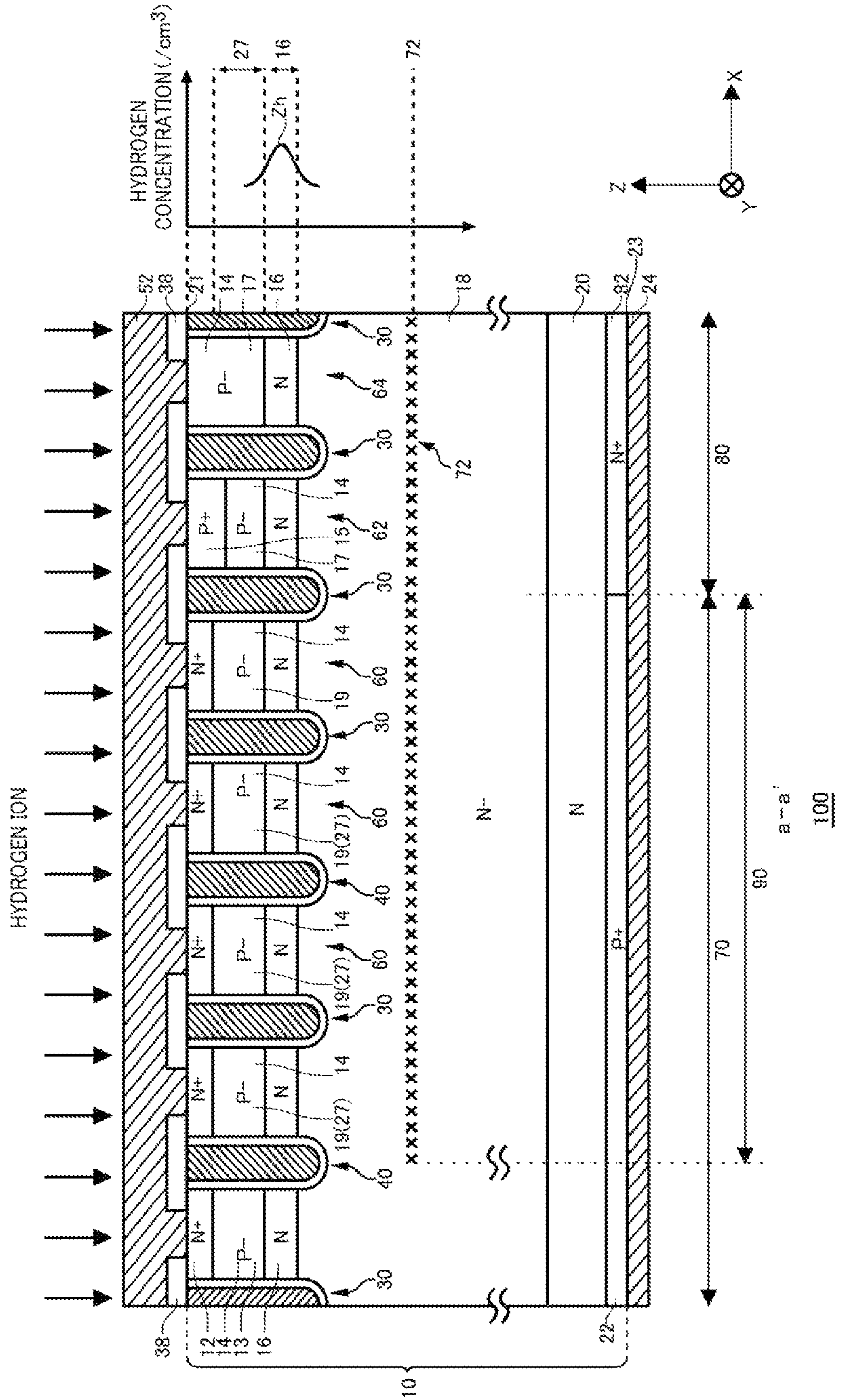
FIG. 38 shows another example of the cross-section a-a'.

FIG. 38 shows another example of the cross-section a-a'. In the present example, the peak position Zh of the hydrogen concentration distribution is different from the example of FIG. 37. The other structures are the same as the example of FIG. 37. In the present example, the peak position Zh of the hydrogen concentration distribution is arranged inside the accumulation region 16. However, hydrogen is also implanted in the threshold value adjusting section 27. Even with the above structure, it is possible to reduce the vacancy defects in the threshold value adjusting section 27. According to the present example, many hydrogen donors are formed in the accumulation region 16. For this reason, the IE effect by the accumulation region 16 can be enhanced.

Figure 39:
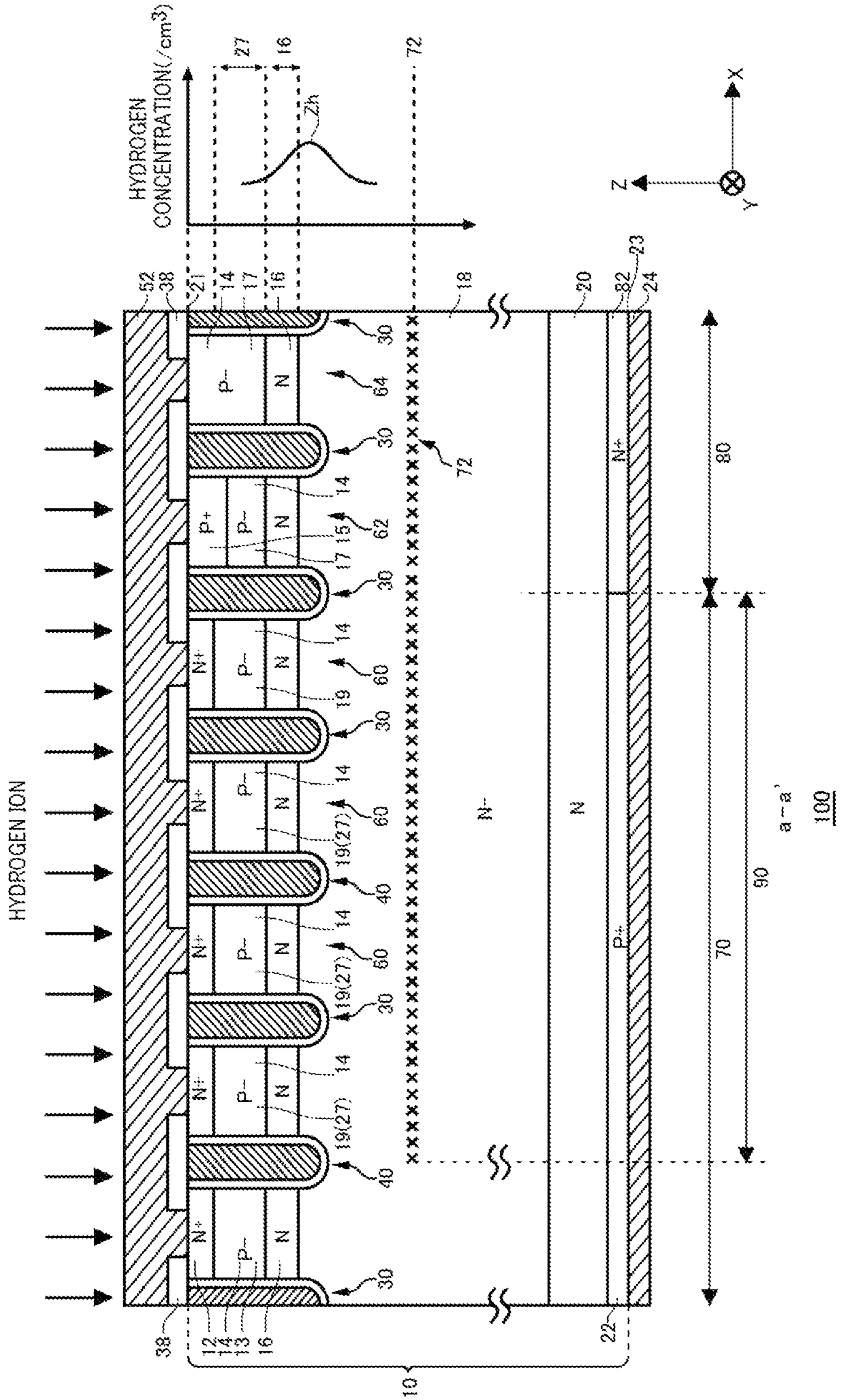
FIG. 39 shows another example of the cross-section a-a'.

FIG. 39 shows another example of the cross-section a-a'. In the present example, the peak position Zh of the hydrogen concentration distribution is different from the example of FIG. 37. The other structures are the same as the example of FIG. 37. In the present example, the peak position Zh of the hydrogen concentration distribution is arranged between the accumulation region 16 and the lifetime control region 72. However, hydrogen is also implanted in the threshold value adjusting section 27. Even with the above structure, it is possible to reduce the vacancy defects in the threshold value adjusting section 27. According to the present example, the hydrogen donors are formed below the accumulation region 16. For this reason, the IE effect by the accumulation region 16 can be enhanced. Also, the peak position Zh is arranged on the further upper surface 21-side than the peak position of the lifetime control region 72, so that it is possible to suppress the vacancy defects in the lifetime control region 72 from being excessively recovered.

A temperature of the heat treatment after the implantation of the hydrogen ion may be 350° C. or higher and 450° C. or lower. A time period of the heat treatment may be 30 minutes or longer and 10 hours or shorter. An implantation depth of the hydrogen ions may be another position. The peak position Zh of the hydrogen concentration distribution may be arranged inside the emitter region 12.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . well region, 12 . . . emitter region, 13 . . . second region, 14 . . . base region, 15 . . . contact region, 16 . . . accumulation region, 17 . . . third region, 18 . . . drift region, 19 . . . first region, 20 . . . buffer region, 21 . . . upper surface of, 22 . . . collector region, 23 . . . lower surface of, 24 . . . collector electrode, 25 . . . connection section, 27 . . . threshold value adjusting section, 29 . . . extension portion, 30 . . . dummy trench section, 31 . . . connection section, 32 . . . dummy insulating film, 34 . . . dummy conductive section, 38 . . . interlayer dielectric film, 39 . . . extension portion, 40 . . . gate trench section, 41 . . . connection section, 42 . . . gate insulating film, 44 . . . gate conductive section, 48 . . . gate runner, 49 . . . contact holes, 50 . . . gate metal layer, 52 . . . emitter electrode, 54 . . . contact holes, 56 . . . contact holes, 60 . . . first mesa section, 62 . . . second mesa section, 64 . . . third mesa section, 70 . . . transistor section, 72 . . . lifetime control region, 73 . . . lifetime control region,

74 . . . lifetime control region, 75 . . . irradiation range, 76 . . . mask, 80 . . . diode section, 81 . . . adjacent region, 82 . . . cathode region, 83 . . . adjacent region, 90 . . . boundary section, 91 . . . boundary section, 92 . . . trench, 93 . . . boundary section, 94 . . . nitride film, 100 . . . semiconductor device

What is claimed is:

1. A manufacturing method of a semiconductor device comprising a transistor section and a diode section, wherein both the transistor section and the diode section each have a drift region of a first conductivity-type provided inside a semiconductor substrate, and a base region of a second conductivity-type provided above the drift region, the manufacturing method comprising:

irradiating a particle beam from an upper surface of the semiconductor substrate, thereby forming a lifetime control region including lifetime killers below the base region from at least a part of the transistor section to the diode section, and irradiating, from the upper surface of the semiconductor substrate, light reaching the base region that overlaps the lifetime control region in the transistor section, thereby recovering a carrier lifetime of the base region to form a threshold value adjusting section for adjusting a threshold value of the transistor section, wherein threshold value adjusting section includes a thickened portion Wgi of a gate insulating film in a gate trench section adjacent to the base region, the thickened portion having a dielectric constant less than or equal to 0.9 times a remaining portion of the gate insulating film in the gate trench section.

2. The manufacturing method according to claim 1, wherein the semiconductor device comprises, between the base region and the lifetime control region, an accumulation region of a first conductivity-type having a doping concentration higher than a doping concentration of the drift region, and when forming the threshold value adjusting section, the light reaching the accumulation region is irradiated.

3. The manufacturing method according to claim 1, wherein the semiconductor device comprises, between the base region and the lifetime control region, an accumulation region of a first conductivity-type having a doping concentration higher than a doping concentration of the drift region, and when forming the threshold value adjusting section, the light reaching between the accumulation region and the lifetime control region is irradiated.

* * * * *